United States Patent
Tsubaki

(10) Patent No.: US 8,476,001 B2
(45) Date of Patent: *Jul. 2, 2013

(54) PATTERN FORMING METHOD

(75) Inventor: Hideaki Tsubaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 59 days.

This patent is subject to a terminal disclaimer.

(21) Appl. No.: 13/162,056

(22) Filed: Jun. 16, 2011

(65) Prior Publication Data

US 2011/0250543 A1    Oct. 13, 2011

Related U.S. Application Data

(63) Continuation-in-part of application No. 12/600,038, filed as application No. PCT/JP2008/058976 on May 15, 2008, now Pat. No. 7,985,534.

(30) Foreign Application Priority Data

May 15, 2007    (JP) .................................. 2007-129521

(51) Int. Cl.
*G03F 7/26*    (2006.01)
(52) U.S. Cl.
USPC ........................................................ 430/322
(58) Field of Classification Search
USPC .................................................. 430/322, 325
See application file for complete search history.

(56) References Cited

U.S. PATENT DOCUMENTS

| 4,099,062 A | 7/1978 | Kitcher |
| 4,212,935 A | 7/1980 | Canavello et al. |
| 4,267,258 A | 5/1981 | Yoneda et al. |
| 4,318,976 A | 3/1982 | Shu et al. |
| 4,491,628 A | 1/1985 | Ito et al. |
| 4,690,887 A | 9/1987 | Fukuda et al. |
| 4,743,529 A | 5/1988 | Farid et al. |
| 4,777,119 A | 10/1988 | Brault et al. |
| 5,061,607 A | 10/1991 | Walls |

(Continued)

FOREIGN PATENT DOCUMENTS

| EP | 0102450 A2 | 3/1984 |
| EP | 0519297 A2 | 12/1992 |

(Continued)

OTHER PUBLICATIONS

International Search Report (PCT/ISA /210) for PCT/JP2008/058976, dated Jun. 17, 2008.

(Continued)

*Primary Examiner* — Brittany Raymond
(74) *Attorney, Agent, or Firm* — Sughrue Mion, PLLC

(57) ABSTRACT

A pattern forming method, includes: (i) a step of applying a resist composition whose solubility in a positive tone developer increases and solubility in a negative tone developer decreases upon irradiation with an actinic ray or radiation, the resist composition containing a resin capable of increasing a polarity by the action of an acid; (ii) an exposure step; (iii) a step of performing development by using a negative tone developer to form a resist pattern; and (iv) a step of causing a crosslinked layer-forming material to act on the resist pattern to crosslink the resin constituting the resist pattern and the crosslinked layer-forming material, thereby forming a crosslinked layer. According to the present invention, a method for forming a pattern having an effectively microdimensioned trench or hole pattern without generation of a scum is provided.

17 Claims, 1 Drawing Sheet

U.S. PATENT DOCUMENTS

| | | | |
|---|---|---|---|
| 5,250,375 A | 10/1993 | Sebald et al. | |
| 5,268,260 A | 12/1993 | Bantu et al. | |
| 5,326,840 A | 7/1994 | Przybilla et al. | |
| 5,470,693 A | 11/1995 | Sachdev et al. | |
| 5,738,975 A | 4/1998 | Nakano et al. | |
| 5,858,620 A | 1/1999 | Ishibashi et al. | |
| 5,866,304 A | 2/1999 | Nakano et al. | |
| 6,030,541 A | 2/2000 | Adkisson et al. | |
| 6,147,394 A | 11/2000 | Bruce et al. | |
| 6,221,568 B1 | 4/2001 | Angelopoulos et al. | |
| 6,338,934 B1 | 1/2002 | Chen et al. | |
| 6,406,829 B1 | 6/2002 | Tachikawa et al. | |
| 6,509,134 B2 | 1/2003 | Ito et al. | |
| 6,555,607 B1 | 4/2003 | Kanada et al. | |
| 6,579,657 B1 | 6/2003 | Ishibashi et al. | |
| 6,593,058 B1 | 7/2003 | Feiring et al. | |
| 6,660,459 B2 | 12/2003 | Babcock | |
| 6,800,423 B2 | 10/2004 | Yokoyama et al. | |
| 6,872,503 B2 | 3/2005 | Wheland et al. | |
| 6,998,358 B2 | 2/2006 | French et al. | |
| 7,016,754 B2 | 3/2006 | Poolla et al. | |
| 7,032,209 B2 | 4/2006 | Kobayashi | |
| 7,129,199 B2 | 10/2006 | Zhang et al. | |
| 7,348,127 B2 | 3/2008 | Hinsberg, III | |
| 7,354,693 B2 | 4/2008 | Hatakeyama et al. | |
| 7,371,510 B2 | 5/2008 | Hirayama et al. | |
| 7,396,482 B2 | 7/2008 | Brandl | |
| 7,399,577 B2 | 7/2008 | Yamato et al. | |
| 7,445,883 B2 | 11/2008 | Baba-Ali et al. | |
| 7,455,952 B2 | 11/2008 | Hatakeyama et al. | |
| 7,608,386 B2 | 10/2009 | Nozaki et al. | |
| 7,670,750 B2 | 3/2010 | Harada et al. | |
| 7,678,537 B2 | 3/2010 | Allen et al. | |
| 7,700,260 B2 | 4/2010 | Kanna et al. | |
| 7,771,914 B2 | 8/2010 | Hatakeyama et al. | |
| 7,851,140 B2 | 12/2010 | Tsubaki | |
| 7,985,534 B2 | 7/2011 | Tsubaki | |
| 7,998,655 B2 | 8/2011 | Tsubaki | |
| 8,017,298 B2 | 9/2011 | Tsubaki | |
| 8,017,304 B2 | 9/2011 | Tarutani et al. | |
| 8,034,547 B2 | 10/2011 | Tsubaki et al. | |
| 8,071,272 B2 | 12/2011 | Tsubaki | |
| 8,088,557 B2 | 1/2012 | Tsubaki | |
| 8,227,183 B2 | 7/2012 | Tsubaki et al. | |
| 8,241,840 B2 | 8/2012 | Tsubaki et al. | |
| 2001/0035343 A1* | 11/2001 | Kamijima | 204/192.17 |
| 2002/0045122 A1* | 4/2002 | Iwasa et al. | 430/270.1 |
| 2002/0132184 A1 | 9/2002 | Babcock | |
| 2003/0022095 A1 | 1/2003 | Kai et al. | |
| 2003/0073027 A1* | 4/2003 | Namiki et al. | 430/270.1 |
| 2003/0091936 A1 | 5/2003 | Rottstegge et al. | |
| 2003/0143483 A1 | 7/2003 | Takechi | |
| 2004/0023150 A1 | 2/2004 | Feiring et al. | |
| 2004/0023152 A1 | 2/2004 | Feiring et al. | |
| 2004/0096780 A1 | 5/2004 | Nozaki et al. | |
| 2004/0229157 A1 | 11/2004 | Rhodes et al. | |
| 2004/0242798 A1 | 12/2004 | Sounik et al. | |
| 2005/0095532 A1 | 5/2005 | Kodama et al. | |
| 2005/0203262 A1 | 9/2005 | Feiring et al. | |
| 2005/0224923 A1* | 10/2005 | Daley et al. | 257/642 |
| 2006/0008736 A1* | 1/2006 | Kanda et al. | 430/270.1 |
| 2006/0040203 A1 | 2/2006 | Kodama et al. | |
| 2006/0073420 A1 | 4/2006 | Nozaki et al. | |
| 2006/0105267 A1 | 5/2006 | Khojasteh et al. | |
| 2006/0147836 A1 | 7/2006 | Hatakeyama et al. | |
| 2006/0189138 A1 | 8/2006 | Nishimura et al. | |
| 2006/0204890 A1 | 9/2006 | Kodama | |
| 2006/0257781 A1 | 11/2006 | Benoit et al. | |
| 2007/0003878 A1 | 1/2007 | Paxton et al. | |
| 2007/0054217 A1 | 3/2007 | Kodama et al. | |
| 2007/0081782 A1 | 4/2007 | Maeda et al. | |
| 2007/0087288 A1 | 4/2007 | Nishiyama et al. | |
| 2007/0105045 A1 | 5/2007 | Iwato et al. | |
| 2007/0254237 A1 | 11/2007 | Allen et al. | |
| 2008/0063984 A1 | 3/2008 | Zhang et al. | |
| 2008/0113300 A2* | 5/2008 | Choi et al. | 430/311 |
| 2008/0131820 A1 | 6/2008 | Van Steenwinckel et al. | |
| 2008/0187860 A1 | 8/2008 | Tsubaki et al. | |
| 2008/0261150 A1 | 10/2008 | Tsubaki et al. | |
| 2008/0311530 A1 | 12/2008 | Allen et al. | |
| 2008/0318171 A1 | 12/2008 | Tsubaki | |
| 2009/0011366 A1 | 1/2009 | Tsubaki et al. | |
| 2009/0042147 A1 | 2/2009 | Tsubaki | |
| 2009/0183390 A1 | 7/2009 | Miller et al. | |
| 2010/0040971 A1 | 2/2010 | Tarutani et al. | |
| 2010/0040972 A1 | 2/2010 | Tarutani et al. | |
| 2010/0167201 A1 | 7/2010 | Tsubaki | |
| 2010/0190106 A1 | 7/2010 | Tsubaki | |
| 2010/0323305 A1 | 12/2010 | Tsubaki et al. | |
| 2010/0330507 A1 | 12/2010 | Tsubaki et al. | |
| 2011/0020755 A1 | 1/2011 | Tsubaki et al. | |
| 2011/0045413 A1 | 2/2011 | Tsubaki | |
| 2011/0229832 A1 | 9/2011 | Kamimura et al. | |
| 2011/0250543 A1 | 10/2011 | Tsubaki | |
| 2011/0300485 A1 | 12/2011 | Tsubaki et al. | |
| 2011/0305992 A1 | 12/2011 | Tarutani et al. | |
| 2012/0088194 A1 | 4/2012 | Tsubaki | |
| 2012/0135355 A1 | 5/2012 | Tsubaki | |

FOREIGN PATENT DOCUMENTS

| | | |
|---|---|---|
| EP | 1338921 A2 | 8/2003 |
| EP | 1 500 977 A1 | 1/2005 |
| EP | 1612604 A2 | 1/2006 |
| EP | 1 720 072 A1 | 11/2006 |
| EP | 1 764 652 A1 | 3/2007 |
| EP | 1980911 A2 | 10/2008 |
| JP | 57-153433 A | 9/1982 |
| JP | 59-045439 A | 3/1984 |
| JP | 04-039665 A | 2/1992 |
| JP | 05-241348 A | 9/1993 |
| JP | 05-265212 A | 10/1993 |
| JP | 06-138666 A | 5/1994 |
| JP | 6-194847 A | 7/1994 |
| JP | 07-181677 A | 7/1995 |
| JP | 7-199467 A | 8/1995 |
| JP | 7-220990 A | 8/1995 |
| JP | 07-261392 A | 10/1995 |
| JP | 9-244247 A | 9/1997 |
| JP | 10-073927 A | 3/1998 |
| JP | 11-145036 A | 5/1999 |
| JP | 2000-199953 A | 7/2000 |
| JP | 2000-321789 A | 11/2000 |
| JP | 2001-019860 A | 1/2001 |
| JP | 2001-109154 A | 4/2001 |
| JP | 2001-215731 A | 8/2001 |
| JP | 2002-525683 A | 8/2002 |
| JP | 2002-260991 A | 9/2002 |
| JP | 2003-76019 A | 3/2003 |
| JP | 2003-122024 A | 4/2003 |
| JP | 2003-195502 A | 7/2003 |
| JP | 2003-249437 A | 9/2003 |
| JP | 2003-270789 A | 9/2003 |
| JP | 2004-061668 A | 2/2004 |
| JP | 2004-514952 A | 5/2004 |
| JP | 2004-527113 A | 9/2004 |
| JP | 2004-310082 A | 11/2004 |
| JP | 2005-109146 A | 4/2005 |
| JP | 2005-533907 A | 11/2005 |
| JP | 2006072326 A | 3/2006 |
| JP | 2006-156422 A | 6/2006 |
| JP | 2006-227174 A | 8/2006 |
| JP | 2006-518779 A | 8/2006 |
| JP | 2006-303504 A | 11/2006 |
| JP | 2006-309245 A | 11/2006 |
| JP | 2007-025240 A | 2/2007 |
| JP | 2007-065024 A | 3/2007 |
| JP | 2007-71978 A | 3/2007 |
| JP | 2007-108581 A | 4/2007 |
| JP | 2007-140188 A | 6/2007 |
| JP | 2007-156450 A | 6/2007 |
| JP | 2008-522206 A | 6/2008 |
| JP | 2008-292975 A | 12/2008 |
| JP | 2008-310314 A | 12/2008 |
| WO | 99-14635 A1 | 3/1999 |
| WO | 00/17712 A1 | 3/2000 |
| WO | 02/44845 A2 | 6/2002 |
| WO | 2004/068242 A1 | 8/2004 |

| | | | |
|---|---|---|---|
| WO | 2004/074937 A1 | 9/2004 | |
| WO | 2004/076495 A2 | 9/2004 | |
| WO | 2004/077158 A1 | 9/2004 | |
| WO | 2005/019937 A1 | 3/2005 | |
| WO | 2005/043239 A1 | 5/2005 | |
| WO | 2006/056905 A2 | 6/2006 | |
| WO | 2007/037213 A1 | 4/2007 | |
| WO | 2008/129964 A1 | 10/2008 | |
| WO | 2008/140119 A1 | 11/2008 | |

OTHER PUBLICATIONS

Written Opinion PCT/ISA/237 issued for PCT/JP2008/058976, dated Jun. 17, 2008.
Extended European Search Report dated Apr. 27, 2009, in European Application No. 08010596.8.
Extended European Search Report dated Apr. 27, 2009, in European Application No. 008010600.8.
Office Action dated Jul. 13, 2010, in Japanese Application No. 2007-155323.
Office Action dated Jul. 13, 2010, in Japanese Application No. 2007-155322.
Office Action dated Nov. 16, 2010 in Taiwanese Application No. 097121644.
Extended European Search Report dated May 28, 2009 in European Application No. 08007245.7.
Office Action dated Mar. 30, 2010 in Japanese Application No. 2007-325915.
Office Action dated Dec. 21, 2010, issued in European Application No. 08007245.7.
Office Action dated Dec. 17, 2010, issued in European Application No. 08010596.8.
Office Action dated Dec. 17, 2010, issued in European Application No. 08010600.8.
European Search Report dated Sep. 20, 2010 in EP Application No. 07025004.8.
Office Action dated Dec. 18, 2010 in Korean Application No. 10-2008-0055449.
Office Action dated Dec. 3, 2010 in Korean Application No. 10-2008-0055461.
Lee, S., et al., "Double exposure technology using silicon containing materials", Advances in Resist Technology and Processing XXIII, Proc. of SPIE, 2006, pp. K-1-K-7, vol. 6153.
Brueck, S., et al., "Extension of 193-nm immersion optical lithography to the 22-nm half-pitch node", Optical Microlithography XVII, Proceedings of SPIE, 2004, pp. 1315-1322, vol. 5377, SPIE, Bellingham, WA.
Maenhoudt, M., et al., "Double Patterning scheme for sub-0.25 k1 single damascene structures at NA=0.75, λ=193nm", Optical Microlithography XVIII, Proceedings of SPIE, 2005, pp. 1508-1518, vol. 5754, SPIE, Bellingham, WA.

International Search Report (PCT/ISA/210) dated Jul. 22, 2008 for PCT/JP2008/060800.
Written Opinion (PCT/ISA/237) dated Jul. 22, 2008 for PCT/JP2008/060800.
"Microdevices", Apr. 2004, pp. 76-87, Nikkei Microdevices.
B.J. Lin, "Semiconductor Foundry, Lithography, and Partners", Emerging Lithograhic of SPIE, 2002, pp. 11-24, vol. 4688, SPIE.
International Search Report (PCT/SA/210) dated May 20, 2008 in PCT/JP2008/057187.
J. A. Hoffnagle et al., "Liquid Immersion Deep-Ultraviolet Interferometric Lithography", J. Vac. Sci. Tehcnol. B, Nov./Dec. 1999, pp. 3306-3309, vol. 17, American Vacuum Society.
Written Opinion (PCT/ISA/237) dated May 20, 2008 in PCT/JP2008/057187.
Correspondence Record prepared Jul. 13, 2010, in Japanese Application No. 2007-325915.
English Translation of JP 2000-199953.
Submission of Publication dated Jun. 11, 2010, in Japanese Application No. 2007-325915.
Office Action dated Mar. 26, 2010 in U.S. Appl. No. 12/145,151.
Office Action dated Jul. 6, 2009 in U.S. Appl. No. 12/145,151.
Office Action dated Sep. 13, 2010 in U.S. Appl. No. 11/964,454.
Office Action dated Sep. 2, 2010 in U.S. Appl. No. 12/137,371.
Office Action dated Dec. 13, 2010 in U.S. Appl. No. 11/964,454.
Office Action dated Sep. 3, 2010 in U.S. Appl. No. 12/137,232.
Office Action dated Nov. 2, 2010, in U.S. Appl. No. 12/145,270.
Office Action dated Feb. 3, 2011 in U.S. Appl. No. 12/959,147.
Office Action dated Nov. 30, 2010 in U.S. Appl. No. 12/578,520.
David Van Steenwinckel, et al.; "Resist effects at small pitches"; American Vacuum Society, Journal Vacuum Science Technology B vol. 24 No. 1; Jan./Feb. 2006; pp. 316-320.
Karen E. Petrillo, et al.; "Effect of photo acid generator concentration on the process latitude of a chemically amplified resist"; American Vacuum Society, Journal of Vacuum Science Technology B; vol. 12 No. 6; Nov./Dec. 1994; pp. 3863-3867.
Japanese Office Action for Application No. 2008-128797, dated Apr. 6, 2010.
Shinji Tarutani, et al.; "Development of Materials and Processes for Double Patterning toward 32 nm Node ArF Immersion Lithography"; Journal of Photoplymer Science and Tech; 2008, vol. 21 No. 5; pp. 685-690.
Extended European Search Report dated Jan. 14, 2011 in EP Application No. 07025004.8.
Office Action dated Feb. 25, 2011 in U.S. Appl. No. 12/895,516.
Office Action dated Jun. 20, 2011 in U.S. Appl. No. 11/964,454.
Office Action dated Jan. 9, 2013 in U.S. Appl. No. 13/588,762.

* cited by examiner

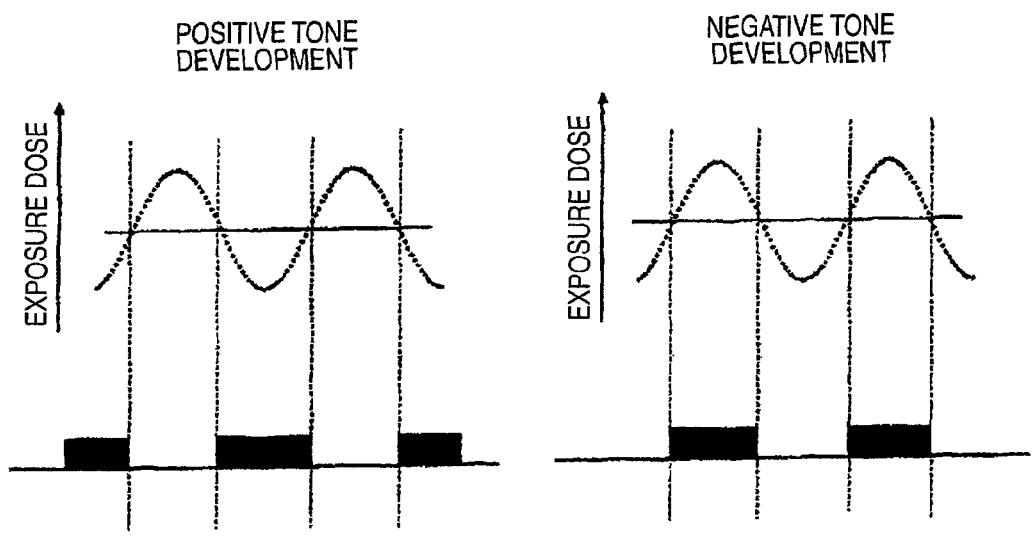

PATTERN FORMING METHOD

CROSS-REFERENCE TO RELATED APPLICATION

This is a Continuation-In-Part application of U.S. application Ser. No. 12/600,038 filed in the United States on Nov. 13, 2009, which is a U.S. National Stage entry of PCT International Application No. PCT/JP2008/058976 filed May 15, 2008, which claims priority to Japanese Application No. 2007-129521 filed May 15, 2007; the entire contents of which are hereby incorporated by reference.

TECHNICAL FIELD

The present invention relates to a pattern forming method for use in the process of producing a semiconductor such as IC, in the production of a circuit board for liquid crystal, thermal head and the like, and in the lithography process of other photo-applications. More specifically, the present invention relates to a pattern forming method suitable for exposure with an ArF exposure apparatus using a light source that emits far ultraviolet light at a wavelength of 300 nm or less or with an immersion-type projection exposure apparatus.

BACKGROUND ART

Since the advent of a resist for KrF excimer laser (248 nm), an image forming method called chemical amplification is used as an image forming method for a resist so as to compensate for sensitivity reduction caused by light absorption. For example, the image forming method by positive tone chemical amplification is an image forming method of decomposing an acid generator in the exposed area upon exposure to produce an acid, converting an alkali-insoluble group into an alkali-soluble group by using the generated acid as a reaction catalyst in the baking after exposure (PEB: Post Exposure Bake), and removing the exposed area by alkali development.

With respect to the developer for g-line, i-line, KrF, ArF, EB or EUV lithography, an aqueous alkali developer of 2.38 mass % TMAH (tetramethylammonium hydroxide) is being used at present as a general-purpose developer.

Other than the above-described developer, for example, Patent Document 1 describes a developer for effecting development by dissolving the exposed portion of a resist material whose polymer chain is broken upon irradiation with radiation to reduce the molecular weight, wherein the developer contains at least two or more members of an acetic acid group, a ketone group, an ether group and a phenyl group and at the same time, has a molecular weight of 150 or more. Also, Patent Documents 2 and 3 describe a developer for effecting development by dissolving the exposed portion of a resist material containing a specific resin having a fluorine atom, wherein the developer is selected from a supercritical fluid, a halogenated organic solvent and a non-halogenated organic solvent.

However, as the miniaturization of a semiconductor device proceeds, it is actually very difficult to find an appropriate combination of a resist composition, a developer and the like for forming a pattern with overall good performance and furthermore, a pattern forming method using those. In this respect, improvements are being demanded.

Along with the miniaturization of a semiconductor device, there is becoming shorter the wavelength of the exposure light source and higher the numerical aperture (higher NA) of the projection lens, and an exposure machine using an ArF excimer laser having a wavelength of 193 nm as a light source has been so far developed. As commonly well known, these factors can be expressed by the following formulae:

$$(\text{Resolution}) = k_1 \cdot (\lambda/\text{NA})$$

$$(\text{Depth of focus}) = \pm k_2 \cdot \lambda/\text{NA}^2$$

wherein $\lambda$ is the wavelength of the exposure light source, NA is the numerical aperture of the projection lens, and $k_1$ and $k_2$ are coefficients related to the process.

A so-called immersion method of filling a high refractive-index liquid (hereinafter sometimes referred to as an "immersion liquid") between the projection lens and the sample has been conventionally advocated as a technique for raising the resolution.

As for the "effect of immersion", assuming that $\text{NA}_0 = \sin\theta$, the above-described resolution and depth of focus in the immersion can be expressed by the following formulae:

$$(\text{Resolution}) = k_1 \cdot (\lambda_0/n)/\text{NA}_0$$

$$(\text{Depth of focus}) = \pm k_2 \cdot (\lambda_0/n)/\text{NA}_0^2$$

wherein $\lambda_0$ is the wavelength of exposure light in air, n is the refractive index of the immersion liquid based on air, and $\theta$ is the convergence half-angle of beam.

That is, the effect of immersion is equal to use of an exposure wavelength of $1/n$. In other words, in the case of a projection optical system with the same NA, the depth of focus can be made n times larger by the immersion. This is effective for all pattern profiles and can be combined with the super-resolution technology under study at present, such as phase-shift method and modified illumination method.

For example, in Patent Documents 4 to 7, a method of demagnifying the space dimension of a resist pattern more than the resolution limit is disclosed as the technique for further enhancing the resolution.

Also, in Patent Document 8, a developer composed of an organic solvent having a lower polarity than an aqueous alkali solution is described as a developer for dissolving and removing the unexposed portion of a resist film formed of a resin whose polarity increases upon irradiation with radiation.

These methods all make use of the characteristics of the chemical amplification-type resist material and utilize a technique where a resist pattern containing an acid generator capable of generating an acid is formed by the normal lithography technology, a material that reacts in the presence of an acid to form a crosslinked layer insolubilized in a developer (sometimes referred to as a "crosslinked layer-forming material") is deposited thereon, and through an additional treatment step such as heating, the acid is diffused into the crosslinked layer-forming material from the resist pattern to form a developer insoluble layer at the interface between the resist pattern and the crosslinked layer-forming material, thereby thickening the dimension of the resist pattern and effectively demagnifying the trench or hole dimension of the resist pattern.

However, in all of these techniques, a larger amount of an acid is utilized and therefore, an additional step such as surface treatment with an acidic substance or another exposure step or furthermore, a heat treatment step at a high temperature is required in some cases, making it difficult to ensure a sufficiently large amount of an acid that is a component effective for forming a developer insoluble layer at the interface with the crosslinked layer-forming material.

In order to solve this problem, Patent Document 9 takes an approach of previously increasing the amount of an acid generator added in the resist to increase the amount of acid diffusion, but in this case, the increase in the amount of acid diffusion involves another problem of deterioration of the resolution, particularly, the exposure latitude, of the resist pattern. The relationship between the increase in the amount of an acid added in the resist and the deterioration of exposure latitude is disclosed, for example, in Non-Patent Document 1. Also, the relationship between the increase in the amount of acid diffusion and the deterioration of exposure latitude is disclosed, for example, in Non-Patent Document 2.

In addition to these circumstances, when the space dimension of an actual resist pattern is demagnified using the method disclosed above, a resist residue (scum) remains on the wafer. Improvement of this problem is being demanded.

Patent Document 1: JP-A-2006-227174 (the term "JP-A" as used herein means an "unexamined published Japanese patent application")
Patent Document 2: JP-T-2002-525683 (the term "JP-T" as used herein means a "published Japanese translation of a PCT patent application")
Patent Document 3: JP-T-2005-533907
Patent Document 4: JP-A-5-241348
Patent Document 5: JP-A-10-73927
Patent Document 6: JP-A-2001-19860
Patent Document 7: JP-A-2004-61668
Patent Document 8: JP-A-2000-199953
Patent Document 9: JP-A-2003-249437
Non-Patent Document 1: Journal of Science and Technology B, Vol. 12, No. 6, 3863 (1994)
Non-Patent Document 2: Journal of Science and Technology B, Vol. 24, No. 1, 316 (2006)

DISCLOSURE OF THE INVENTION

Problems that the Invention is to Solve

The present invention has been made under these circumstances, and an object of the present invention is to provide a method for forming a high-precision fine pattern without generating a residue (scum) so as to produce a high-integration and high-precision electronic device. More specifically, the object of the present invention is to provide a method for forming a pattern having an effectively micro-dimensioned trench or hole pattern with no remaining of a scum.

Means for Solving the Problems

The present invention has the following constructions, and the object of the present invention can be attained by these constructions.

(1) A pattern forming method, comprising:
(i) a step of applying a resist composition whose solubility in a positive tone developer increases and solubility in a negative tone developer decreases upon irradiation with an actinic ray or radiation, the resist composition containing a resin capable of increasing a polarity by an action of an acid;
(ii) an exposure step;
(iii) a step of performing development by using a negative tone developer to form a resist pattern; and
(iv) a step of causing a crosslinked layer-forming material to act on the resist pattern to crosslink the resin constituting the resist pattern and the crosslinked layer-forming material, thereby forming a crosslinked layer.
(2) The pattern forming method as described in (1) above, wherein the step (iii) is a step of performing development by using a developer containing an organic solvent to form a resist pattern.
(3) The pattern forming method as described in (1) or (2) above,
wherein the step (iv) contains a step of applying the crosslinked layer-forming material containing (a) a crosslinking agent and (b) a solvent on the resist pattern.
(4) The pattern forming method as described in any one of (1) to (3) above,
wherein the resist composition contains the following components:
(A) a resin capable of increasing a polarity by an action of an acid, whose solubility in a positive tone developer increases and solubility in a negative tone developer decreases upon irradiation with an actinic ray or radiation;
(B) a compound capable of generating an acid upon irradiation with an actinic ray or radiation; and
(C) a solvent.

Furthermore, preferred embodiments of the present invention are set forth below.

(5) The pattern forming method as described in any one of (1) to (4) above, which further comprises:
(v) a step of removing an unreacted crosslinked layer-forming material.
(6) The pattern forming method as described in (5) above,
wherein the step (v) of removing the unreacted crosslinked layer-forming material is a step of removing the unreacted crosslinked layer-forming material by using water or an organic solvent.
(7) A pattern forming method, comprising, in the following order:
(i) a step of applying a resist composition whose solubility in a positive tone developer increases and solubility in a negative tone developer decreases upon irradiation with an actinic ray or radiation, the resist composition containing a resin capable of increasing a polarity by an action of an acid;
(ii) an exposure step;
(iii) a step of performing development by using a negative tone developer to form a resist pattern;
(iv) a step of causing a crosslinked layer-forming material to act on the resist pattern to crosslink the resin constituting the resist pattern and the crosslinked layer-forming material, thereby forming a crosslinked layer; and
(v) a step of removing an unreacted crosslinked layer-forming material.
(8) A pattern forming method, comprising, in the following order:
(i) a step of applying a resist composition whose solubility in a positive tone developer increases and solubility in a negative tone developer decreases upon irradiation with an actinic ray or radiation, the resist composition containing a resin capable of increasing a polarity by an action of an acid;
(ii) an exposure step;
(vi) a heating step;
(iii) a step of performing development by using a negative tone developer to form a resist pattern;
(iv) a step of causing a crosslinked layer-forming material to act on the resist pattern to crosslink the resin constituting the resist pattern and the crosslinked layer-forming material, thereby forming a crosslinked layer; and
(v) a step of removing an unreacted crosslinked layer-forming material.
(9) The pattern forming method as described in any one of (1) to (8) above,
wherein the step (iv) further contains (vi-2) a heating step.
(10) The pattern forming method as described in (9) above,
wherein the step (vi) or (vi-2) is heating at a temperature of 30 to 160° C.

(11) The pattern forming method as described in any one of (1) to (10) above, which further comprises:
(ii-2) an exposure step after the step (iii).
(12) The pattern forming method as described in any one of (1) to (11) above,
wherein the step (iv) further contains (ii-2') an exposure step.
(13) The pattern forming method as described in (11) or (12) above,
wherein the exposure step (ii-2) or (ii-T) is performed using any one of ultraviolet light, far ultraviolet light, extreme ultraviolet light and electron beam.
(14) The pattern forming method as described in any one of (1) to (13) above, which further comprises:
after the step (iii), (vii) a step of performing washing by using a rinsing solution containing an organic solvent.
(15) The pattern forming method as described in any one of (1) to (14) above,
wherein the crosslinked layer-forming material further contains (c) a resin having a polar group-containing organic group or unsaturated bond.
(16) The pattern forming method as described in (15) above,
wherein the resin (c) having a polar group-containing organic group or unsaturated bond is a resin soluble in an organic solvent or water.
(17) The pattern forming method as described in (16) above,
wherein the polar group-containing organic group is any one of a hydroxyl group, a carboxyl group, an amino group, an ether group, a thiol group, an isocyanate group and a thiocyanate group.
(18) The pattern forming method as described in (16) above,
wherein the resin (c) having a polar group-containing organic group or unsaturated bond is a resin containing at least one member selected from the group consisting of a polyacrylic acid, a polyvinyl alcohol, a polyvinyl acetal, a polyvinyl acetate, polyvinylpyrrolidone, polyethyleneimine, a polyethylene oxide, a styrene-maleic acid copolymer, polyvinylamine, polyallylamine, an oxazoline group-containing resin, a melamine resin, a sulfone amide resin, an unsaturated polyester, a styrene-maleic anhydride copolymer, an acrylic resin, a polyimide, a urethane resin, a phenol resin, a cellulose resin, a vinyl resin, an epoxy resin, a silicone-based resin, an unsaturated organopolysiloxane and a urea resin.
(19) The pattern forming method as described in any one of (1) to (18) above,
wherein the crosslinked layer-forming material contains (a) a crosslinking agent containing at least one member selected from the group consisting of an amino-based crosslinking agent, a vinyl ether-based crosslinking agent, an alcohol-based crosslinking agent and an epoxy-based crosslinking agent.
(20) The pattern forming method as described in any one of (1) to (19) above,
wherein the crosslinked layer-forming material contains an amino-based crosslinking agent.
(21) The pattern forming method as described in any one of (1) to (20) above,
wherein the crosslinked layer-forming material further contains a surfactant.
(22) The pattern forming method as described in (4) above,
wherein the component (A) of the resist composition is a resin having an alicyclic hydrocarbon structure and capable of increasing the polarity by the action of an acid, whose solubility in a positive tone developer increases and solubility in a negative tone developer decreases upon irradiation with an actinic ray or radiation.
(23) The pattern forming method as described in (22) above,
wherein the component (A) of the resist composition has a weight average molecular weight of 1,000 to 100,000.
(24) The pattern forming method as described in (22) or (23) above,
wherein the component (A) of the resist composition is the resin further having a lactone structure.
(25) The pattern forming method as described in any one of (22) to (24) above,
wherein the component (A) of the resist composition is the resin having a repeating unit containing a polar group-containing organic group.
(26) The pattern forming method as described in (25) above,
wherein the polar group-containing organic group is a hydroxyl group.
(27) The pattern forming method as described in (26) above,
wherein the hydroxyl group is contained in the alicyclic hydrocarbon structure.
(28) The pattern forming method as described in any one of (22) to (27) above,
wherein a ratio of the component (B) in the resist composition is from 0.1 to 10 mass % based on the entire solid content of the resist composition.
(29) The pattern forming method as described in any one of (22) to (28) above,
wherein a ratio of the component (B) in the resist composition is from 1 to 7 mass % based on the entire solid content of the resist composition.
(30) The pattern forming method as described in any one of (22) to (29) above,
wherein the resist composition further contains a basic compound.
(31) The pattern forming method as described in any one of (22) to (30) above,
wherein the resist composition further contains a fluorine-containing and/or silicon-containing surfactant.
(32) The pattern forming method as described in any one of (22) to (31) above,
wherein the resist composition further contains (D) a resin having at least either one of a fluorine atom and a silicon atom.
(33) The pattern forming method as described in any one of (1) to (32) above,
wherein the exposure of (ii) is performed using a wavelength of 250 nm or less.
(34) The pattern forming method as described in any one of (1) to (33) above,
wherein the exposure of (ii) is performed using light at a wavelength of 193 nm.
(35) The pattern forming method as described in any one of (1) to (34) above,
wherein immersion exposure is performed using light at a wavelength of 193 nm.

Advantage of the Invention

According to the present invention, a method capable of forming a high-precision fine pattern with no remaining of a scum and further with improved exposure latitude is provided.

BRIEF DESCRIPTION OF THE DRAWINGS

FIG. 1 is a schematic view showing the relationship between a region that is dissolved and removed by negative tone development using a negative tone developer and a region that is dissolved and removed by positive tone development using a positive tone developer, with respect to the exposure dose.

BEST MODE FOR CARRYING OUT THE INVENTION

The best mode for carrying out the present invention is described below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

First, the terms used in the context of the present invention are described.

In the present invention, a resist composition whose solubility in a positive tone developer increases and solubility in a negative tone developer decreases upon irradiation with an actinic ray or radiation, the resist composition containing a resin capable of increasing the polarity by the action of an acid, is used.

Here, the negative tone developer is a developer that selectively dissolves and removes a low exposure part not higher than a predetermined threshold value shown by a dotted line in FIG. 1. As for the negative tone developer, the organic solvent-based developer described later may be suitably used, but the present invention is not limited thereto.

On the other hand, the positive tone developer is a developer that selectively dissolves and removes a high exposure part not lower than the above-described predetermined threshold value. The positive tone developer that is suitably used includes an alkali developer. As for the alkali developer, there may be used an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine. Among these, an aqueous solution of tetraethylammonium hydroxide is preferred.

In the present invention, a development step using a negative tone developer is called negative tone development (sometimes referred to as a negative tone development step), and a development step using a positive tone developer is called positive tone development (sometimes referred to as a positive tone development step).

The crosslinked layer-forming material is a material that is applied on a resist pattern and forms a crosslinked layer at the interface with the resist pattern in the presence of an acid. In the present invention, a material containing (a) a crosslinking agent and (b) a solvent is preferred.

The present invention provides, as a technique for raising the resolution, a new pattern forming method combining a step of applying a resist composition whose solubility in a positive tone developer increases and solubility in a negative tone developer decreases upon irradiation with an actinic ray or radiation, the resist composition containing a resin capable of increasing the polarity by the action of an acid, a negative tone development step of dissolving and removing a low exposure part not higher than a predetermined threshold value and allowing a high exposure part to remain (preferably by using a developer containing an organic solvent), and a step of forming a crosslinked layer capable of being insolubilized due to the presence of an acid in the high exposure part of the resist pattern.

Thanks to this method, improvement of exposure latitude of the resist pattern, microfabrication by demagnification of the resist pattern, and reduction of residue (scum) can be achieved all at the same time. The reasons therefor are not clearly known but are presumed as follows.

That is, a high exposure portion of the resist film is allowed to remain by performing negative tone development and compared with the case of performing positive tone development that allows a low exposure portion of the resist film to remain, the amount of an acid generated in the resist film is considered to become large, making it possible to utilize a larger amount of an acid effective for the crosslinking reaction between the crosslinked layer-forming material and the resist film.

The pattern forming process necessary for carrying out the present invention includes the following steps:

(i) a step of applying a resist composition whose solubility in a positive tone developer increases and solubility in a negative tone developer decreases upon irradiation with an actinic ray or radiation, the resist composition containing a resin capable of increasing the polarity by the action of an acid, (ii) an exposure step, (iii) a step of performing development by using a negative tone developer to form a resist pattern, and (iv) a step of causing a crosslinked layer-forming material to act on the resist pattern to crosslink the resin constituting the resist pattern and the crosslinked layer-forming material, thereby forming a crosslinked layer.

In the pattern forming method of the present invention, the step (iii) is preferably a step of performing development by using a developer containing an organic solvent to form a resist pattern.

In the pattern forming method of the present invention, the step (iv) preferably contains a step of applying a crosslinked layer-forming material containing (a) a crosslinking agent and (b) a solvent on the resist pattern.

<Pattern Forming Method>

The pattern forming method for carrying out the present invention is described in detail below.

The pattern forming method of the present invention preferably contains the following process but is not limited thereto.

A pattern forming method comprising, in order:

(i) a step of applying a resist composition whose solubility in a positive tone developer increases and solubility in a negative tone developer decreases upon irradiation with an actinic ray or radiation, the resist composition containing a resin capable of increasing the polarity by the action of an acid, (ii) an exposure step, (iii) a step of performing development by using a negative tone developer to form a resist pattern, (iv) a step of causing a crosslinked layer-forming material to act on the resist pattern to crosslink the resin constituting the resist pattern and the crosslinked layer-forming material, thereby forming a crosslinked layer, and (v) a step of removing the unreacted crosslinked layer-forming material.

A pattern forming method comprising, in order:

(i) a step of applying a resist composition whose solubility in a positive tone developer increases and solubility in a negative tone developer decreases upon irradiation with an actinic ray or radiation, the resist composition containing a resin capable of increasing the polarity by the action of an acid, (ii) an exposure step, (vi) a heating step, (iii) a step of performing development by using a negative tone developer to form a resist pattern, (iv) a step of causing a crosslinked layer-forming material to act on the resist pattern to crosslink the resin constituting the resist pattern and the crosslinked layer-forming material, thereby forming a crosslinked layer, and (v) a step of removing the unreacted crosslinked layer-forming material.

In the step (i) of applying a resist composition whose solubility in a positive tone developer increases and solubility in a negative tone developer decreases upon irradiation with an actinic ray or radiation, the resist composition containing a resin capable of increasing the polarity by the action of an acid, any method may be used as long as the resist composition can be applied on a substrate, and, for example, a conventionally known spin coating method, spray method, roller coating method or dipping method may be used. Preferably, the resist composition is applied by a spin coating method. After applying the resist composition, the substrate is heated (pre-baked), if desired, whereby a film from which the unnecessary residual solvent is removed can be uniformly formed. The pre-baking temperature is not particularly limited but is preferably from 50 to 160° C., more preferably from 60 to 140° C.

In the present invention, the substrate for forming a film thereon is not particularly limited, and a substrate generally used in the process of producing a semiconductor (e.g., IC), in the production of a circuit board for liquid crystal, thermal head and the like, or in the lithography process of other photo-applications, such as inorganic substrate (e.g., silicon, SiN, $SiO_2$, SiN) or coating-type inorganic substrate (e.g., SOG), may be used.

Before forming a resist film, an antireflection film may be previously applied on the substrate.

The antireflection film used may be either an inorganic film type such as titanium, titanium dioxide, titanium nitride, chromium oxide, carbon and amorphous silicon, or an organic film type composed of a light absorber and a polymer material. Also, the organic antireflection film may be a commercially available organic antireflection film such as DUV30 Series and DUV-40 Series produced by Brewer Science, Inc., and AR-2, AR-3 and AR-5 produced by Shipley Co., Ltd.

The usable resist composition is not particularly limited as long as it contains a compound capable of generating an acid and being applied on a substrate, and the resist composition may be appropriately selected from known resist compositions but is preferably one that can be used for exposure using a wavelength of 200 nm or less. Examples thereof include the later-described composition composed of a resin containing an alicyclic hydrocarbon group.

In the exposure step (ii), the exposure of the resist film may be performed by a generally known method. Preferably, an actinic ray or radiation is irradiated on the resist film through a predetermined mask.

Examples of the actinic ray or radiation include infrared light, visible light, ultraviolet light, far ultraviolet light, X-ray and electron beam, but the radiation is preferably far ultraviolet light at a wavelength of 250 nm or less, more preferably 220 nm or less, still more preferably from 1 to 200 nm. Specifically, ArF excimer laser light, $F_2$ excimer laser light, EUV (13 nm) and electron beam are preferred.

In the present invention, the wavelength of the light source used for the exposure apparatus is not particularly limited, but, for example, KrF excimer laser light (248 nm), ArF excimer laser light (193 nm), $F_2$ excimer laser light (157 nm), EUV (13.5 nm) or electron beam may be applied. Among these, light at a wavelength of 200 nm or less is preferred, and ArF excimer laser light (193 nm) is more preferred. Above all, it is preferred to apply the later-described immersion exposure method to exposure using ArF excimer laser light (193 nm).

In the step of performing exposure of the present invention, an immersion exposure method may be applied.

In the case of performing immersion exposure, (1) after forming a film on the substrate but before exposing the film and/or (2) after the step of exposing the film through an immersion liquid but before heating the film, a step of washing the film surface with an aqueous chemical solution may be performed.

The immersion liquid is preferably a liquid being transparent to light at the exposure wavelength and having as small a temperature coefficient of refractive index as possible so as to minimize the distortion of an optical image projected on the resist film. Particularly, when the exposure light source is an ArF excimer laser (wavelength: 193 nm), water is preferably used in view of easy availability and easy handleability in addition to the above-described aspects.

In the case of using water, an additive (liquid) capable of decreasing the surface tension of water and increasing the surface activity as well may be added in a small ratio. This is preferably an additive that does not dissolve the resist layer on a wafer and at the same time, gives only a negligible effect on the optical coat at the undersurface of the lens element. The water used is preferably distilled water. Pure water obtained by further filtering the distilled water through an ion exchange filter or the like may also be used. By the use of this water, the optical image projected on the resist can be prevented from distortion due to mixing of impurities.

Furthermore, from the standpoint that the refractive index can be more enhanced, a medium having a refractive index of 1.5 or more can also be used. This medium may be either an aqueous solution or an organic solvent.

In order to prevent the resist film from directly contacting with the immersion liquid, a film (hereinafter, sometimes referred to as a "topcoat") sparingly soluble in the immersion liquid may be provided between the resist film and the immersion liquid. The functions required of the topcoat are suitability for coating as an overlayer of the resist, transparency to radiation particularly at 193 nm, and scarce solubility in the immersion liquid. The topcoat is preferably unmixable with the resist and capable of being uniformly applied as an overlayer of the resist.

In view of transparency to light at 193 nm, the topcoat is preferably a polymer not containing an aromatic, and specific examples thereof include a hydrocarbon polymer, an acrylic acid ester polymer, a polymethacrylic acid, a polyacrylic acid, a polyvinyl ether, a silicon-containing polymer and a fluorine-containing polymer.

On peeling off the topcoat, a developer may be used or a releasing agent may be separately used. The releasing agent is preferably a solvent less permeating the resist film. Also, the topcoat is preferably peelable with an alkali developer. In terms of peeling with an alkali developer, the topcoat is preferably acidic, but in view of non-intermixing with the resist film, the topcoat may be neutral or alkaline. Furthermore, from the standpoint that the peeling step can be performed simultaneously with the development step of the resist, the topcoat is preferably peelable with the negative tone developer of the present invention.

At the immersion exposure, in place of or in combination with the topcoat, a hydrophobic resin may be added to the resist composition and after forming a resist film, the immersion exposure may be performed. The hydrophobic resin when added is unevenly distributed to the surface layer of the resist film and in the case of using water as the immersion medium, the resist film formed can be enhanced in the receding contact angle on the resist film surface for water as well as in the followability of the immersion liquid. The hydrophobic resin is a resin yielding an enhanced receding contact angle on the surface by its addition and is preferably (D) a resin having at least either one of a fluorine atom and a silicon atom, which is described later. The receding contact angle of the resist film is preferably from 60 to 90°, more preferably 70° or more. The amount of the hydrophobic resin added may be appropriately adjusted to give a resist film having a receding contact angle in the range above but is preferably from 0.1 to 10 mass %, more preferably from 0.1 to 5 mass %, based on the entire solid content of the resist composition. The hydrophobic resin is unevenly distributed to the interface but unlike a surfactant, need not have necessarily a hydrophilic group in the molecule and may not contribute to uniform mixing of polar/nonpolar substances.

In the pattern forming method of the present invention, the exposure step may be performed a plurality of times. In this case, the exposure performed a plurality of times may use the same light source or different light sources, but an ArF excimer laser light (wavelength: 193 nm) is preferably used for the first exposure.

After the exposure step, baking (PEB) is preferably performed, and the resist film is then developed and rinsed, whereby a good pattern can be obtained. The temperature of PEB is not particularly limited as long as a good resist pattern can be obtained, and the temperature is usually from 40 to 160° C.

In the present invention, (iii) development using a negative tone developer is performed to form a resist pattern.

As for the organic developer usable when performing the negative tone development, a polar solvent such as ketone-based solvent, ester-based solvent, alcohol-based solvent, amide-based solvent and ether-based solvent, and a hydrocarbon-based solvent can be used. For example, there may be used a ketone-based solvent such as 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate and methyl amyl ketone (2-heptanone); and an ester-based solvent such as methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate.

Examples of the alcohol-based solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol and n-decanol; a glycol-based solvent such as ethylene glycol, diethylene glycol and triethylene glycol; and a glycol ether-based solvent such as ethylene glycol monomethyl ether, propylene glycol monomethyl ether, ethylene glycol, propylene glycol, diethylene glycol monomethyl ether, triethylene glycol monoethyl ether and methoxymethyl butanol.

Examples of the ether-based solvent include dioxane and tetrahydrofuran, in addition to the glycol ether-based solvents above.

Examples of the amide-based solvent which can be used include N-methyl-2-pyrrolidone, N,N-dimethylacetamide, N,N-dimethylformamide, hexamethylphosphoric triamide and 1,3-dimethyl-2-imidazolidinone.

Examples of the hydrocarbon-based solvent include an aromatic hydrocarbon-based solvent such as toluene and xylene, and an aliphatic hydrocarbon-based solvent such as pentane, hexane, octane and decane.

A plurality of these solvents may be mixed, or the solvent may be used by mixing it with a solvent other than those described above or water.

Examples of the developing method which can be applied include a method of dipping the substrate in a bath filled with the developer for a fixed time (dipping method), a method of raising the developer on the substrate surface by the effect of a surface tension and keeping it still for a fixed time, thereby performing the development (puddle method), a method of spraying the developer on the substrate surface (spray method), and a method of continuously ejecting the developer on a substrate rotating at a constant speed while scanning the developer ejecting nozzle at a constant rate (dynamic dispense method). An appropriate method may be selected from these methods according to the property of the developer used or the purpose.

In the developer usable when performing negative tone development, a surfactant can be added in an appropriate amount, if desired.

The surfactant is not particularly limited but, for example, an ionic or nonionic fluorine-containing and/or silicon-containing surfactant can be used. Examples of such a fluorine-containing and/or silicon-containing surfactant include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988 and U.S. Pat. Nos. 5,405,720, 5,360,692, 5,529,881, 5,296,330, 5,436,098, 5,576,143, 5,294,511 and 5,824,451. The surfactant is preferably a nonionic surfactant. The nonionic surfactant is not particularly limited, but a fluorine-containing surfactant or a silicon-containing surfactant is more preferred.

The amount of the surfactant used is usually from 0.001 to 5 mass %, preferably from 0.005 to 2 mass %, more preferably from 0.01 to 0.5 mass %, based on the entire amount of the developer.

After the step of performing negative tone development, a step of stopping the development by replacement with a different solvent may be practiced.

After the negative tone development, (vii) a step of performing washing by using an organic solvent-containing rinsing solution for negative tone development is preferably provided.

The rinsing solution for use in the rinsing step (vii) is not particularly limited as long as it does not dissolve the resist pattern, and a solution containing an organic solvent in general may be used. The rinsing solution is preferably a rinsing solution containing at least one kind of an organic solvent selected from a hydrocarbon-based solvent, a ketone-based solvent, an ester-based solvent, an alcohol-based solvent, an amide-based solvent and an ether-based solvent. More preferably, a step of washing the resist film by using a rinsing solution containing at least one kind of an organic solvent selected from a ketone-based solvent, an ester-based solvent, an alcohol-based solvent and an amide-based solvent is preformed after negative tone development; still more preferably, a step of washing the resist film by using a rinsing solution containing an alcohol-based solvent or an ester-based solvent is performed after negative tone development; yet still more preferably, a step of washing the resist film by using a rinsing solution containing a monohydric alcohol having a carbon number of 5 to 8 is performed after negative tone development. The monohydric alcohol having a carbon number of 5 to 8, which is used in the rinsing step after negative tone development, includes a linear, branched or cyclic monohydric alcohol, and specific examples of the monohydric alcohol which can be used include 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol, with 1-hexanol, 2-hexanol, 4-methyl-2-pentanol and 1-pentanol being preferred.

A plurality of these components may be mixed, or the solvent may be used by mixing it with an organic solvent other than those described above.

The water content in the rinsing solution is preferably 10 mass % or less, more preferably 5 mass % or less, still more preferably 3 mass % or less. By setting the water content to 10 mass % or less, good development characteristics can be obtained.

The rinsing solution may also be used after adding thereto a surfactant in an appropriate amount.

In the rinsing step, the wafer after negative tone development is preferably washed using the above-described organic solvent-containing rinsing solution. The method for washing treatment is not particularly limited but, for example, a method of continuously ejecting the rinsing solution on a substrate rotating at a constant speed (spin coating method), a method of dipping the substrate in a bath filled with the rinsing solution for a fixed time (dipping method), and a method of spraying the rinsing solution on the substrate surface (spraying method) may be applied. Above all, a method where the washing treatment is performed by the spin coating method and after the washing, the rinsing solution is removed from the substrate surface by rotating the substrate at a rotation speed of 2,000 to 4,000 rpm, is preferred.

After the formation of a resist patter, (ii-2) a second exposure step may be performed, if desired. Thanks to this step, a larger amount of an acid can be generated in the resist pattern. In the second exposure step, the entire surface of the resist pattern is preferably exposed uniformly without intervention of a mask for pattern formation. The light source for this exposure may be any exposure light source that can generate an acid in the resist pattern, and examples thereof include g-line or i-line of a high-pressure mercury lamp, KrF excimer laser light, ArF excimer laser light, EUV light and electron beam.

In the present invention, after the formation of a resist pattern, (iv) a step of causing a crosslinked layer-forming material to act on the resist pattern to crosslink the resin constituting the resist pattern and the crosslinked layer-forming material, thereby forming a crosslinked layer, is performed.

The step (iv) preferably contains a step of applying a crosslinked layer-forming material containing (a) a crosslinking agent and (b) a solvent on the resist pattern.

In the step of applying a crosslinked layer-forming material, any method may be used as long as a crosslinked layer-forming material can be applied on the substrate, and a conventionally well-known methods such as spin coating method, spray method, roller coating method and dipping method, may be used. Preferably, a crosslinked layer-forming material is applied by a spin coating method. After the application of a crosslinked layer-forming material, the substrate is heated (pre-baking, (vi) a heating step) to form a film composed of a crosslinked layer-forming material, whereby an unnecessary residual solvent can be removed and furthermore, the crosslinked layer-forming material can efficiently permeate (be mixed in) the resist pattern. The pre-baking temperature is not particularly limited as long as it causes no softening of the resist pattern, but the temperature is preferably from 30 to 160° C., more preferably from 60 to 140° C. Subsequently, the substrate is further subjected to a heating treatment (mixing baking, (vi-2) a heating step), whereby a sufficiently large amount of an acid diffuses into the interface between the resist pattern and the film composed of the crosslinked layer-forming material and a crosslinking reaction occurs in the interface portion. Here, the mixing baking temperature is not particularly limited as long as the temperature is high enough to cause a crosslinking reaction, but for achieving efficient progress of the crosslinking reaction, the temperature is preferably higher than the pre-baking temperature. The mixing baking temperature and time can be appropriately selected according to the kind of the resist material used, the kind of the crosslinked layer-forming material, the demagnification amount of the resist pattern. The mixing baking temperature is preferably from 30 to 160° C., more preferably from 60 to 160° C.

After the application of the crosslinked layer-forming material, (ii-2') an exposure step may be further performed, if desired. By this step, a larger amount of an acid can be generated in the resist pattern. In the second exposure step, the entire surface of the resist pattern is preferably exposed uniformly without intervention of a mask for pattern formation. The light source for the exposure may be any exposure light source emitting light capable of generating an acid in the resist pattern, such as ultraviolet ray, far ultraviolet ray, extreme ultraviolet light and electron beam, and examples thereof include g-line or i-line of a high-pressure mercury lamp, KrF excimer laser light, ArF excimer laser light, EUV light and electron beam.

The exposure step (ii-2') is preferably performed before the mixing baking above.

The exposure step (ii-2) and the exposure step (ii-2') may be performed individually, or both may be used in combination.

Furthermore, the pattern forming method preferably contains, after the mixing baking, a step of removing the unreacted portion (sometimes referred to as a "non-crosslinked portion") of the film composed of the crosslinked layer-forming material. By virtue of this step, a pattern where the trench or hole dimension of the resist pattern is demagnified can be obtained.

The removing step is preferably a step of developing and removing the unreacted crosslinked layer-forming material by using a developer (hereafter also called as "a removing solvent") containing water or an organic solvent. The water and organic solvent may be used by mixing these together or may be used after adding a surfactant or other additives, if desired. Of these, in the case where a solvent containing water is used as the developer, an aqueous alkali solution or pure water is preferred, and in the case where a solvent containing an organic solvent is used as the developer, it is preferred to use an organic solvent containing at least one member of a ketone-based solvent, an ester-based solvent, an alcohol-based solvent, an amide-based solvent, an ether-based solvent and a hydrocarbon-based solvent. Examples of the aqueous alkali solution are the same as those of the alkali developer used as the positive tone developer set forth above. Examples of a ketone-based solvent, an ester-based solvent, an alcohol-based solvent, an amide-based solvent, an ether-based solvent and a hydrocarbon-based solvent used in the step of removing the unreacted crosslinked layer-forming material are the same as those of the organic developer usable when performing the negative tone development, respectively.

The processing temperature and time in the step of developing and removing the unreacted crosslinked layer-forming material can be arbitrarily adjusted within the range where a good resist pattern can be obtained.

After developing and removing the unreacted crosslinked layer-forming material, a heat treatment (post-baking) may be further applied. By this treatment, an excess solvent on the wafer can be dried and removed. The heating temperature can be appropriately adjusted according to the solvent used for developing the unreacted crosslinked layer-forming material.

The usable crosslinked layer-forming material is not particularly limited and may be any material as long as it can crosslink with the resist pattern. The crosslinked layer-forming material that can be used in the present invention is described below.

<Crosslinked Layer-Forming Material>

The crosslinked layer-forming material for use in the pattern forming method of the present invention preferably contains (a) a crosslinking agent and (b) a solvent. The crosslinked layer-forming material preferably further contains (c) a resin having a polar group-containing organic group or an unsaturated bond. Furthermore, the material may contain a surfactant, a basic component, other additives and the like, if desired.

(a) Crosslinking Agent

The crosslinking agent contained in the crosslinked layer-forming material is not particularly limited as long as it can dissolve in a solvent composed of water or an organic solvent and can cause a crosslinking reaction by the effect of heat or an acid. Examples of the crosslinking agent which can be used include an amino-based crosslinking agent, a vinyl ether-based crosslinking agent, an alcohol-based crosslinking agent and an epoxy-based crosslinking agent. One of these crosslinking agents may be used alone, or two or more thereof may be used in combination. From the standpoint of enhancing the reactivity, the crosslinking agent is preferably a bifunctional or greater crosslinking agent, more preferably a bifunctional or greater amino-based crosslinking agent. Specific examples thereof include a melamine derivative, a urea derivative and a uril derivative. Examples of the melamine derivative include alkoxymethyl melamine, alkoxymethylene melamine and their derivatives; examples of the urea derivative include urea, alkoxymethylene urea, N-alkoxymethylene urea, ethylene urea, ethylene urea carboxylic acid and their derivatives; and examples of the uril derivative include benzoguanamine, glycol uril and their derivatives. Among these, urea and glycol uril are preferred, and hydroxymethylated urea and glycol uril are more preferred.

The amount of the crosslinking agent (a) added may be appropriately selected according to the kinds and contents of the solvent (b) and the resin (c) containing a polar group-containing organic group or an unsaturated bond and in general, the amount added is preferably from 1 to 70 mass %, more preferably from 5 to 50 mass %, and most preferably from 10 to 50 mass %, based on the entire solid content of the crosslinked layer-forming material.

(b) Solvent

The solvent contained in the crosslinked layer-forming material may be water or an organic solvent and is not particularly limited as long as it does not dissolve the resist pattern, and the solvent may be appropriately selected according to the crosslinked layer-forming material and resist composition used. In the case of using water as the solvent (b), pure water is preferred, and in the case of using an organic solvent, it is preferred to use a ketone-based solvent, an ester-based solvent, an alcohol-based solvent, an amide-based solvent, an ether-based solvent or the like alone or use a mixed solvent of two or more kinds thereof.

Among these, in view of non-dissolvability of the resist pattern, an alcohol-based solvent is preferred, and a monohydric alcohol solvent having a carbon number of 3 to 8 is most preferred.

The entire solid content concentration (total weight excluding the solvent) of the crosslinked layer-forming material is preferably from 0.1 to 20 mass %, more preferably from 1 to 15 mass %, and most preferably from 1 to 13 mass %.

(c) Resin Containing a Polar Group-Containing Organic Group or an Unsaturated Bond The crosslinked layer-forming material for use in the pattern forming method of the present invention preferably contains (c) a resin containing a polar group-containing organic group or an unsaturated bond. The resin may be appropriately selected according to the crosslinked layer-forming material (particularly, the solvent) and resist composition used and is preferably a resin soluble in water or an organic solvent.

The resin (c) containing a polar group-containing organic group or an unsaturated bond is not particularly limited as long as it can cause a crosslinking reaction or can be mixed with a crosslinking agent, and the resin may be appropriately selected according to the purpose. For example, there may be used a resin containing at least one member selected from the group consisting of a polyacrylic acid, a polyvinyl alcohol, a polyvinyl acetal, a polyvinyl acetate, polyvinylpyrrolidone, polyethyleneimine, a polyethylene oxide, a styrene-maleic acid copolymer, polyvinylamine, polyallylamine, an oxazoline group-containing resin, a melamine resin, a sulfone amide resin, an unsaturated polyester, a styrene-maleic anhydride copolymer, an acrylic resin, polyimide, a urethane resin, phenol resin, a cellulose resin, a vinyl resin, an epoxy resin, a silicone-based resin, an unsaturated organopolysiloxane and a urea resin. Among these, preferred is a resin containing a polyvinyl alcohol, polyvinyl acetal or a polyvinyl acetate.

Another preferred embodiment of the resin (c) containing a polar group-containing organic group or an unsaturated bond is a resin having an alicyclic hydrocarbon structure containing at least one organic group selected from the group consisting of a hydroxyl group, a carboxyl group, an amino group, an ether group, a thiol group, an isocyanate group and a thiocyanate group. By using this resin, dry etching resistance can be enhanced. As for the resin having an alicyclic hydrocarbon structure, "a resin capable of increasing the polarity by the action of an acid, whose solubility in a positive tone developer increases and solubility in a negative tone developer decreases upon irradiation with an actinic ray or radiation", which is used for the later-described resist composition, may be used as it is. Above all, a resin having an alicyclic hydrocarbon structure containing at least one organic group selected from the group consisting of a hydroxyl group, a carboxyl group and an amino group is preferred. As for the resin having an alicyclic hydrocarbon structure, one kind may be used alone, or two or more kinds may be used in combination.

The standard polystyrene-reduced weight average molecular of the resin (c) is preferably from 1,000 to 100,000, more preferably from 1,000 to 50,000, still more preferably from 2,000 to 15,000, yet still more preferably from 3,000 to 15,000.

The molecular weight distribution (Mw/Mn, also called polydispersity) of the resin (c) is preferably from 1 to 5, more preferably from 1 to 3, still more preferably from 1 to 1.5.

The amount of the resin (c) added may be appropriately selected according to the kinds of the crosslinking agent (a) and the solvent (b) but is preferably from 30 to 99 mass %, more preferably from 50 to 95 mass %, and most preferably from 50 to 90 mass %, based on the total weight of the crosslinked layer-forming agent excluding the solvent.

Surfactant:

The crosslinked layer-forming material for use in the present invention preferably contains a surfactant for the purpose of enhancing the film-forming property of the crosslinked layer-forming material. The surfactant is not particularly limited and as long as it enables uniform film formation of the crosslinked layer-forming material and can dissolve in the solvent of the crosslinked layer-forming material, any of an anionic surfactant, a cationic surfactant and a nonionic surfactant can be used.

The amount of the surfactant added is preferably from 0.001 to 20 mass %, more preferably from 0.01 to 10 mass %.

One kind of a surfactant may be used alone, or two or more kinds of surfactants may be used in combination.

As regards the surfactant, for example, a surfactant selected from the group consisting of an alkyl cationic surfactant, an amide-type quaternary cationic surfactant, an ester-type quaternary cationic surfactant, an amine oxide-based surfactant, a betaine-based surfactant, an alkoxylate-based surfactant, a fatty acid ester-based surfactant, an amide-based surfactant, an alcohol-based surfactant, an ethylenediamine-based surfactant and a fluorine-containing and/or silicon-containing surfactant (a fluorine-containing surfactant, a silicon-containing surfactant or a surfactant containing both a fluorine atom and a silicon atom) may be suitably used.

Specific examples of the surfactant include surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate. The following commercially available surfactants each may also be used as it is.

Examples of the commercially available surfactant which can be used include a fluorine-containing or silicon-containing surfactant such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204D, 208G, 218G, 230G, 204D, 208D, 212D, 218 and 222D (produced by NEOS Co., Ltd.). In addition, polysiloxane polymer KP-341 (produced by Shin-Etsu Chemical Co., Ltd.) may also be used as the silicon-containing surfactant.

Basic Component:

The crosslinked layer-forming material for use in the present invention may contain a basic component for the purpose of adjusting the demagnification range of pattern. The basic component is not particularly limited, and examples thereof include organic amines and ammonium salts.

Specific examples of the basic component include an aliphatic amine such as trihexylamine and trioctylamine; an aliphatic where the hydrogen atom of an aliphatic amine such as triethanolamine or dioctanolamine is replaced by a polar group such as hydroxyl group; a compound having an imidazole structure, such as 2,4,5-triphenylimidazole and benzimidazole; a compound having a diazabicyclo structure, such as diazabicycloundecene and diazabicyclononene; and a compound having an aniline structure, such as 2,6-diisopropylaniline and N,N-dimethylaniline. One of these basic components may be used alone, or two or more thereof may be used in combination.

<Resist Composition>

The pattern forming method of the present invention uses a resist composition whose solubility in a positive tone developer increases and solubility in a negative tone developer decreases upon irradiation with an actinic ray or radiation, the resist composition containing a resin capable of increasing the polarity by the action of an acid.

The resist composition preferably contains the following components:

(A) a resin capable of increasing the polarity by the action of an acid, whose solubility in a positive tone developer increases and solubility in a negative tone developer decreases upon irradiation with an actinic ray or radiation, (B) a compound capable of generating an acid upon irradiation with an actinic ray or radiation, and (C) a solvent.

The resist composition which can be used in the present invention is described below.

(A) Resin Capable of Increasing the Polarity by the Action of an Acid

The resin capable of increasing the polarity by the action of an acid, which is used in the resist composition of the present invention, is a resin having a group that decomposes by the action of an acid to produce an alkali-soluble group (hereinafter sometimes referred to as an "acid-decomposable group"), on either one or both of the main chain and the side chain of the resin (sometimes referred to as an "acid-decomposable resin", an "acid-decomposable resin (A)" or a "resin (A)"). The resin is preferably a resin having a monocyclic or polycyclic alicyclic hydrocarbon structure and being capable of increasing the porality by the action of an acid to cause an increase of solubility in a positive tone developer and a decrease of solubility in a negative tone developer (hereinafter sometimes referred to as an "alicyclic hydrocarbon-based acid-decomposable resin"). Because, the polarity of the resin is greatly changed between before and after irradiation with an actinic ray or radiation and when the resist film is developed using a positive tone developer (preferably an alkali developer) and a negative tone developer (preferably an organic solvent), the dissolution contrast is raised. Furthermore, the resin having a monocyclic or polycyclic alicyclic hydrocarbon structure generally has high hydrophobicity and ensures a high development rate at the time of developing the resist film in the region of weak light irradiation intensity with a negative tone developer (preferably an organic developer), and the developability in using a negative tone developer is enhanced.

The resist composition of the present invention containing a resin capable of increasing the polarity by the action of an acid can be suitably used when ArF excimer laser light is irradiated.

The resin capable of increasing the polarity by the action of an acid is preferably a resin containing an organic group having a polar group.

The polar group-containing organic group is preferably at least one organic group selected from the group consisting of a hydroxyl group, a carboxyl group, an amino group, an ether group, a thiol group, an isocyanate group and a thiocyanate group.

The polar group-containing organic group is more preferably a hydroxyl group.

The hydroxyl group is still more preferably contained in the alicyclic hydrocarbon structure.

More suitable groups include a group represented by the following formula (F1), a group represented by the following formula (H1) and a group represented by the following formula (H2). It is preferred that each of these groups is independently contained in a repeating unit of the resin.

The acid-decomposable resin for use in the present invention is preferably a resin containing at least one of a repeating unit having a group represented by formula (F1), a repeating unit having a group represented by formula (H1) and a repeating unit having a group represented by formula (H2), more preferably a resin containing a repeating unit represented by formula (H1). Two or more kinds of these repeating units may be contained in the resin at the same time.

The acid-decomposable resin for use in the present invention preferably contains a repeating unit having from 1 to 3 groups represented by formula (F1). Thanks to this repeating unit, the crosslinking reactivity with the crosslinked layer-forming material is enhanced.

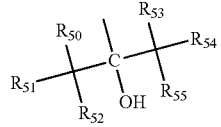

(F1)

In formula (F1), each of $R_{50}$ to $R_{55}$ independently represents a hydrogen atom, a fluorine atom or an alkyl group, provided that at least one of $R_{50}$ to $R_{55}$ is a fluorine atom or an alkyl group with at least one hydrogen atom being replaced by a fluorine atom.

The alkyl group of $R_{50}$ to $R_{55}$ may be substituted by a halogen atom (e.g., fluorine), a cyano group or the like, and the alkyl group is preferably an alkyl group having a carbon number of 1 to 3, such as methyl group and trifluoromethyl group.

It is preferred that $R_{50}$ to $R_{55}$ all are a fluorine atom.

The repeating unit having a group represented by formula (F1) is preferably a repeating unit represented by the following formula (F1'):

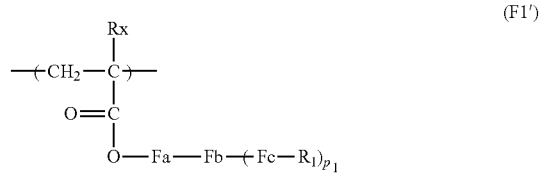

(F1')

In formula (F1'), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group and is preferably a single bond.

Fb represents a monocyclic or polycyclic hydrocarbon group.

Fc represents a single bond or a linear or branched alkylene group and is preferably a single bond or a methylene group.

$F_1$ represents a group represented by formula (F1).

$p_1$ represents a number of 1 to 3.

The cyclic hydrocarbon group in Fb is preferably a cyclopentyl group, a cyclohexyl group or a norbornyl group.

Specific examples of the repeating unit having a group represented by formula (F1) are set forth below, but the present invention is not limited thereto.

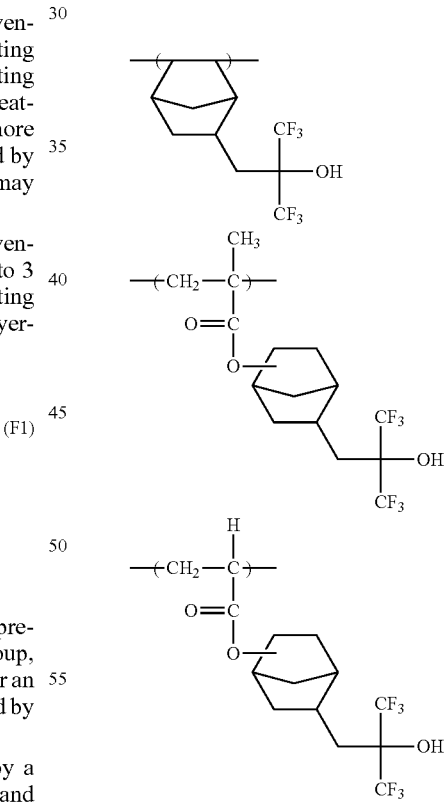

The alicyclic hydrocarbon-based acid-decomposable resin for use in the present invention preferably contains a repeating unit having a group represented by formula (H1). Thanks to this repeating unit, the crosslinking reactivity with the crosslinked layer-forming material and moreover, the adherence to substrate are enhanced.

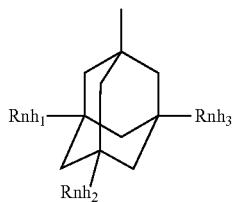

(H1)

In formula (H1), each of $Rnh_1$ to $Rnh_3$ represents a hydrogen atom or a hydroxyl group, provided that at least one of $Rnh_1$ to $Rnh_3$ represents a hydroxyl group.

In the present invention, one or two members out of $Rnh_1$ to $Rnh_3$ are preferably a hydroxyl group, with the remaining being a hydrogen atom.

The repeating unit having a group represented by formula (H1) is preferably a repeating unit represented by the following formula (NGH1):

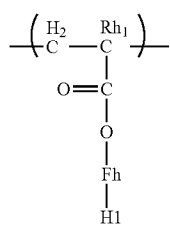

(NGH1)

In formula (NGH1), $Rh_1$ represents a hydrogen atom, an alkyl group having a carbon number of 1 to 4, or a hydroxyalkyl group having a carbon number of 1 to 4.

Fh represents a single bond or a linear or branched alkylene group and is preferably a single bond.

H1 represents a group represented by formula (H1).

Specific examples of the repeating unit having a hydroxyl group represented by formula (NGH1) are set forth below, but the present invention is not limited thereto.

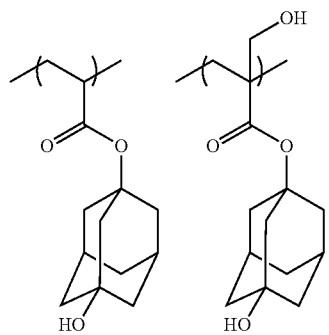

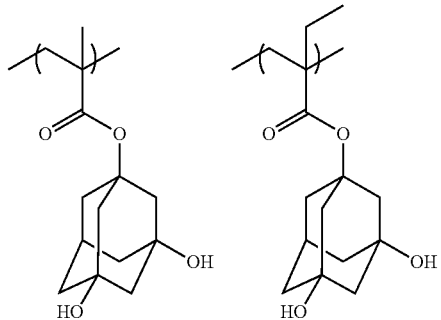

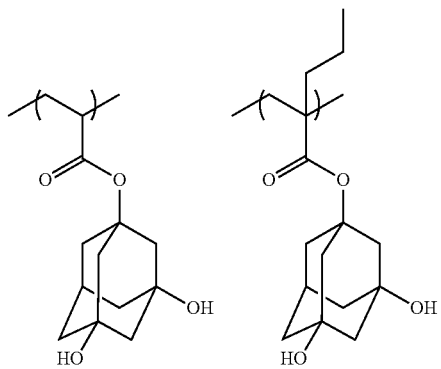

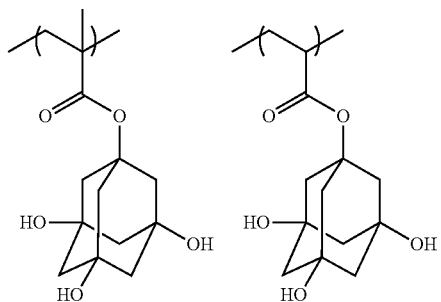

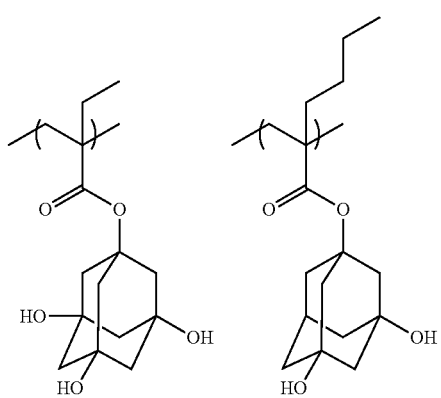

-continued

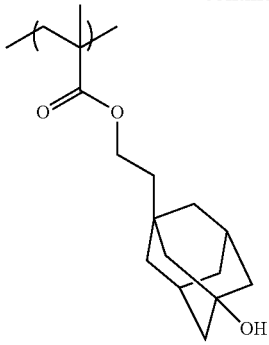

The acid-decomposable resin for use in the present invention preferably contains a repeating unit having a group represented by formula (H2). Thanks to this repeating unit, the crosslinking reactivity with the crosslinked layer-forming material and moreover, the adherence to substrate are enhanced.

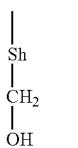

(H2)

In formula (H2), Sh represents a single bond or a chain alkylene group.

In the present invention, Sh is preferably a single bond or an alkylene group having a carbon number of 1 to 8. The alkylene chain main contain a linking group having a heteroatom such as oxygen atom, sulfur atom, ester group or ketone group. Above all, a single bond or a chain alkylene group having a carbon number 1 to 4 is more preferred, and a single bond, a methylene group or an ethylene group is most preferred.

The repeating unit having a group represented by formula (H2) is preferably a repeating unit represented by the following formula (NGH2).

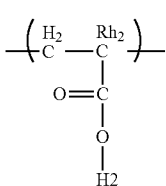

(NGH2)

In formula (NGH2), $Rh_2$ represents a hydrogen atom, an alkyl group having a carbon number of 1 to 4, a fluorinated alkyl group having a carbon number of 1 to 4, or a hydroxyalkyl group having a carbon number of 1 to 4. $Rh_2$ is preferably a hydrogen atom or a methyl group.

H2 represents a group represented by formula (H2).

The acid-decomposable resin for use in the present invention may contain a repeating unit having a phenolic hydroxyl group, a carboxylic acid group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Of these, a repeating unit having a carboxylic acid group is preferred. By virtue of containing such a repeating unit, the resolution increases in the usage of forming contact holes. As for the repeating unit having a carboxyl group, a repeating unit where a carboxyl group is directly bonded to the resin main chain, such as repeating unit by an acrylic acid or a methacrylic acid, a repeating unit where a carboxyl group is bonded to the resin main chain through a linking group, and a repeating unit where a carboxyl group is introduced into the terminal of the polymer chain by using a polymerization initiator or chain transfer agent having an alkali-soluble group at the polymerization, all are preferred. The linking group may have a monocyclic or polycyclic hydrocarbon structure. A repeating unit by an acrylic acid or a methacrylic acid is more preferred.

The group preferred as a group capable of decomposing by the action of an acid (acid-decomposable group) is a group where the hydrogen atom of an alkali-soluble group such as phenolic hydroxyl group, carboxylic acid group, fluorinated alcohol group, sulfonic acid group, sulfonamide group, sulfonylimide group, (alkylsulfonyl)(alkylcarbonyl)methylene group, (alkylsulfonyl)(alkylcarbonyl)imide group, bis(alkylcarbonyl)methylene group, bis(alkylcarbonyl)imide group, bis(alkylsulfonyl)methylene group, bis(alkylsulfonyl)imide group, tris(alkylcarbonyl)methylene group and tris(alkylsulfonyl)methylene group is replaced by a group capable of leaving by the action of an acid.

Examples of the group capable of leaving by the action of an acid include —$C(R_{36})(R_{37})(R_{38})$, —$C(R_{36})(R_{37})(OR_{39})$ and —$C(R_{01})(R_{02})(OR_{39})$.

In the formulae, each of $R_{36}$ to $R_{39}$ independently represents an alkyl group, a cycloalkyl group, an aryl group, an aralkyl group or an alkenyl group, and $R_{36}$ and $R_{37}$ may combine together to form a ring.

Each of $R_{01}$ and $R_{02}$ independently represents a hydrogen atom, an alkyl group, a cycloalkyl group, an aryl group, an aralkyl group or an alkenyl group.

The acid-decomposable group is preferably, for example, a cumyl ester group, an enol ester group, an acetal ester group or a tertiary alkyl ester group, more preferably a tertiary alkyl ester group.

The alicyclic hydrocarbon-based acid-decomposable resin for use in the present invention is preferably a resin containing at least one member selected from the group consisting of a repeating unit having an alicyclic hydrocarbon-containing partial structure represented by any one of the following formulae (pI) to (pV) and a repeating unit represented by the following formula (II-AB).

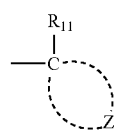

(pI)

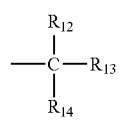

(pII)

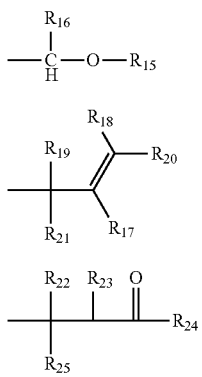

(pIII)

(pIV)

(pV)

In formulae (pI) to (pV), $R_{11}$ represents a methyl group, an ethyl group, an n-propyl group, an isopropyl group, an n-butyl group, an isobutyl group or a sec-butyl group.

Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

Each of $R_{17}$ to $R_{21}$ independently represents a hydrogen atom, a linear or branched alkyl group having a carbon number of 1 to 4 or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4 or a cycloalkyl group, provided that at least one of $R_{22}$ to $R_{25}$ represents a cycloalkyl group. $R_{23}$ and $R_{24}$ may combine with each other to form a ring.

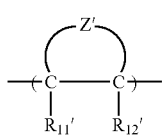

(II-AB)

In formula (II-AB), each of $R_{11}'$ and $R_{12}'$ independently represents a hydrogen atom, a cyano group, a halogen atom or an alkyl group.

Z' represents an atomic group for forming an alicyclic structure containing two bonded carbon atoms (C—C).

Formula (II-AB) is preferably the following formula (II-AB1) or (II-AB2):

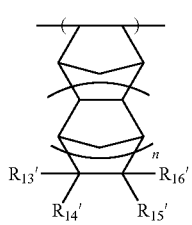

(II-AB1)

(II-AB2)

In formulae (II-AB 1) and (II-AB2), each of $R_{13}'$ to $R_{16}'$ independently represents a hydrogen atom, a halogen atom, a cyano group, —COOH, —COOR$_5$, a group capable of decomposing by the action of an acid, —C(=O)—X-A'-R$_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a single bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{12}$ to $R_{25}$ is a linear or branched alkyl group having a carbon number of 1 to 4.

The cycloalkyl group of $R_{11}$ to $R_{25}$ and the cycloalkyl group formed by Z together with the carbon atom may be monocyclic or polycyclic. Specific examples thereof include a group having a carbon number of 5 or more and having a monocyclo, bicyclo, tricyclo or tetracyclo structure. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

Examples of the substituent which the alkyl group and cycloalkyl group each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). Examples of the substituent which these alkyl group, alkoxy group, alkoxycarbonyl group and the like each may further have include a hydroxyl group, a halogen atom and an alkoxy group.

The structures represented by formulae (pI) to (pV) each can be used for the protection of an alkali-soluble group in the resin. Examples of the alkali-soluble group include various groups known in this technical field.

Specific examples thereof include a structure where the hydrogen atom of a carboxylic acid group, a sulfonic acid group, a phenol group or a thiol group is replaced by the structure represented by any one of formulae (pI) to (pV). Among these, preferred is a structure where the hydrogen atom of a carboxylic acid group or a sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

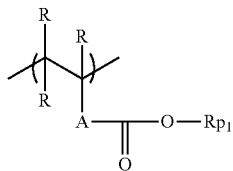
(pA)

In the formula, R represents a hydrogen atom, a halogen atom or a linear or branched alkyl group having a carbon number of 1 to 4, and each R may be the same as or different from every other R.

A represents a single bond, or a sole group or a combination of two or more groups selected from the group consisting of an alkylene group, an ether group, a thioether group, a carbonyl group, an ester group, an amido group, a sulfonamido group, a urethane group and a urea group, and is preferably a single bond.

$Rp_1$ represents a group represented by any one of formulae (pI) to (pV).

The repeating unit represented by formula (pA) is more preferably a repeating unit composed of a 2-alkyl-2-adamantyl(meth)acrylate or a dialkyl(1-adamantyl)methyl(meth)acrylate.

Specific examples of the repeating unit represented by formula (pA) are set forth below, but the present invention is not limited thereto.

(In the formulae, Rx represents H, $CH_3$ or $CH_2OH$, and each of Rxa and Rxb independently represents an alkyl group having a carbon number of 1 to 4.)

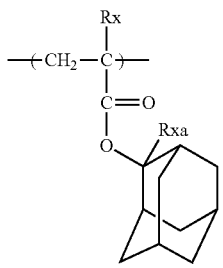
1

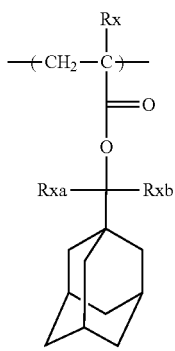
2

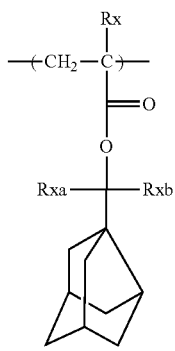
3

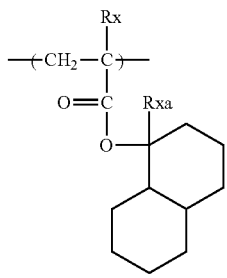
4

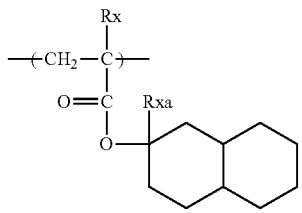
5

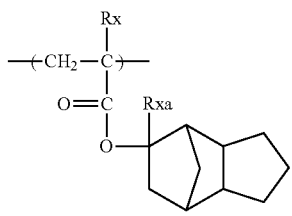
6

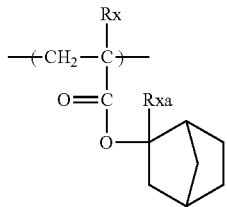
7

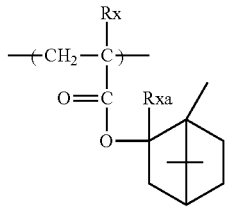
8

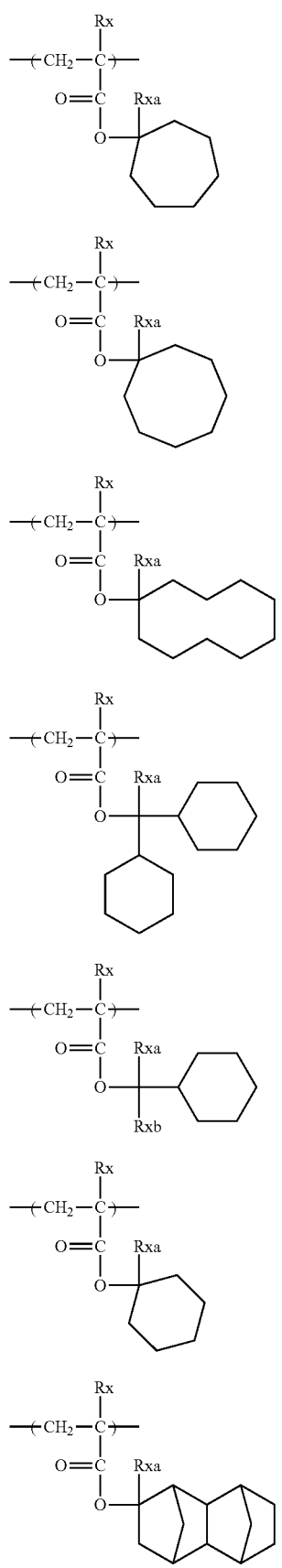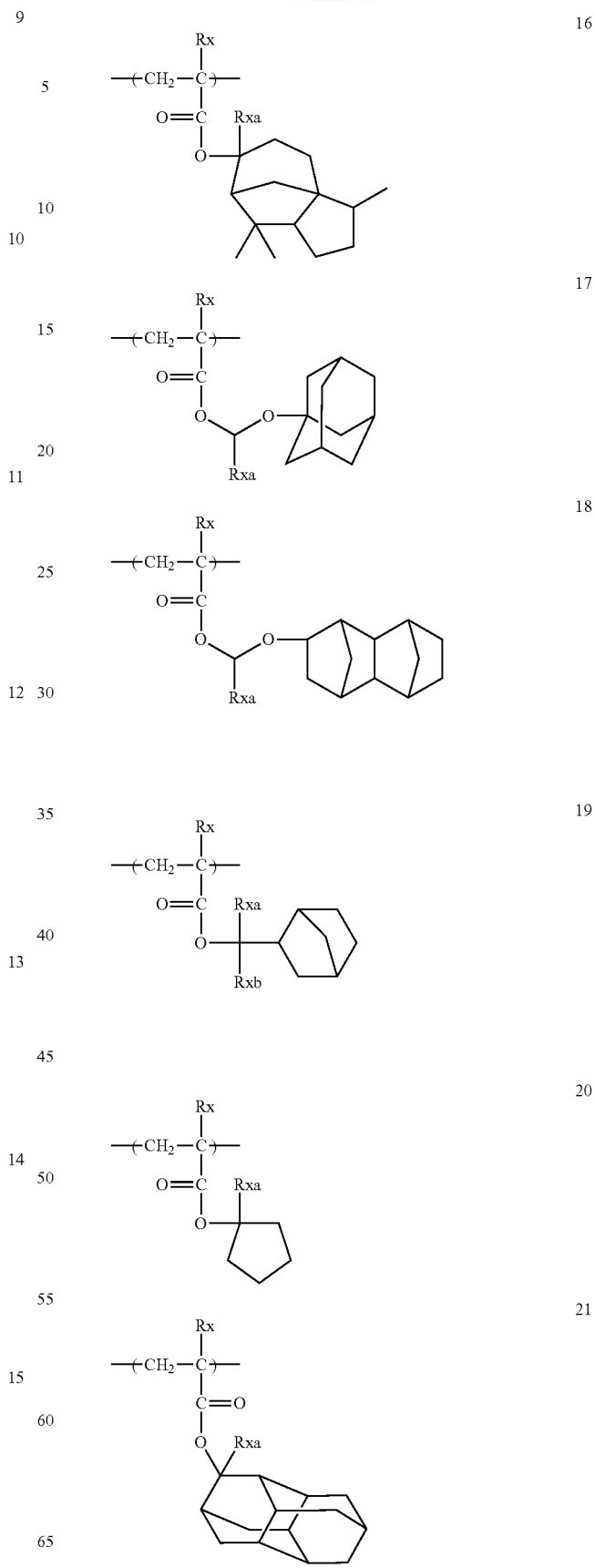

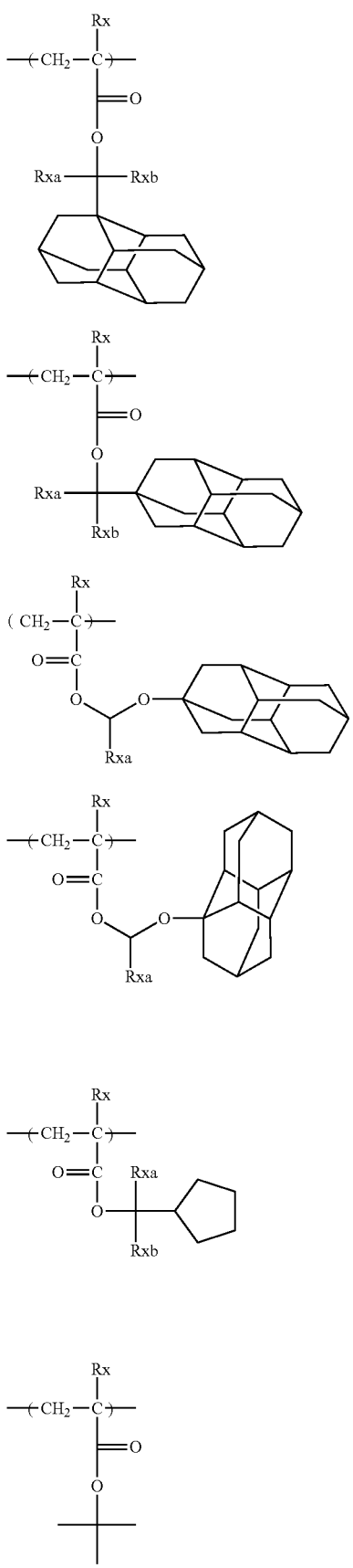

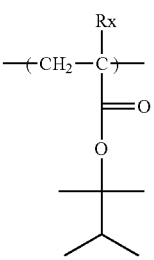

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ includes a linear or branched alkyl group having a carbon number of 1 to 10.

The atomic group of Z' for forming an alicyclic structure is an atomic group for forming, in the resin, a repeating unit composed of an alicyclic hydrocarbon which may have a substituent. Above all, an atomic group for forming a crosslinked alicyclic structure to form a crosslinked alicyclic hydrocarbon repeating unit is preferred.

Examples of the skeleton of the alicyclic hydrocarbon formed are the same as those of the alicyclic hydrocarbon group of $R_{12}$ to $R_{25}$ in formulae (pI) to (pV).

The skeleton of the alicyclic hydrocarbon may have a substituent, and examples of the substituent include $R_{13}'$ to $R_{16}'$ in formulae (II-AB1) and (II-AB2).

In the alicyclic hydrocarbon-based acid-decomposable resin for use in the present invention, the group capable of decomposing by the action of an acid is preferably contained in at least one repeating unit out of the repeating unit having an alicyclic hydrocarbon-containing partial structure represented by any one of formulae (pI) to (pV), the repeating unit represented by formula (II-AB), and the repeating unit composed of a copolymerization component described later. The group capable of decomposing by the action of an acid is preferably contained in the repeating unit having an alicylcic hydrocarbon-containing partial structure represented by any one of formulae (pI) to (pV).

Various substituents $R_{13}'$ to $R_{16}'$ in formulae (II-AB1) and (II-AB2) may work out to substituents of the atomic group for forming an alicyclic structure in formula (II-AB) or the atomic group Z for forming a crosslinked alicyclic structure.

Specific examples of the repeating units represented by formulae (II-AB1) and (II-AB2) are set forth below, but the present invention is not limited to these specific examples.

[II-1]

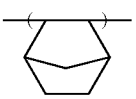

[II-2]

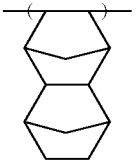

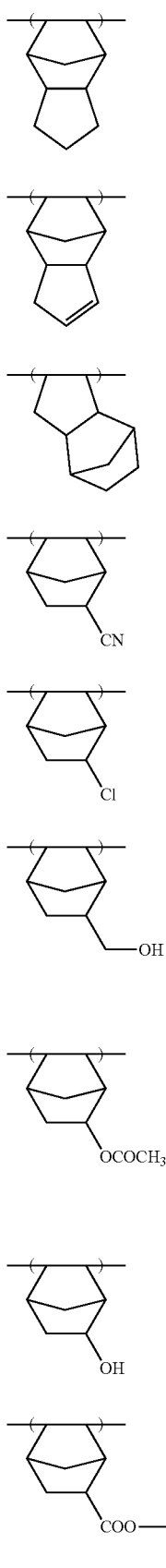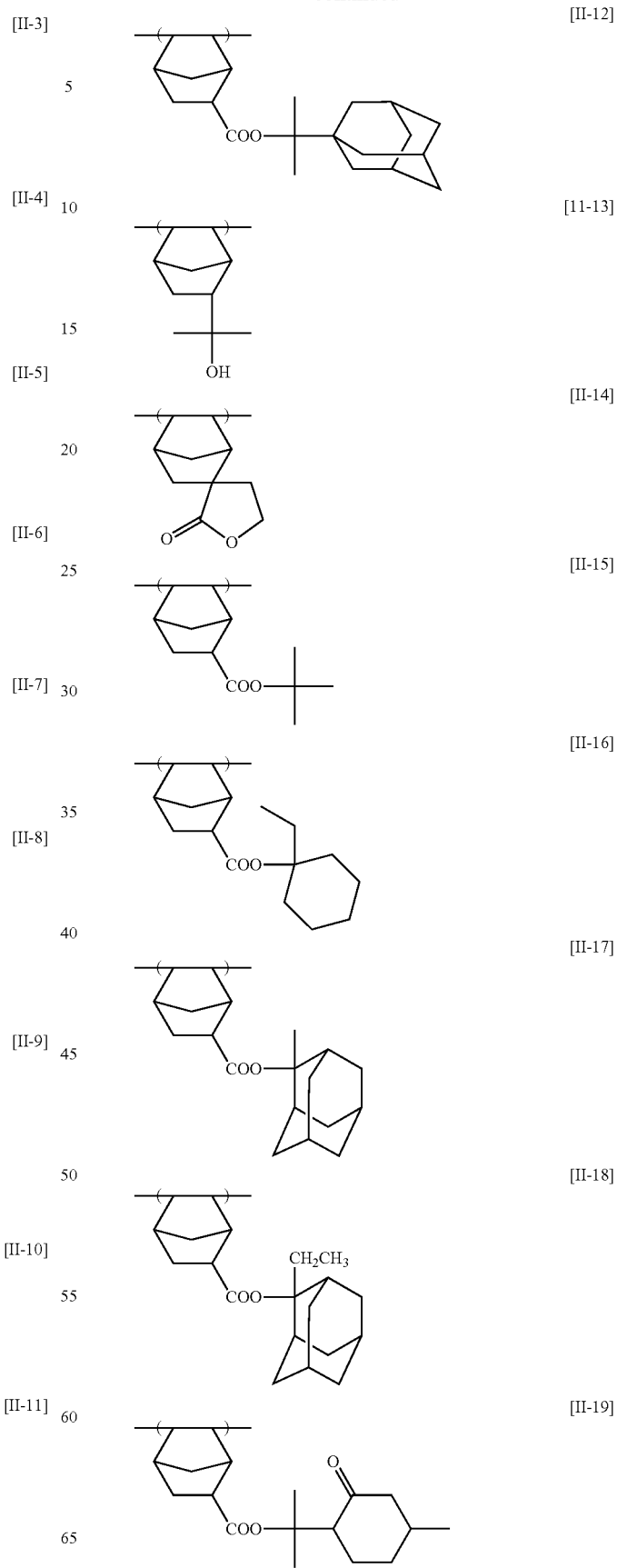

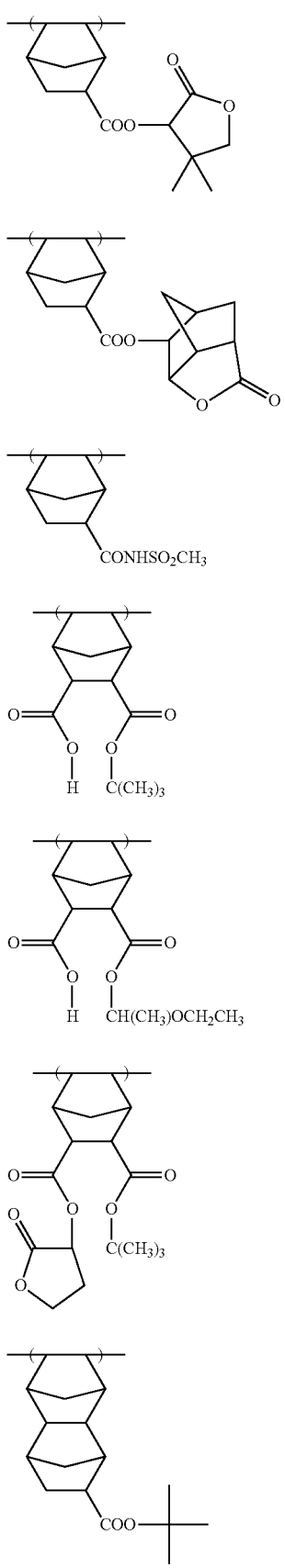
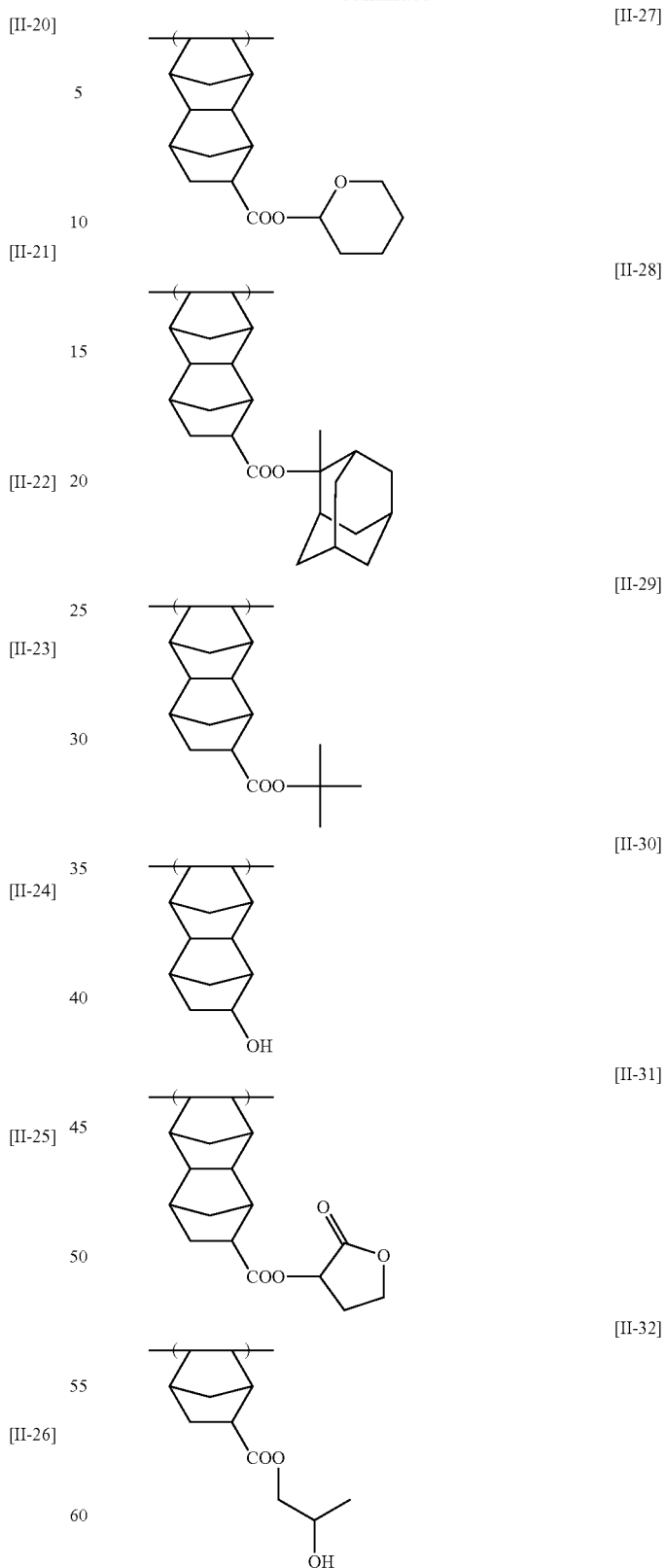
The acid-decomposable resin for use in the present invention preferably has a lactone group. As for the lactone group, any group may be used as long as it has a lactone structure, but a group having a 5- to 7-membered ring lactone structure is preferred. The 5- to 7-membered ring lactone structure is preferably condensed with another ring structure in the form of forming a bicyclo or spiro structure. The resin more preferably has a repeating unit containing a group having a lactone structure represented by any one of the following formulae (LC1-1) to (LC1-16). The group having a lactone structure may be bonded directly to the main chain. Among these lactone structures, preferred are groups represented by formulae (LC1-1), (LC1-4), (LC1-5), (LC1-6), (LC1-13) and (LC1-14). By virtue of using a specific lactone structure, the line edge roughness and development defect are improved.

LC1-1
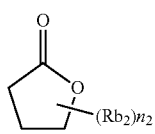

LC1-2
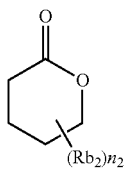

LC1-3
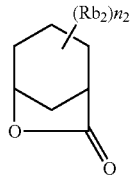

LC1-4
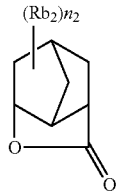

LC1-5
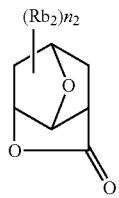

LC1-6
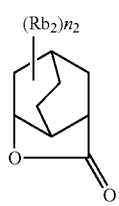

LC1-7
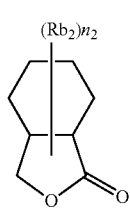

-continued

LC1-8
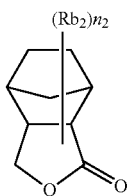

LC1-9
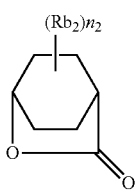

LC1-10
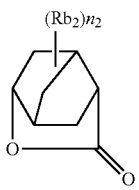

LC1-11
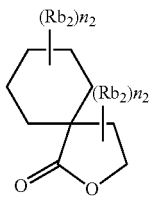

LC1-12
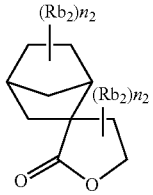

LC1-13
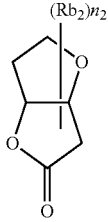

LC1-14
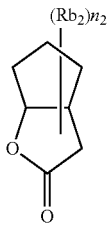

LC1-15

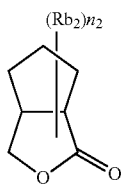

LC1-16

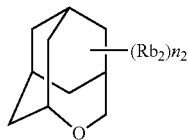

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, each $Rb_2$ may be the same as or different from every other $Rb_2$ and also, the plurality of substituents ($Rb_2$) may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

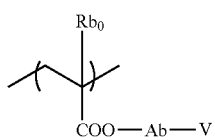

(AI)

In formula (AI), $Rb_0$ represents a hydrogen atom, a halogen atom or an alkyl group having a carbon number of 1 to 4.

Preferred examples of the substituent which the alkyl group of $Rb_0$ may have include a hydroxyl group and a halogen atom.

The halogen atom of $Rb_0$ includes a fluorine atom, a chlorine atom, a bromine atom and an iodine atom.

$Rb_0$ is preferably a hydrogen atom or a methyl group.

Ab represents a single bond, an alkylene group, a divalent linking group having a monocyclic or polycyclic alicyclic hydrocarbon structure, an ether group, an ester group, a carbonyl group, or a divalent group formed by combining these groups and is preferably a single bond or a linking group represented by -$Ab_1$-$CO_2$—. $Ab_1$ represents a linear or branched alkylene group or a monocyclic or polycyclic cycloalkylene group and is preferably a methylene group, an ethylene group, a cyclohexylene group, an adamantylene group or a norbornylene group.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit having a lactone structure are set forth below, but the present invention is not limited thereto.

(In the formulae, Rx is H, $CH_3$, $CH_2OH$ or $CF_3$.)

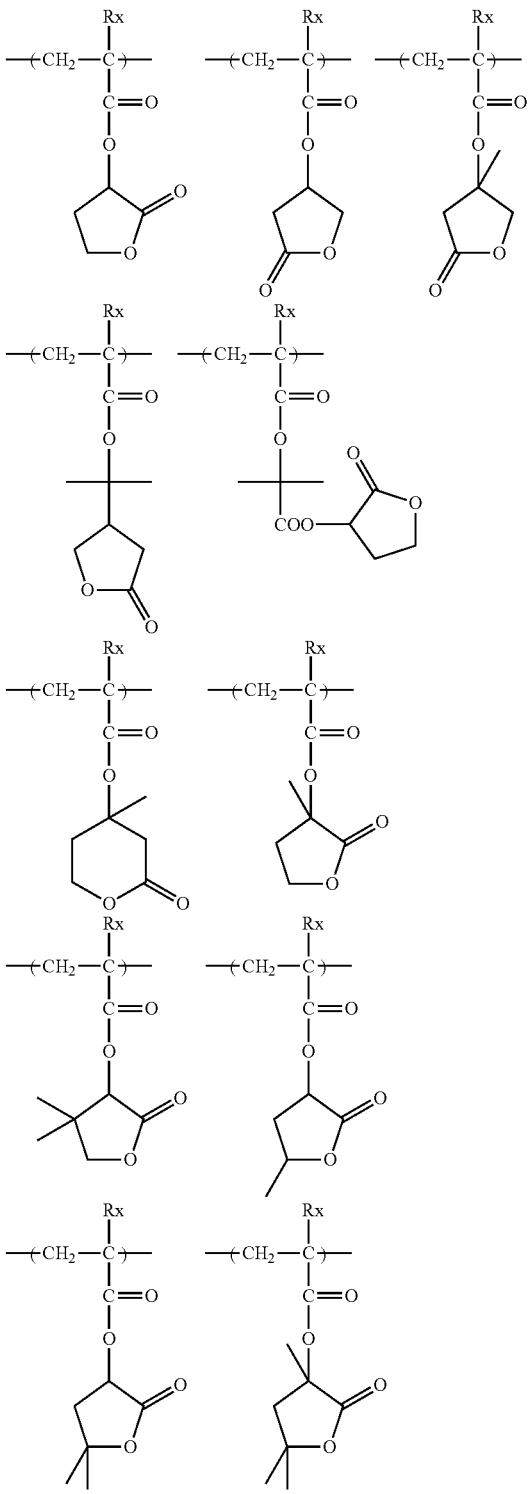

-continued
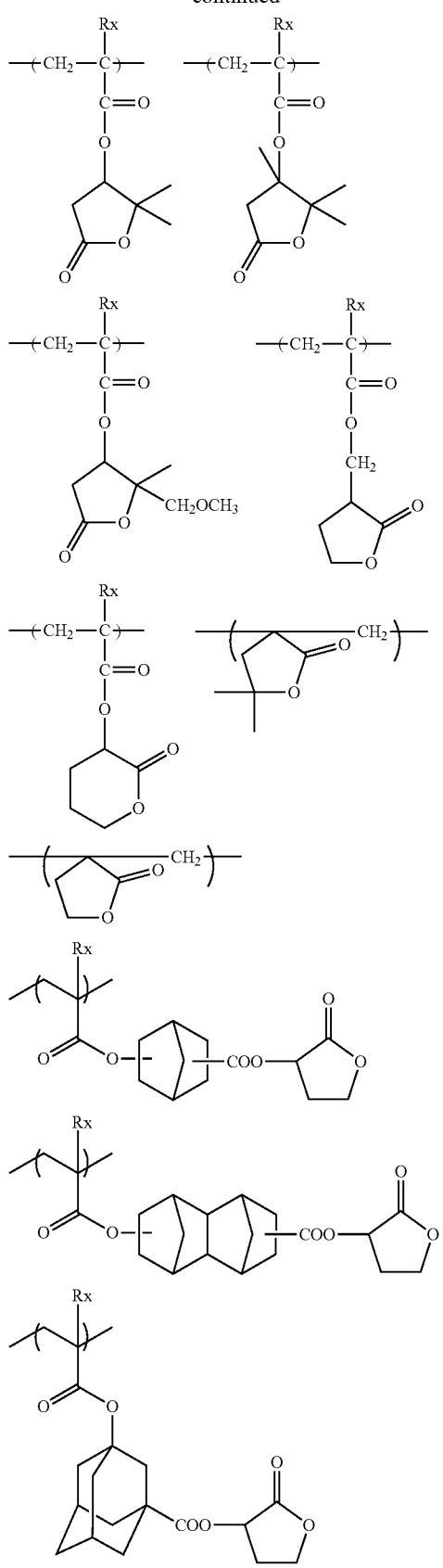
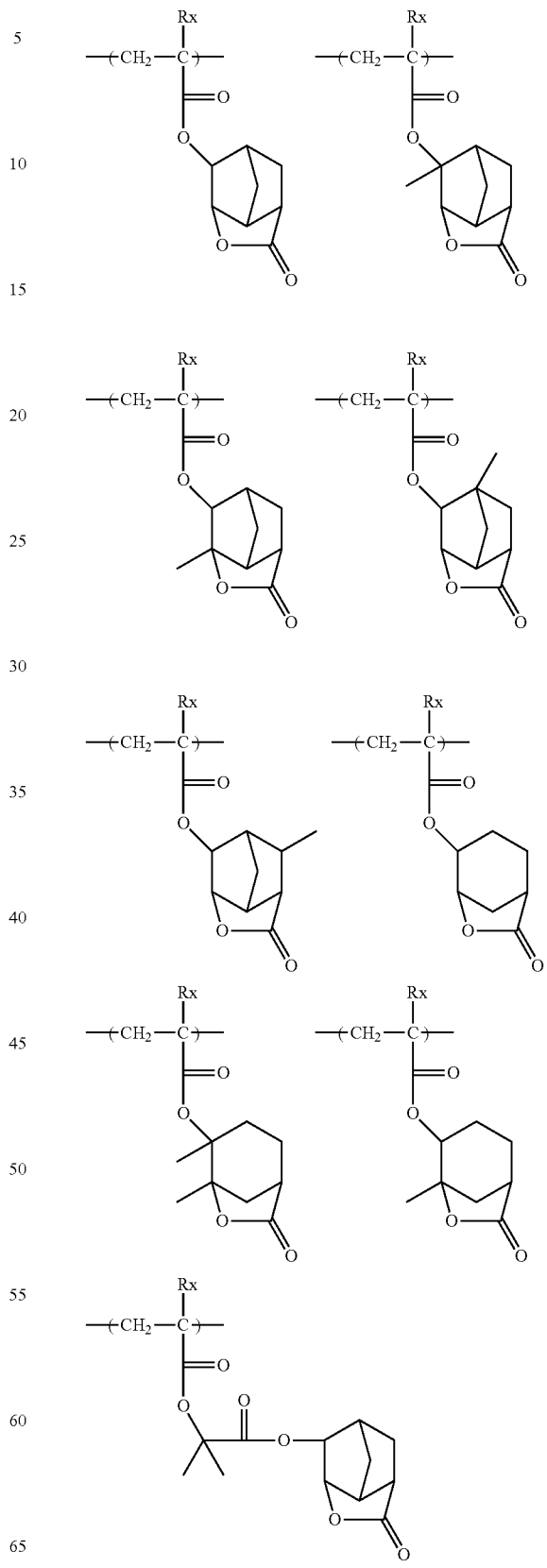
(In the formulae, Rx is H, CH₃, CH₂OH or CF₃.)

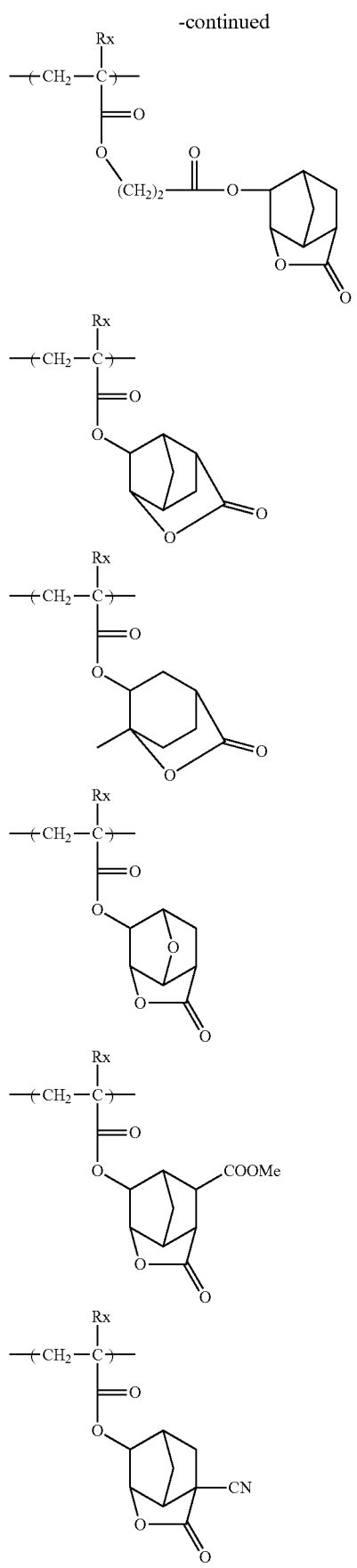
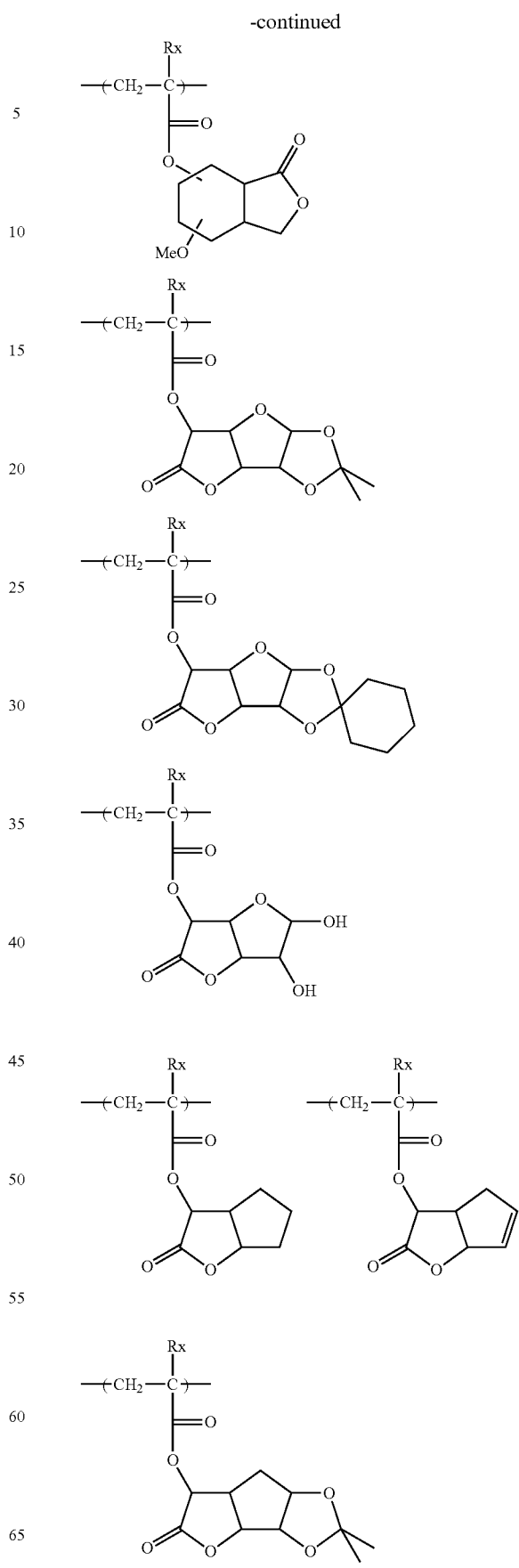

-continued

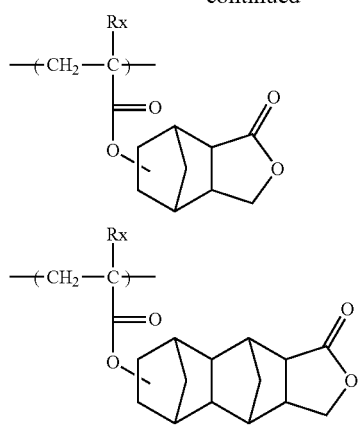

(In the formulae, Rx is H, CH$_3$, CH$_2$OH or CF$_3$.)

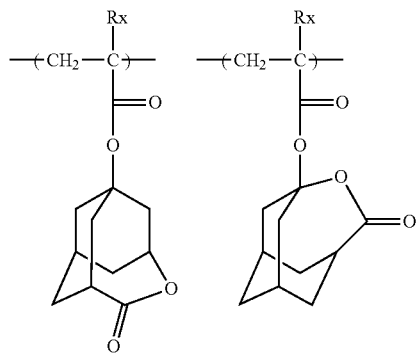

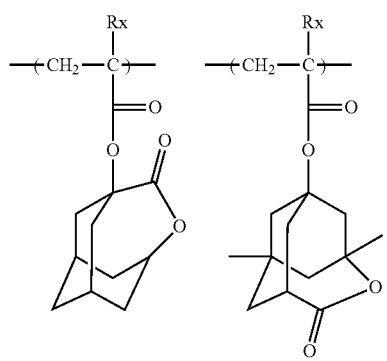

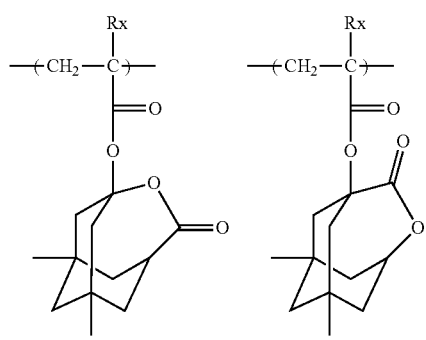

-continued

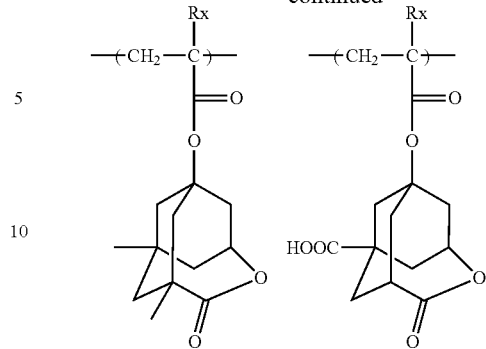

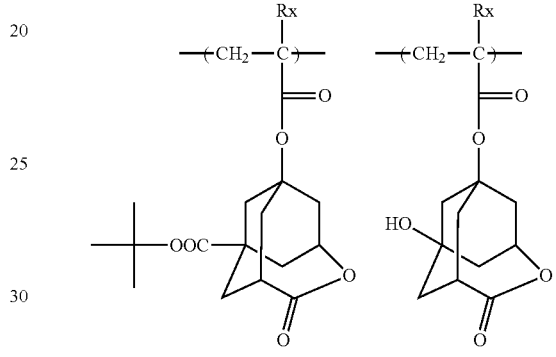

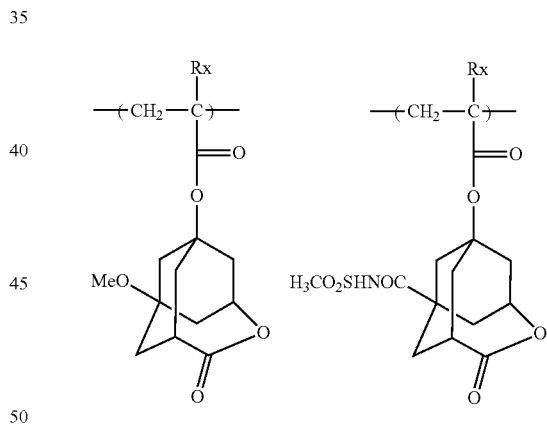

The acid-decomposable resin for use in the present invention may have a repeating unit containing an organic group having a polar group except for the hydroxyl group-containing alicyclic hydrocarbon group in the repeating unit represented by formula (NGH1), particularly a repeating unit having an alicyclic hydrocarbon structure substituted by a polar group. Thanks to this repeating unit, the adherence to substrate is more enhanced. The alicyclic hydrocarbon structure of the polar group-substituted alicyclic hydrocarbon structure is preferably an adamantyl group, a diamantyl group or a norbornane group. The polar group is preferably a carboxyl group or a cyano group.

The polar group-substituted alicyclic hydrocarbon structure is preferably a partial structure represented by the following formulae (VIIa) to (VIId):

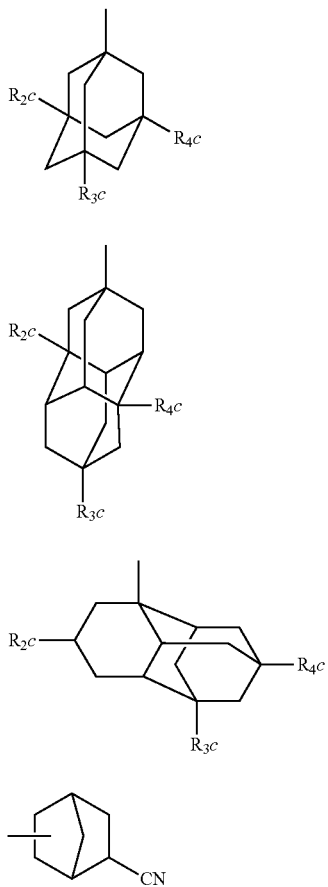

(VIIa)

(VIIb)

(VIIc)

(VIId)

In formulae (VIIa) to (VIIc), each of $R_{2c}$ to $R_{4c}$ independently represents a hydrogen atom, a carboxyl group or a cyano group, provided that at least one of $R_{2c}$ to $R_{4c}$ represents a carboxyl group or a cyano group. One or two members out of $R_{2c}$ to $R_{4c}$ are preferably a cyano group, with the remaining being a hydrogen atom.

In formula (VIIa), it is more preferred that two members out of $R_{2c}$ to $R_{4c}$ are a hydroxyl group and the remaining is a hydrogen atom.

Examples of the repeating unit having a group represented by any one of formulae (VIIa) to (VIId) include a repeating unit where at least one of $R_{13}'$ to $R_{16}$ in formula (II-AB 1) or (II-AB2) has a group represented by any one of formulae (VIIa) to (VIId) (for example, $R_5$ of —COOR$_5$ is a group represented by any one of formulae (VIIa) to (VIId)), and repeating units represented by the following formulae (AIIa) to (AIId):

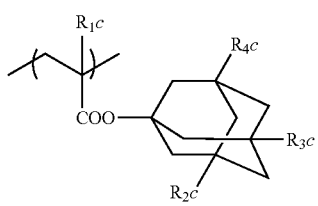

(AIIa)

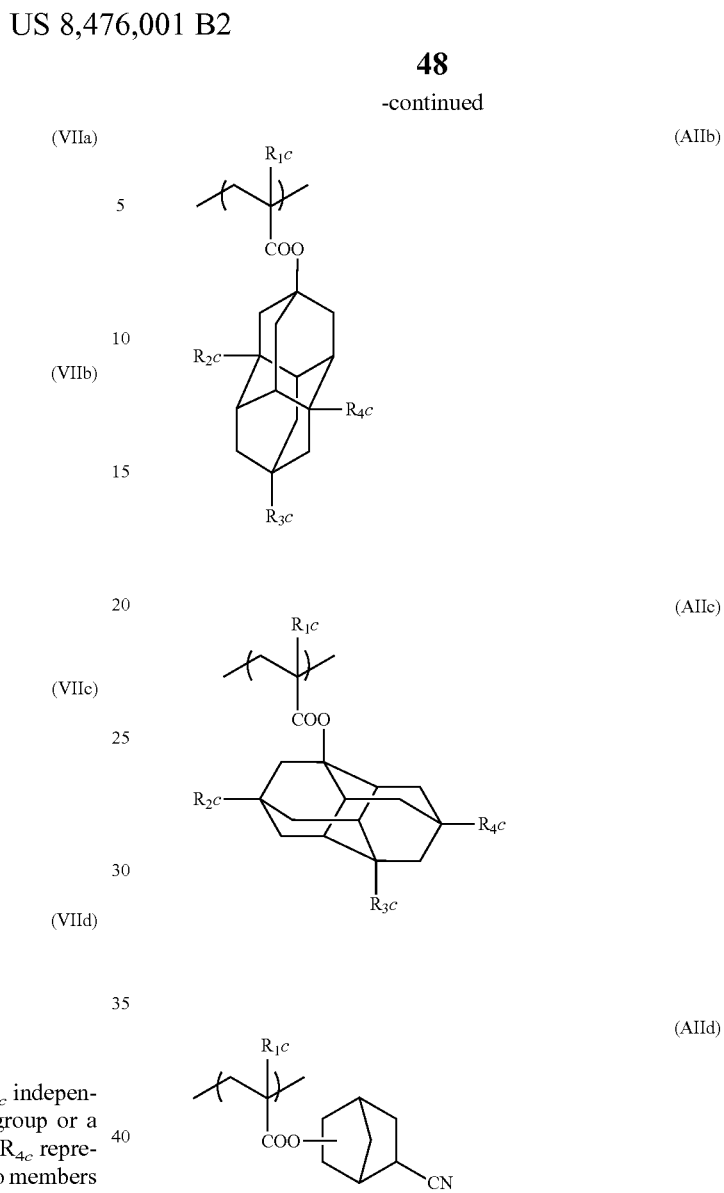

(AIIb)

(AIIc)

(AIId)

In formulae (AIIa) to (AIId), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formulae (VIIa) to (VIIc).

Specific examples of the repeating unit having a structure represented by any one of formulae (AIIa) to (AIId) are set forth below, but the present invention is not limited thereto.

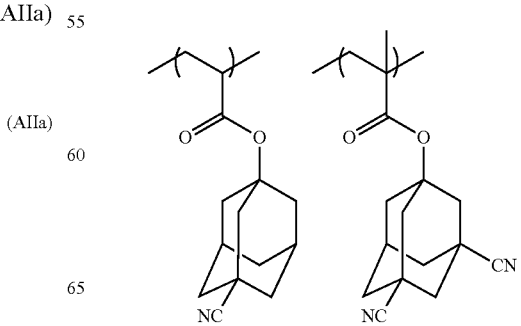

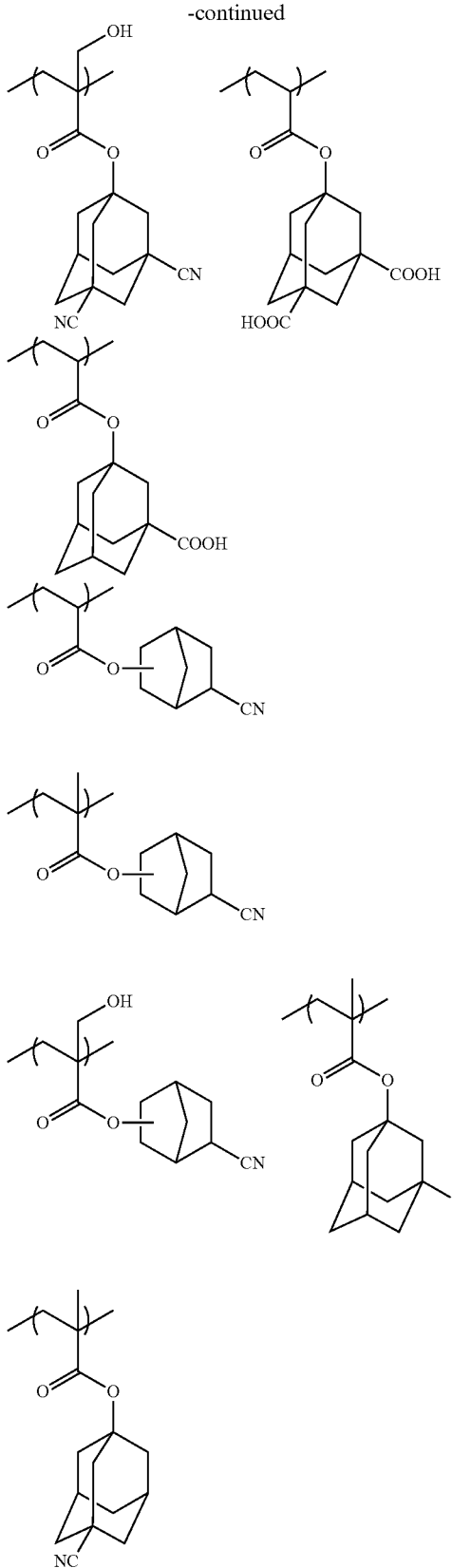

The acid-decomposable resin for use in the present invention may contain a repeating unit represented by the following formula (VIII):

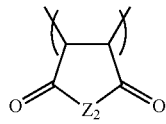

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

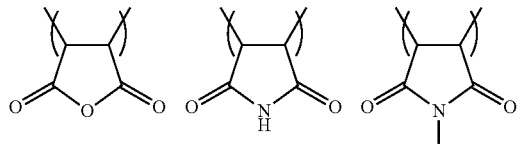

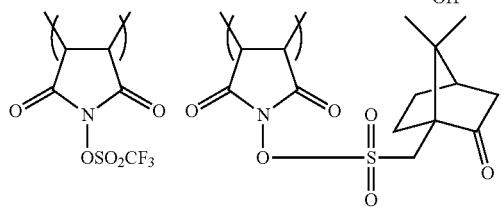

The acid-decomposable resin for use in the present invention may further contain a repeating unit having an alicyclic hydrocarbon structure and not exhibiting acid decomposability. Thanks to this repeating unit, the dissolving out of low molecular components from the resist film to the immersion liquid at the immersion exposure can be reduced. Examples of this repeating unit include 1-adamantyl(meth)acrylate, tricyclodecanyl(meth)acrylate and cyclohexyl(meth)acrylate.

The acid-decomposable resin for use in the present invention may contain, in addition to the above-described repeating units, various repeating structural units for the purpose of controlling dry etching resistance, suitability for standard developer, adherence to substrate, resist profile and properties generally required of the resist, such as resolution, heat resistance and sensitivity.

Examples of such a repeating structural unit include, but are not limited to, repeating structural units corresponding to the monomers described below.

Thanks to such a repeating structural unit, the performance required of the acid-decomposable resin, particularly, (1) solubility in coating solvent,
(2) film-forming property (glass transition point),
(3) solubility in positive or negative tone tone developer,
(4) film loss (selection of hydrophilic, hydrophobic or alkali-soluble group),
(5) adherence of unexposed area to substrate,
(6) dry etching resistance, and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomers corresponding to the above-described various repeating structural units may be copolymerized.

In the acid-decomposable resin, the molar ratio of respective repeating structural units contained is appropriately determined to control the dry etching resistance of resist, suitability for standard developer, adherence to substrate, resist profile and performances generally required of the resist, such as resolution, heat resistance and sensitivity.

A preferred embodiment of the acid-decomposable resin for use in the present invention is a resin containing a repeating unit having an acid-decomposable group and a repeating unit having a polar group.

The repeating unit having an acid-decomposable group includes the followings:

(1) a resin containing a repeating unit having an alicyclic hydrocarbon-containing partial structure represented by any one of formulae (pI) to (pV) (side chain type), preferably a resin containing a (meth)acrylate repeating unit having a structure represented by any one of formulae (pI) to (pV), and (2) a resin containing a repeating unit represented by formula (II-AB) (main chain type).

The resin of (2) further includes, for example, the following:

(3) a resin having a repeating unit represented by formula (II-AB), a maleic anhydride derivative and a (meth)acrylate structure (hybrid type).

In the acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the acid-decomposable resin, the content of the repeating unit having an alicyclic hydrocarbon-containing partial structure represented by any one of formulae (pI) to (pV) is preferably from 20 to 70 mol %, more preferably from 20 to 50 mol %, still more preferably from 25 to 40 mol %, based on all repeating structural units.

In the acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The repeating unit having a polar group includes the followings:

(1) a repeating unit represented by formula (F1'),
(2) a repeating unit represented by formula (NGH1), and
(3) a repeating unit represented by formula (NGH2).

In the acid-decomposable resin, the repeating unit having a polar group may use each of the above-described components alone or may use a combination thereof. The content of the repeating unit having a polar group in the resin is preferably from 5 to 60 mol %, more preferably from 5 to 40 mol %, still more preferably from 10 to 30 mol %, based on all repeating structural units.

In the acid-decomposable resin, the content of the repeating unit represented by formula (F1') is preferably from 0 to 60 mol %, more preferably from 0 to 40 mol %, still more preferably from 5 to 30 mol %, based on all repeating structural units.

In the acid-decomposable resin, the content of the repeating unit represented by formula (NGH1) is preferably from 0 to 60 mol %, more preferably from 5 to 40 mol %, still more preferably from 5 to 30 mol %, based on all repeating structural units.

In the acid-decomposable resin, the content of the repeating unit represented by formula (NGH2) is preferably from 0 to 60 mol %, more preferably from 0 to 40 mol %, still more preferably from 5 to 20 mol %, based on all repeating structural units.

In the acid-decomposable resin, the content of the repeating unit having a lactone ring is preferably from 10 to 70 mol %, more preferably from 20 to 60 mol %, still more preferably from 25 to 40 mol %, based on all repeating structural units.

The content of the repeating structural unit based on the monomer as the further copolymerization component in the resin can also be appropriately selected according to the desired resist performance but in general, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

In the case of using the resist composition of the present invention for ArF exposure, the resin preferably has no aromatic group in view of transparency to ArF light.

The acid-decomposable resin for use in the present invention is preferably a resin where all repeating units are composed of a (meth)acrylate-based repeating unit. In this case, the repeating units may be all a methacrylate-based repeating unit, all an acrylate-based repeating unit, or all a mixture of methacrylate-based repeating unit/acrylate-based repeating unit, but the acrylate-based repeating unit preferably accounts for 50 mol % or less of all repeating units.

The acid-decomposable resin is preferably a copolymer containing at least a hydroxyl group-containing (meth)acrylate-based repeating unit selected from any one or more members of the repeating unit represented by formula (F1'), the repeating unit represented by formula (NGH1) and the repeating unit represented by formula (NGH2), a (meth)acrylate-based repeating unit having a lactone ring, and a (meth)acrylate-based repeating unit having an acid-decomposable group.

The copolymer is preferably a ternary copolymerization polymer containing from 5 to 40 mol % of the repeating unit represented by formula (NGH1) or (F1'), from 20 to 50 mol % of the repeating unit having a lactone structure, and from 20 to 50 mol % of the repeating unit having an alicyclic hydrocarbon-containing partial structure represented by any one of formulae (pI) to (pV), or a quaternary polymerization polymer containing from 5 to 40 mol % in total of two repeating units, that is, the repeating unit represented by formula (NGH1) and the repeating unit represented by formula (F1'), from 20 to 50 mol % of the repeating unit having a lactone structure, and from 20 to 50 mol % of the repeating unit having an alicyclic hydrocarbon-containing partial structure represented by any one of formulae (pI) to (pV). Also, in view of adjusting the crosslinking reactivity with the crosslinked layer-forming material and more enhancing the adherence, it is preferred to further contain from 5 to 20 mol % of the repeating unit represented by formula (NGH2) in the copolymerization polymer. Furthermore, from the standpoint of enhancing the affinity for developer, it is also preferred to contain from 5 to 20 mol % of the repeating unit not exhibiting acid decomposability in the copolymerization polymer.

As for the repeating unit, a resin containing an acid-decomposable group-containing repeating unit represented by any one of the following formulae (ARA-1) to (ARA-7), a lactone group-containing repeating unit represented by any one of the following formulae (ARL-1) to (ARL-8), a repeating unit having a hydroxyl group-substituted alicyclic hydrocarbon structure represented by any one of the following formulae (ARH-1) to (ARH-4), and a hydroxyl group-containing repeating unit represented by (ARH-5) or (ARH-6) is preferably used.

(In the formulae, $Rxy_1$ represents a hydrogen atom or a methyl group, each of $Rxa_1$ and $Rxb_1$ represents a methyl group or an ethyl group, and $Rxc_1$ represents a hydrogen atom or a methyl group).

(ARA-1)
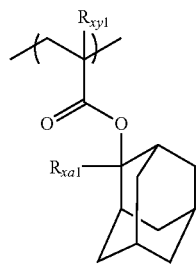

(ARA-2)
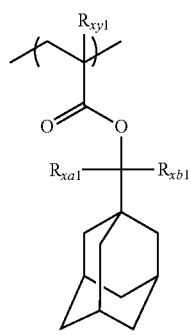

(ARA-3)
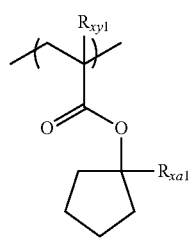

(ARA-4)
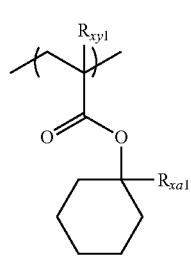

(ARA-5)
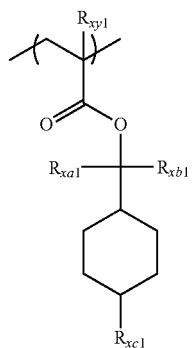

(ARA-6)
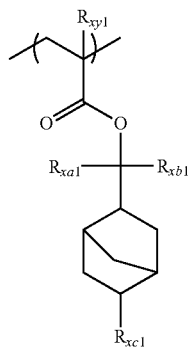

(ARA-7)
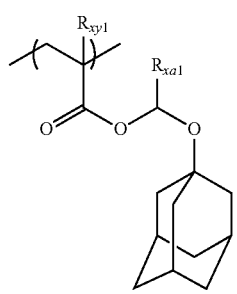

ARL-1
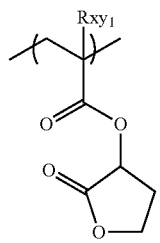

ARL-2
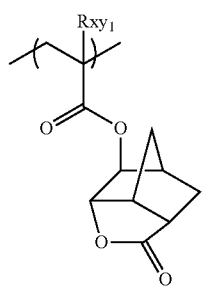

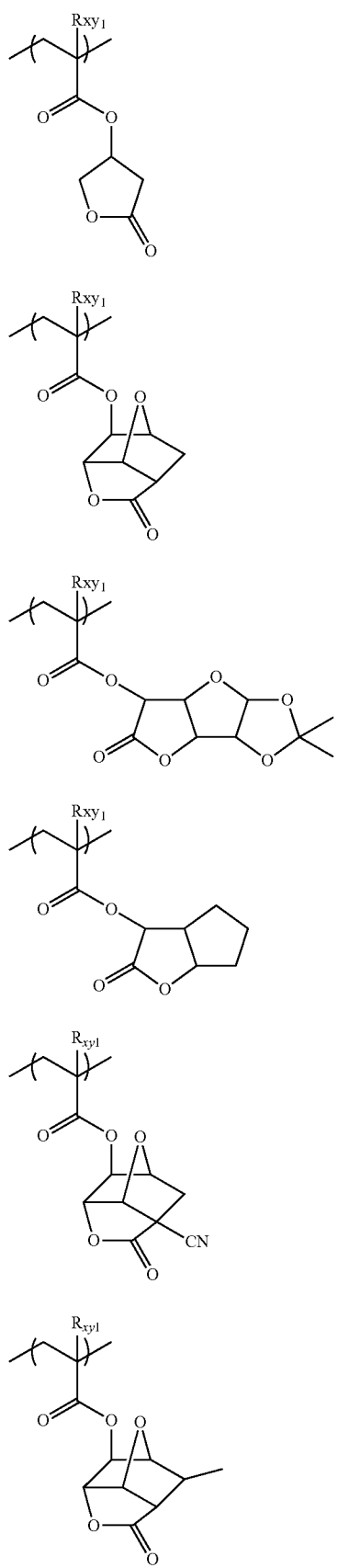
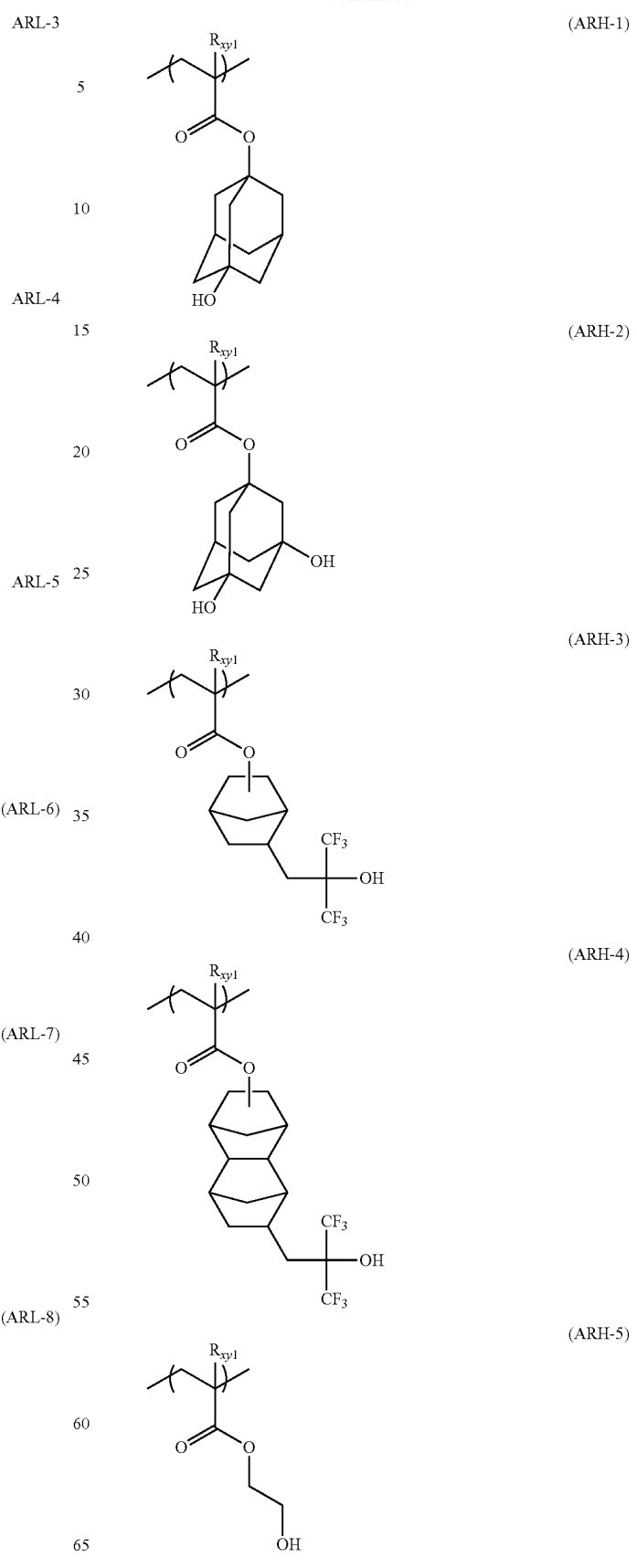

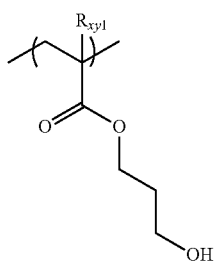
(ARH-6)

In the case of using the acid-decomposable resin (A) for a positive tone resist composition that is irradiated with KrF excimer laser light, electron beam, X-ray or high-energy beam at a wavelength of 50 nm or less (e.g., EUV), the acid-decomposable resin preferably contains a hydroxystyrene-based repeating unit such as repeating unit by hydroxystyrene. The resin is more preferably a resin containing a hydroxystyrene-based repeating unit and an acid-decomposable group-containing repeating unit (hereinafter sometimes referred to as a "hydroxystyrene-based acid-decomposable resin"). The acid-decomposable group-containing repeating unit is preferably a hydroxystyrene-based repeating unit protected by an acid-leaving group, or an acid-decomposable tertiary alkyl(meth)acrylate-based repeating unit.

The hydroxystyrene-based repeating unit protected by an acid-leaving group is preferably a repeating unit by 1-alkoxyethoxystyrene, tert-butylcarbonyloxystyrene or the like. The alkyl group in the acid-decomposable tertiary alkyl(meth)acrylate-based repeating unit includes a chain alkyl group or a monocyclic or polycyclic alkyl group. Preferred examples of the acid-decomposable tertiary alkyl(meth)acrylate-based repeating unit include a repeating unit by tert-butyl(meth)acrylate, 2-alkyl-2-adamantyl(meth)acrylate, 2-(1-adamantyl)-2-propyl(meth)acrylate, 1-alkyl-1-cyclohexyl(meth)acrylate or 1-alkyl-1-cyclopentyl(meth)acrylate.

Specific examples of the hydroxystyrene-based acid-decomposable resin are set forth below, but the present invention is not limited thereto.

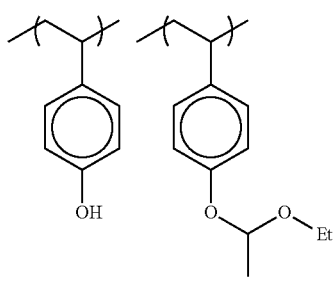
(R-1)

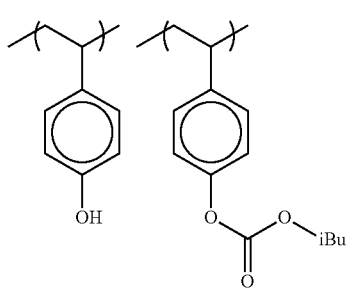
(R-2)

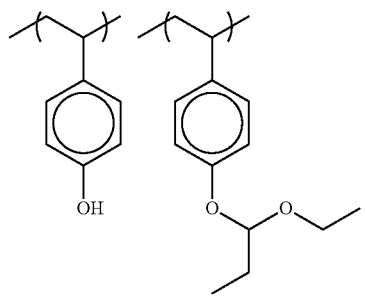
(R-3)

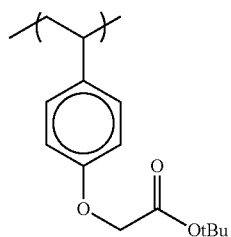

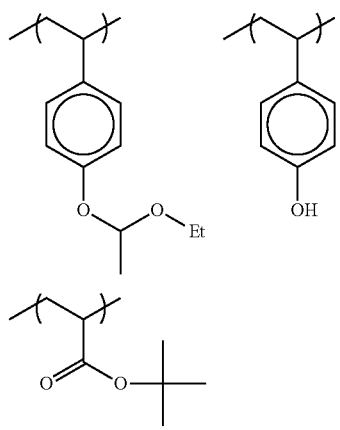
(R-4)

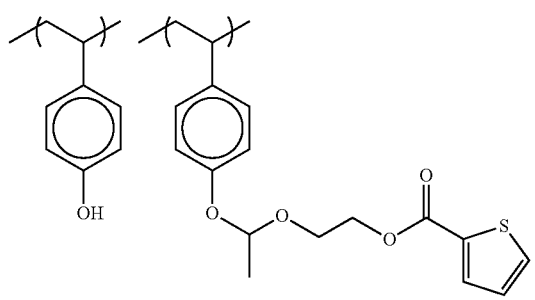
(R-5)

(R-6)

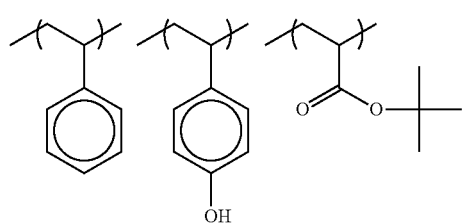
(R-7)
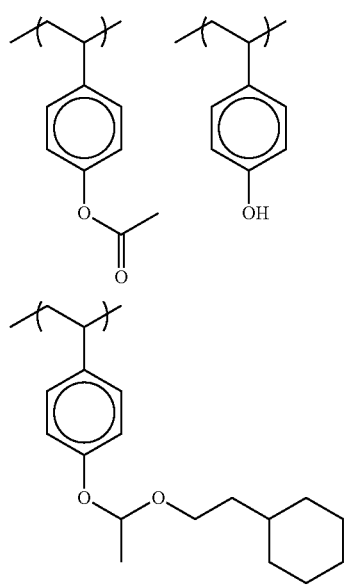
(R-8)
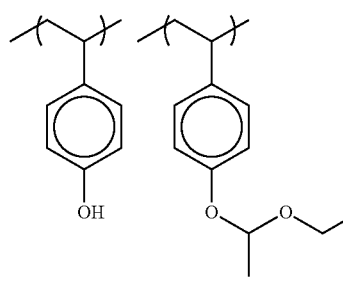
(R-9)
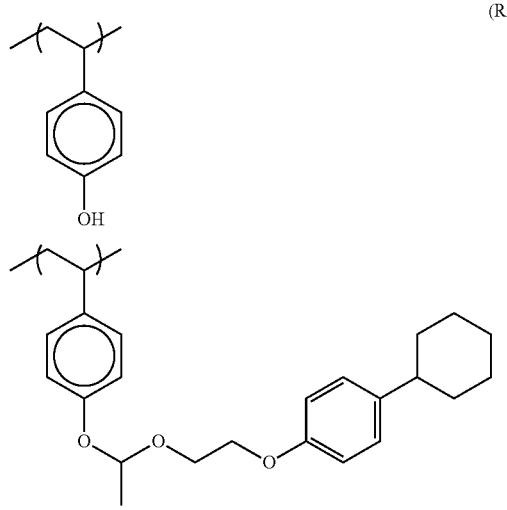
(R-10)
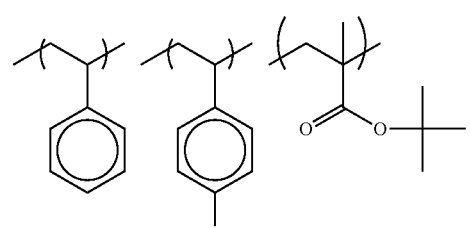
(R-11)
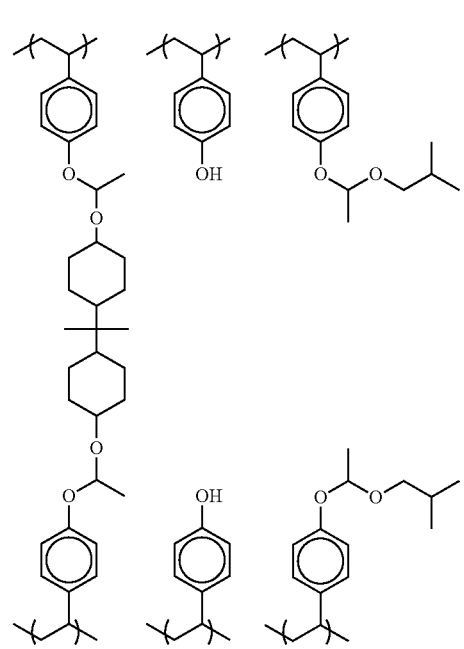
(R-12)
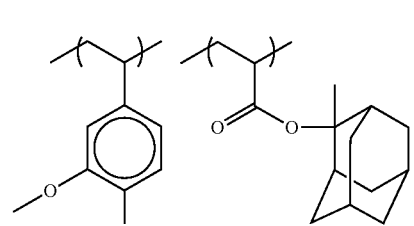
(R-13)
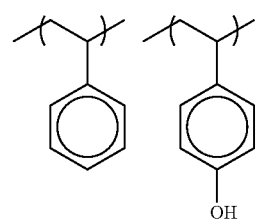
(R-14)
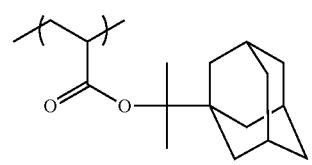

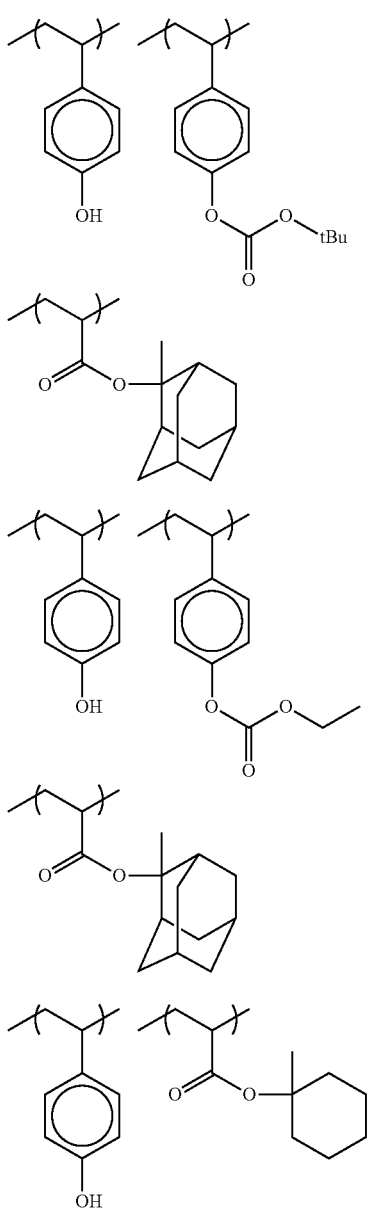

In specific examples above, tBu indicates a tert-butyl group.

The content of the acid-decomposable group is expressed by B/(B+S) using the number (B) of acid-decomposable groups in the hydroxystyrene-based acid-decomposable resin and the number (S) of alkali-soluble groups not protected by a group that leaves by the action of an acid. The content is preferably from 0.01 to 0.7, more preferably from 0.05 to 0.50, still more preferably from 0.05 to 0.40.

The acid-decomposable resin for use in the present invention may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include ethers such as tetrahydrofuran, 1,4-dioxane, diisopropyl ether, ketones such as methyl ethyl ketone and methyl isobutyl ketone, an ester solvent such as ethyl acetate, an amide solvent such as dimethylformamide and dimethylacetamide, and a solvent capable of dissolving the composition of the present invention, which is described later, such as propylene glycol monomethyl ether acetate, propylene glycol monomethyl ether and cyclohexanone. The polymerization is more preferably performed using the same solvent as the solvent used in the resist composition of the present invention. By the use of the same solvent, production of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). The initiator is added additionally or in parts, if desired. After the completion of reaction, the reaction product is charged into a solvent, and the desired polymer is recovered by a powder or solid recovery method or the like. The reaction concentration is from 5 to 50 mass %, preferably from 10 to 30 mass %, and the reaction temperature is usually from 10 to 150° C., preferably from 30 to 120° C., more preferably from 60 to 100° C.

The purification may be performed by the same method as that for the resin (D) described later, and a normal method, for example, a liquid-liquid extraction method of combining water washing with an appropriate solvent to remove residual monomers or oligomer components, a purification method in a solution sate, such as ultrafiltration of extracting and removing only polymers having a molecular weight lower than a specific molecular weight, a reprecipitation method of adding dropwise the resin solution in a poor solvent to solidify the resin in the poor solvent and thereby remove residual monomers and the like, or a purification method in a solid state, such as washing of the resin slurry with a poor solvent after separation by filtration, may be employed.

The weight average molecular weight of the resin for use in the present invention is preferably from 1,000 to 200,000, more preferably from 1,000 to 20,000, and most preferably from 1,000 to 15,000, in terms of polystyrene by the GPC method. When the weight average molecular weight is from 1,000 to 200,000, the heat resistance, dry etching resistance and developability can be prevented from deterioration and also, the film-forming property can be prevented from deteriorating due to high viscosity.

The polydispersity (molecular weight distribution) is usually from 1 to 5, preferably from 1 to 3, more preferably from 1.2 to 3.0, still more preferably from 1.2 to 2.0. As the polydispersity is smaller, the resolution and resist profile are more excellent, the side wall of the resist pattern is smoother, and the property in terms of roughness is more improved.

In the resist composition of the present invention, the amount of all resins for use in the present invention blended in the entire composition is preferably from 50 to 99.9 mass %, more preferably from 60 to 99.0 mass %, based on the entire solid content.

In the present invention, one kind of a resin may be used or a plurality of kinds of resins may be used in combination.

(B) Compound Capable of Generating an Acid Upon Irradiation with an Actinic Ray or Radiation The resist composition of the present invention contains a compound capable of generating an acid upon irradiation with an actinic ray or radiation (sometimes referred to as a "photo-acid generator" or "component (B)").

The photo-acid generator which can be used may be appropriately selected from a photo-initiator for cationic photopolymerization, a photo-initiator for radical photopolymerization, a photodecoloring agent for dyes, a photodiscoloring agent, a known compound used for microresist or the like and capable of generating an acid upon irradiation with an actinic ray or radiation, and a mixture thereof.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate.

Also, a compound where such a group or compound capable of generating an acid upon irradiation with an actinic ray or radiation is introduced into the main or side chain of the polymer, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029, may be used.

Furthermore, compounds capable of generating an acid by the effect of light described, for example, in U.S. Pat. No. 3,779,778 and European Patent 126,712 may also be used.

Out of the compounds capable of decomposing upon irradiation with an actinic ray or radiation to generate an acid, preferred are the compounds represented by the following formulae (ZI), (ZII) and (ZIII):

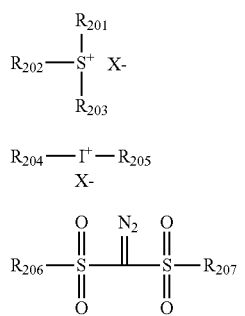

In formula (ZI), each of $R_{201}$, $R_{202}$ and $R_{203}$ independently represents an organic group.

$X^-$ represents a non-nucleophilic anion, and preferred examples thereof include sulfonate anion, carboxylate anion, bis(alkylsulfonyl)amide anion, tris(alkylsulfonyl)methide anion, $BF_4^-$, $PF_6^-$ and $SbF_6^-$. The anion is preferably an organic anion containing a carbon atom.

The preferred organic anion includes organic anions represented by the following formulae:

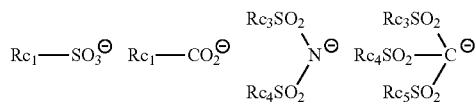

In the formulae, $Rc_1$ represents an organic group.

The organic group of $Rc_1$ includes an organic group having a carbon number of 1 to 30, and preferred examples thereof include an alkyl group which may be substituted, an aryl group, and a group where a plurality of these groups are connected through a single bond or a linking group such as —O—, —CO$_2$—, —S—, —SO$_3$— and —SO$_2$N(Rd$_1$)—.

$Rd_1$ represents a hydrogen atom or an alkyl group.

Each of $Rc_3$, $Rc_4$ and $Rc_5$ independently represents an organic group. Preferred organic groups of $Rc_3$, $Rc_4$ and $Rc_5$ are the same as preferred organic groups in $Rc_1$. The organic group is most preferably a perfluoroalkyl group having a carbon number of 1 to 4.

$Rc_3$ and $Rc_4$ may combine to form a ring. The group formed by combining $Rc_3$ and $Rc_4$ includes an alkylene group and an arylene group, and a perfluoroalkylene group having a carbon number of 2 to 4 is preferred.

The organic group of $Rc_1$ and $Rc_3$ to $Rc_5$ is particularly preferably an alkyl group with the 1-position being substituted by a fluorine atom or a fluoroalkyl group, or a phenyl group substituted by a fluorine atom or a fluoroalkyl group. By virtue of having a fluorine atom or a fluoroalkyl group, the acidity of the acid generated upon irradiation with light is raised and the sensitivity is enhanced. Also, when $Rc_3$ and $Rc_4$ are combined to form a ring, the acidity of the acid generated upon irradiation with light is raised and the sensitivity is enhanced.

The carbon number of the organic group as $R_{201}$, $R_{202}$ and $R_{203}$ is generally from 1 to 30, preferably from 1 to 20.

Two members out of $R_{201}$ to $R_{203}$ may combine to form a ring structure, and the ring may contain an oxygen atom, a sulfur atom, an ester bond, an amide bond or a carbonyl group. Examples of the group formed by combining two members out of $R_{201}$ to $R_{203}$ include an alkylene group (e.g., butylene, pentylene).

Specific examples of the organic group as $R_{201}$, $R_{202}$ and $R_{203}$ include corresponding groups in the compounds (ZI-1), (ZI-2) and (ZI-3) which are described later.

The compound may be a compound having a plurality of structures represented by formula (ZI). For example, the compound may be a compound having a structure where at least one of $R_{201}$ to $R_{203}$ in the compound represented by formula (ZI) is bonded to at least one of $R_{201}$ to $R_{203}$ in another compound represented by formula (ZI).

The component (ZI) is more preferably a compound (ZI-1), (ZI-2) or (ZI-3) described below.

The compound (ZI-1) is an arylsulfonium compound where at least one of $R_{201}$ to $R_{203}$ in formula (ZI) is an aryl group, that is, a compound having an arylsulfonium as the cation.

In the arylsulfonium compound, $R_{201}$ to $R_{203}$ all may be an aryl group or a part of $R_{201}$ to $R_{203}$ may be an aryl group with the remaining being an alkyl group or a cycloalkyl group.

Examples of the arylsulfonium compound include a triarylsulfonium compound, a diarylalkylsulfonium compound, an aryldialkylsulfonium compound, a diarylcycloalkylsulfonium compound and an aryldicycloalkylsulfonium compound.

The aryl group in the arylsulfonium compound is preferably an aryl group such as phenyl group and naphthyl group, or a heteroaryl group such as indole residue and pyrrole residue, more preferably a phenyl group or an indole residue. In the case where the arylsulfonium compound has two or more aryl groups, these two or more aryl groups may be the same or different.

The alkyl group which is present, if desired, in the arylsulfonium compound is preferably a linear or branched alkyl group having a carbon number of 1 to 15, and examples thereof include a methyl group, an ethyl group, a propyl group, an n-butyl group, a sec-butyl group and a tert-butyl group.

The cycloalkyl group which is present, if desired, in the arylsulfonium compound is preferably a cycloalkyl group having a carbon number of 3 to 15, and examples thereof include a cyclopropyl group, a cyclobutyl group and a cyclohexyl group.

The aryl group, alkyl group and cycloalkyl group of $R_{201}$ to $R_{203}$ each may have, as the substituent, an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 14), an alkoxy group (for example, an alkoxy group having a carbon number of 1 to 15), a halogen atom, a hydroxyl group or a phenylthio group. The substituent is preferably a linear or branched alkyl group having a carbon number of 1 to 12, a cycloalkyl group having a carbon number of 3 to 12, or a linear, branched or cyclic alkoxy group having a carbon number of 1 to 12, more preferably an alkyl group having a carbon number of 1 to 4 or an alkoxy group having a carbon number of 1 to 4. The substituent may be substituted to any one of three members $R_{201}$ to $R_{203}$ or may be substituted to all of these three members. In the case where $R_{201}$ to $R_{203}$ are an aryl group, the substituent is preferably substituted at the p-position of the aryl group.

The compound (ZI-2) is described below. The compound (ZI-2) is a compound where each of $R_{201}$ to $R_{203}$ in formula (ZI) independently represents an aromatic ring-free organic group. The aromatic ring as used herein includes an aromatic ring containing a heteroatom.

The aromatic ring-free organic group as $R_{201}$ to $R_{203}$ generally has a carbon number of 1 to 30, preferably from 1 to 20.

Each of $R_{201}$ to $R_{203}$ is independently preferably an alkyl group, a cycloalkyl group, an allyl group or a vinyl group, more preferably a linear, branched or cyclic 2-oxoalkyl group or an alkoxycarbonylmethyl group, still more preferably a linear or branched 2-oxoalkyl group.

The alkyl group as $R_{201}$ to $R_{203}$ may be either linear or branched and includes a linear or branched alkyl group preferably having a carbon number of 1 to 10 (e.g., methyl, ethyl, propyl, butyl, pentyl). The alkyl group as $R_{201}$ to $R_{203}$ is preferably a linear or branched 2-oxoalkyl group or an alkoxycarbonylmethyl group.

The cycloalkyl group as $R_{201}$ to $R_{203}$ includes a cycloalkyl group preferably having a carbon number of 3 to 10 (e.g., cyclopentyl, cyclohexyl, norbornyl). The cycloalkyl group as $R_{201}$ to $R_{203}$ is preferably a cyclic 2-oxoalkyl group.

The linear, branched or cyclic 2-oxoalkyl group as $R_{201}$ to $R_{203}$ is preferably a group having >C=O at the 2-position of the above-described alkyl or cycloalkyl group.

The alkoxy group in the alkoxycarbonylmethyl group as $R_{201}$ to $R_{203}$ includes an alkoxy group preferably having a carbon number of 1 to 5 (e.g., methoxy, ethoxy, propoxy, butoxy, pentoxy).

Each of $R_{201}$ to $R_{203}$ may be further substituted by a halogen atom, an alkoxy group (for example, an alkoxy group having a carbon number of 1 to 5), a hydroxyl group, a cyano group or a nitro group.

The compound (ZI-3) is a compound represented by the following formula (ZI-3), and this is a compound having a phenacylsulfonium salt structure.

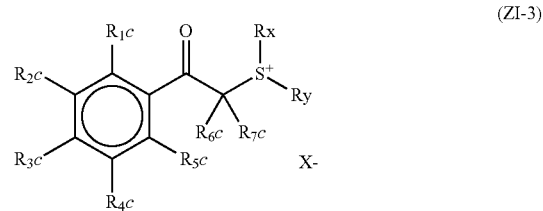

In formula (ZI-3), each of $R_{1c}$ to $R_{5c}$ independently represents a hydrogen atom, an alkyl group, a cycloalkyl group, an alkoxy group or a halogen atom.

Each of $R_{6c}$ and $R_{7c}$ independently represents a hydrogen atom, an alkyl group or a cycloalkyl group.

Each of $R_x$ and $R_y$ independently represents an alkyl group, a cycloalkyl group, an allyl group or a vinyl group.

Any two or more members out of $R_{1c}$ to $R_{7c}$ and a pair of $R_x$ and $R_y$ may combine with each other to form a ring structure respectively, and the ring structure may contain an oxygen atom, a sulfur atom, an ester bond or an amide bond. Examples of the group formed by combining any two or more members out of $R_{1c}$ to $R_{7c}$ or a pair of $R_x$ and $R_y$ include a butylene group and a pentylene group.

$X^-$ represents a non-nucleophilic anion, and examples thereof are the same as those of the non-nucleophilic anion of $X^-$ in formula (ZI).

The alkyl group as $R_{1c}$ to $R_{7c}$ may be linear or branched and is, for example, a linear or branched alkyl group having a carbon number of 1 to 20, preferably a linear or branched alkyl group having a carbon number of 1 to 12 (such as methyl group, ethyl group, linear or branched propyl group, linear or branched butyl group, or linear or branched pentyl group).

The cycloalkyl group as $R_{1c}$ to $R_{7c}$ includes a cycloalkyl group preferably having a carbon number of 3 to 8 (e.g., cyclopentyl, cyclohexyl).

The alkoxy group as $R_{1c}$ to $R_{5c}$ may be linear, branched or cyclic and is, for example, an alkoxy group having a carbon number of 1 to 10, preferably a linear or branched alkoxy group having a carbon number of 1 to 5 (such as methoxy group, ethoxy group, linear or branched propoxy group, linear or branched butoxy group, or linear or branched pentoxy group), or a cyclic alkoxy group having a carbon number of 3 to 8 (e.g., cyclopentyloxy, cyclohexyloxy).

A compound where any one of $R_{1c}$ to $R_{5c}$ is a linear or branched alkyl group, a cycloalkyl group or a linear, branched or cyclic alkoxy group is preferred, and a compound where the sum of carbon numbers of $R_{1c}$ to $R_{5c}$ is from 2 to 15 is more preferred. Thanks to this construction, the solubility in a solvent is more enhanced and generation of particles during storage is suppressed.

The alkyl group as $R_x$ and $R_y$ is the same as the alkyl group of $R_{1c}$ to $R_{7c}$. The alkyl group as $R_x$ and $R_y$ is preferably a linear or branched 2-oxoalkyl group or an alkoxycarbonylmethyl group.

The cycloalkyl group as $R_x$ and $R_y$ is the same as the cycloalkyl group of $R_{1c}$ to $R_{7c}$. The cycloalkyl group as $R_x$ to $R_y$ is preferably a cyclic 2-oxoalkyl group.

The linear, branched or cyclic 2-oxoalkyl group includes a group having >C=O at the 2-position of the alkyl group or cycloalkyl group of $R_{1c}$ to $R_{7c}$.

The alkoxy group in the alkoxycarbonylmethyl group is the same as the alkoxy group of $R_{1c}$ to $R_{5c}$.

Each of $R_x$ and $R_y$ is preferably an alkyl group having a carbon number of 4 or more, more preferably 6 or more, still more preferably 8 or more.

In formulae (ZII) and (ZIII), each of $R_{204}$ to $R_{207}$ independently represents an aryl group, an alkyl group or a cycloalkyl group.

The aryl group of $R_{204}$ to $R_{207}$ is preferably a phenyl group or a naphthyl group, more preferably a phenyl group.

The alkyl group as $R_{204}$ to $R_{207}$ may be linear or branched and includes a linear or branched alkyl group preferably having a carbon number of 1 to 10 (e.g., methyl, ethyl, propyl, butyl, pentyl).

The cycloalkyl group as $R_{204}$ to $R_{207}$ includes a cycloalkyl group preferably having a carbon number of 3 to 10 (e.g., cyclopentyl, cyclohexyl, norbornyl).

Each of $R_{204}$ to $R_{207}$ may have a substituent. Examples of the substituent which each of $R_{204}$ to $R_{207}$ may have include an alkyl group (for example, an alkyl group having a carbon number of 1 to 15), a cycloalkyl group (for example, a cycloalkyl group having a carbon number of 3 to 15), an aryl group (for example, an aryl group having a carbon number of 6 to 15), an alkoxy group (for example, an alkoxy group having a carbon number of 1 to 15), a halogen atom, a hydroxyl group and a phenylthio group.

$X^-$ represents a non-nucleophilic anion and is the same as the non-nucleophilic anion of $X^-$ in formula (ZI).

Out of the compounds capable of generating an acid upon irradiation with an actinic ray or radiation, preferred compounds further include the compounds represented by the following formulae (ZIV), (ZV) and (ZVI):

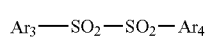

ZIV

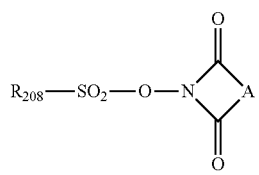

ZV

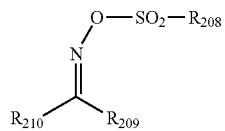

ZVI

In formulae (ZIV) to (ZVI), each of $Ar_3$ and $Ar_4$ independently represents an aryl group.

$R_{208}$ represents an alkyl group or an aryl group.

Each of $R_{209}$ and $R_{210}$ independently represents an alkyl group, an aryl group or an electron-withdrawing group.

$R_{209}$ is preferably an aryl group.

$R_{210}$ is preferably an electron-withdrawing group, more preferably a cyano group or a fluoroalkyl group.

A represents an alkylene group, an alkenylene group or an arylene group.

The compound capable of generating an acid upon irradiation with an actinic ray or radiation is preferably a compound represented by any one of formulae (ZI) to (ZIII).

The compound (B) is preferably a compound capable of generating a fluorine atom-containing aliphatic sulfonic acid or a fluorine atom-containing benzenesulfonic acid upon irradiation with an actinic ray or radiation.

The compound (B) preferably has a triphenylsulfonium structure.

The compound (B) is preferably a triphenylsulfonium salt compound having a fluorine-unsubstituted alkyl or cycloalkyl group in the cation moiety.

Particularly preferred examples out of the compounds capable of generating an acid upon irradiation with an actinic ray or radiation are set forth below.

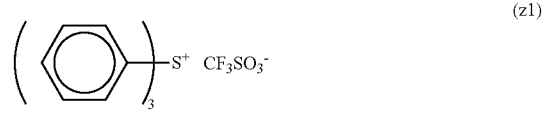

(z1)

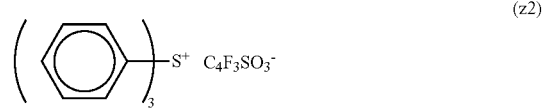

(z2)

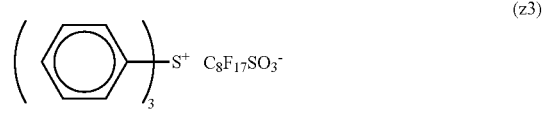

(z3)

(z4)

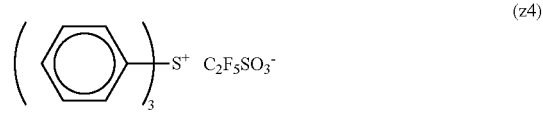

(z5)

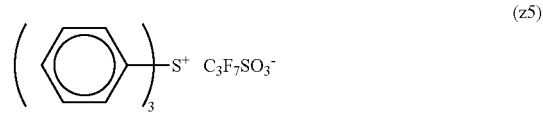

(z6)

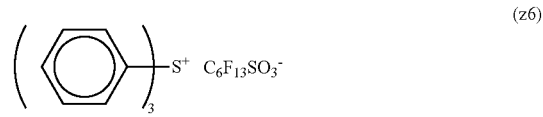

(z7)

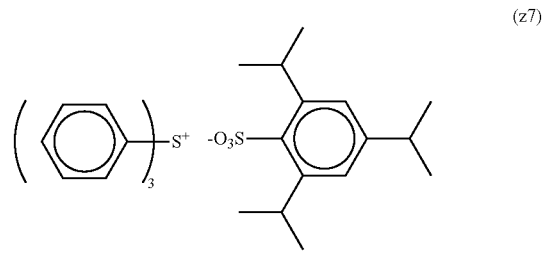

(z8)

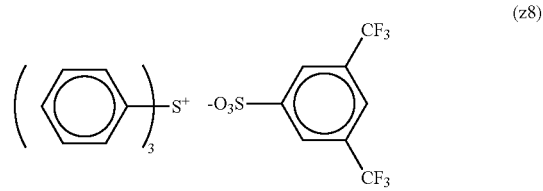

(z9)

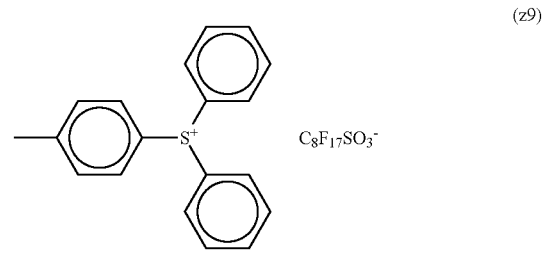

(z10)

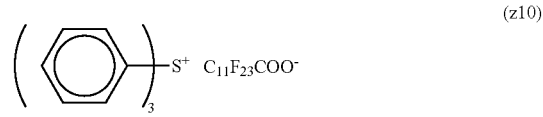

-continued
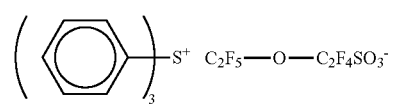
(z11)
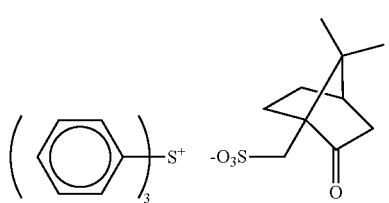
(z12)
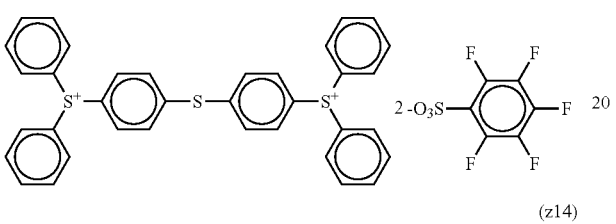
(z13)
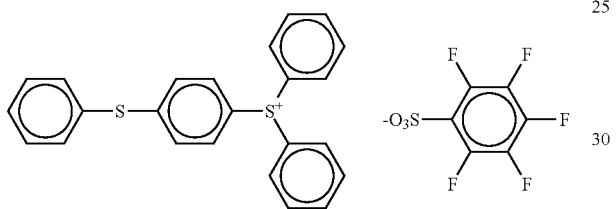
(z14)
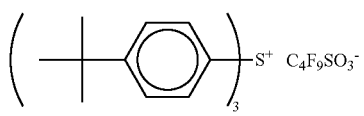
(z15)
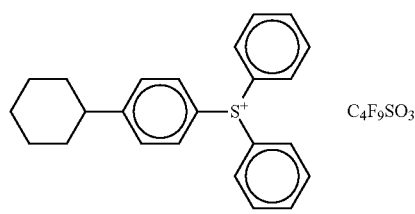
(z16)
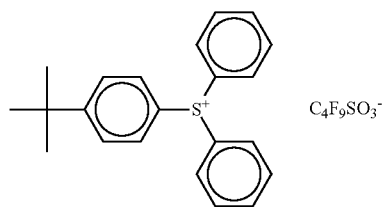
(z17)
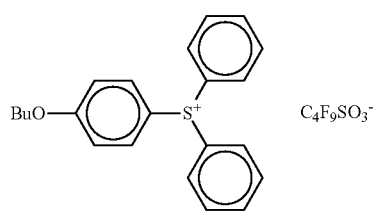
(z18)
-continued
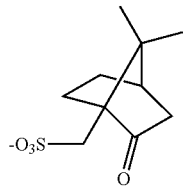
(z19)
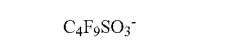
(z20)
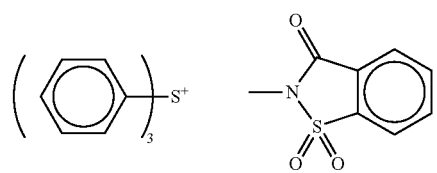
(z21)
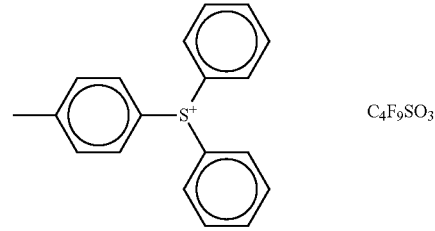
(z22)
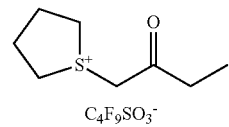
(z23)
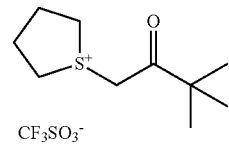
(z24)
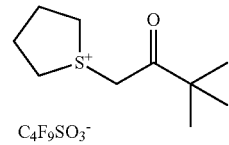
(z25)
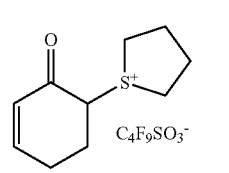
(z26)
(z27)

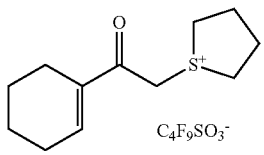
(z28)
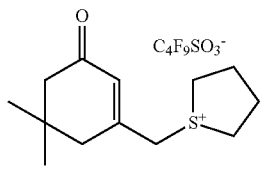
(z29)
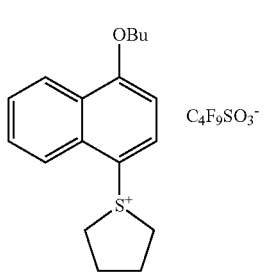
(z30)
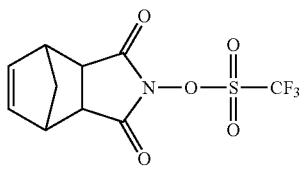
(z31)
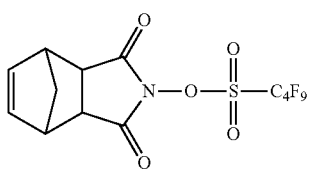
(z32)
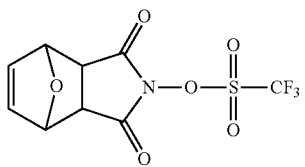
(z33)
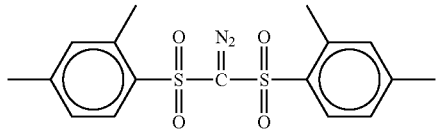
(z34)
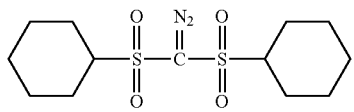
(z35)
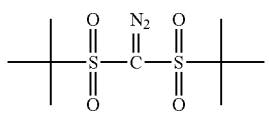
(z36)
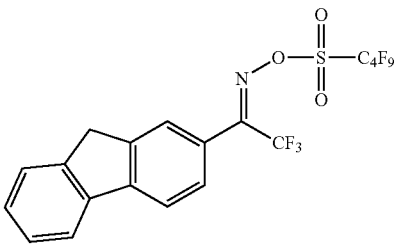
(z37)
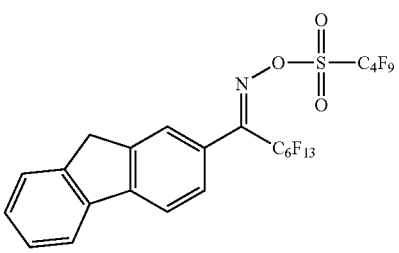
(z38)
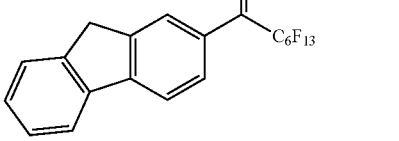
(z39)
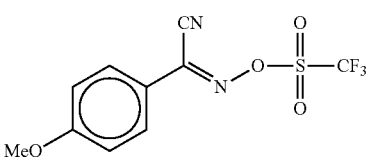
(z40)
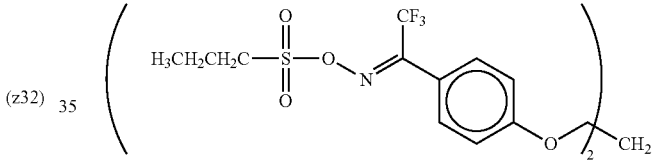
(z41)
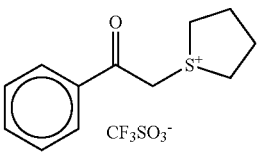
(z42)
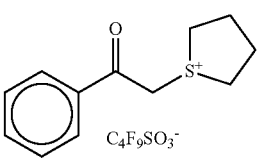
(z43)
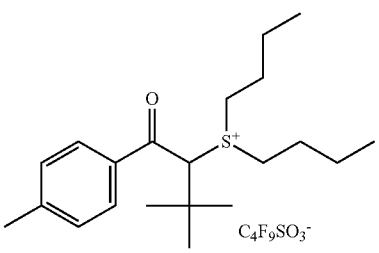

-continued
(z44) 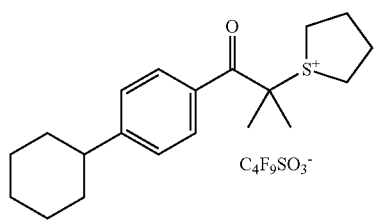
(z45) 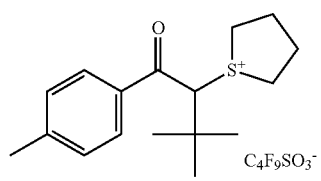
(z46) 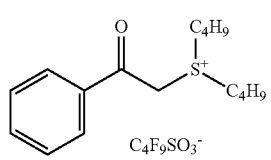
(z47) 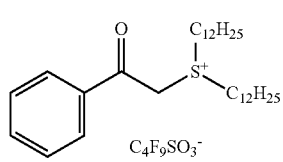
(z48) 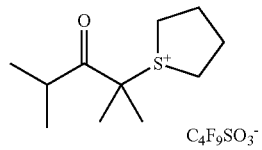
(z49) 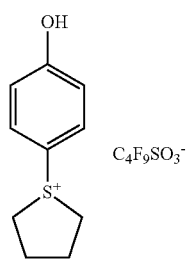
(z50) 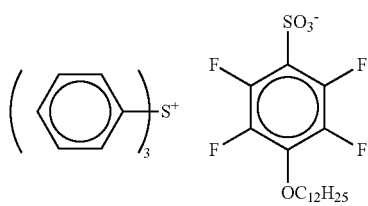
(z51) 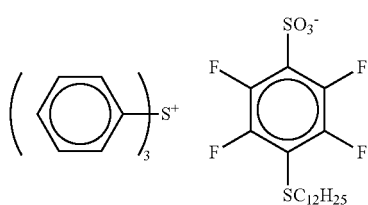
-continued
(z52) 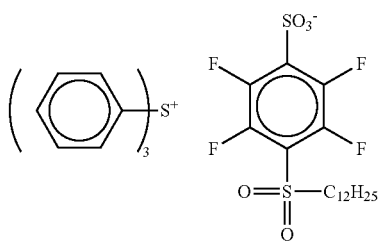
(z53) 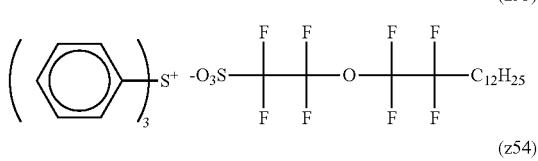
(z54) 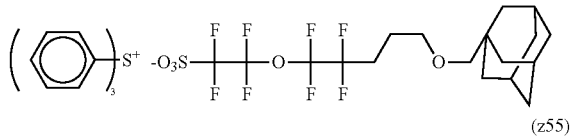
(z55) 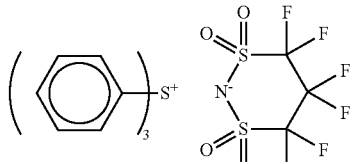
(z56) 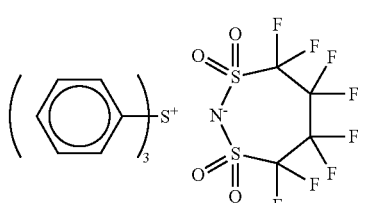
(z57) 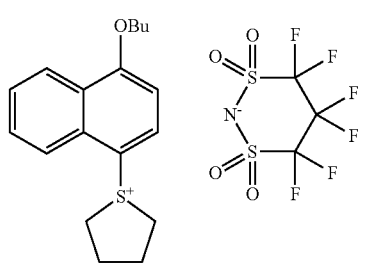
(z58) 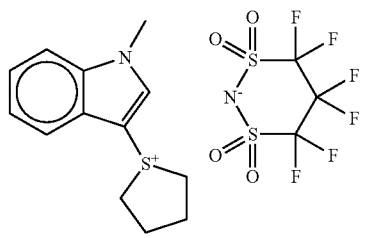
(z59) 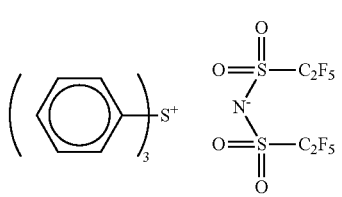

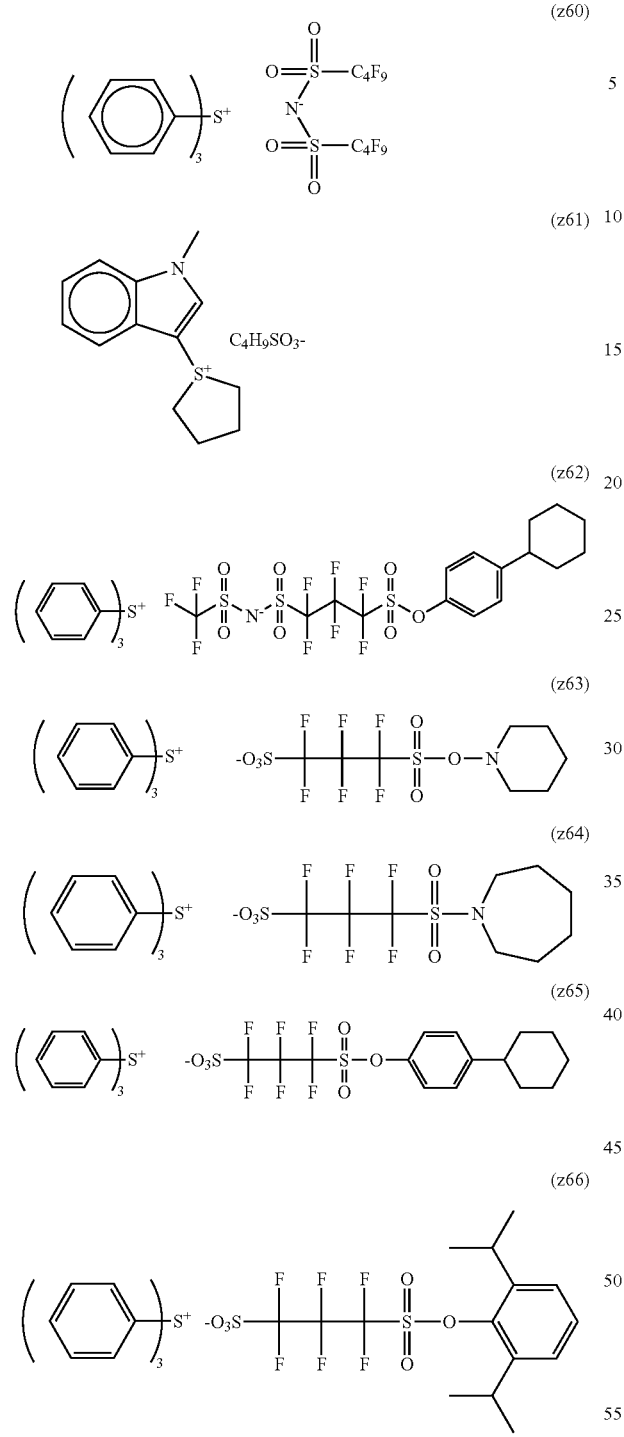
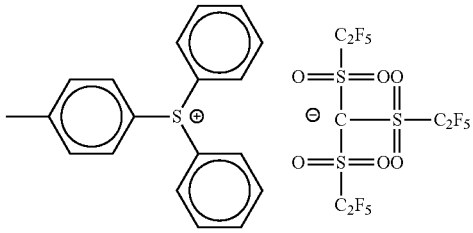
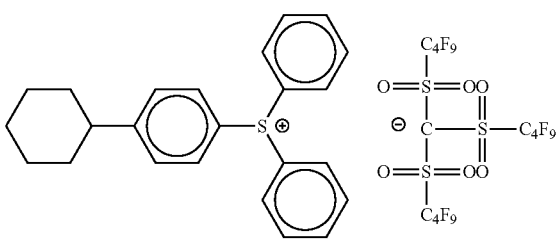
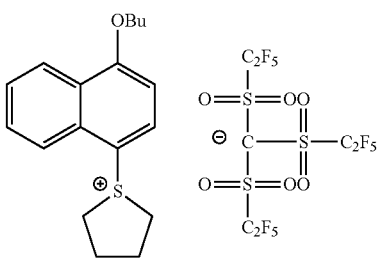
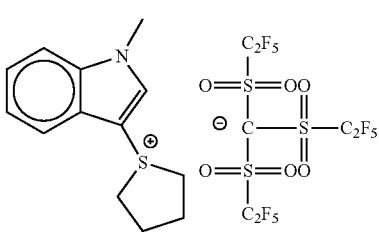
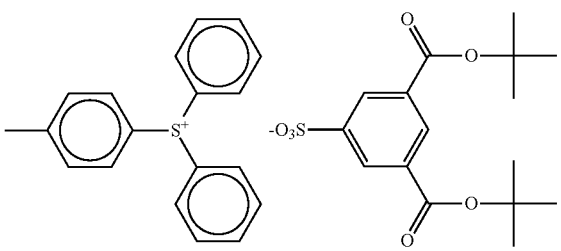
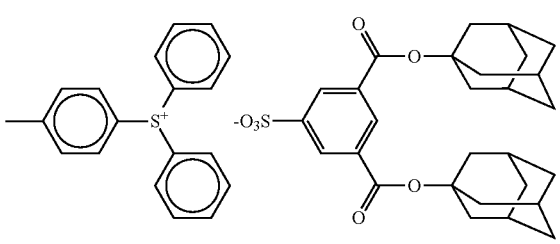

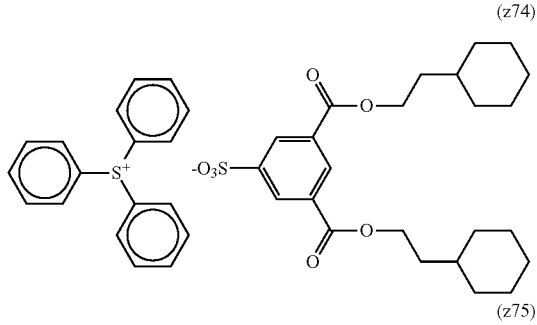

One of these photo-acid generators may be used alone, or two or more kinds thereof may be used in combination. In the case of using two or more kinds of photo-acid generators in combination, compounds capable of generating two kinds of organic acids differing in the total atom number except for hydrogen atom by 2 or more are preferably combined.

The content of the photo-acid generator is preferably from 0.1 to 10 mass %, more preferably from 0.5 to 10 mass %, still more preferably from 1 to 10 mass %, yet still more preferably from 2 to 10 mass %, based on the entire solid content of the resist composition.

By setting the photo-acid generator content to the range above, the exposure latitude when a resist pattern is formed, or the crosslinking reactivity with the crosslinked layer-forming material is enhanced.

(C) Solvent

Examples of the solvent which can be used for dissolving respective components described above to prepare a resist composition include an organic solvent such as alkylene glycol monoalkyl ether carboxylate, alkylene glycol monoalkyl ether, alkyl lactate, alkyl alkoxypropionate, cyclic lactone having a carbon number of 4 to 10, monoketone compound having a carbon number of 4 to 10 which may contain a ring, alkylene carbonate, alkyl alkoxyacetate and alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether and ethylene glycol monoethyl ether.

Preferred examples of the alkyl lactate include methyl lactate, ethyl lactate, propyl lactate and butyl lactate.

Preferred examples of the alkyl alkoxypropionate include ethyl 3-ethoxypropionate, methyl 3-methoxypropionate, methyl 3-ethoxypropionate and ethyl 3-methoxypropionate.

Preferred examples of the cyclic lactone having a carbon number of 4 to 10 include β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

Preferred examples of the monoketone compound having a carbon number of 4 to 10 which may contain a ring include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methyl cyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

Preferred examples of the alkylene carbonate include propylene carbonate, vinylene carbonate, ethylene carbonate and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate and 1-methoxy-2-propyl acetate.

Preferred examples of the alkyl pyruvate include methyl pyruvate, ethyl pyruvate and propyl pyruvate.

The solvent which can be preferably used is a solvent having a boiling point of 130° C. or more at ordinary temperature under atmospheric pressure, and specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate.

In the present invention, one of these solvents may be used alone, or two or more kinds thereof may be used in combination.

In the present invention, a mixed solvent prepared by mixing a solvent containing a hydroxyl group in the structure and a solvent not containing a hydroxyl group may be used as the organic solvent.

Examples of the solvent containing a hydroxyl group include ethylene glycol, ethylene glycol monomethyl ether, ethylene glycol monoethyl ether, propylene glycol, propylene glycol monomethyl ether, propylene glycol monoethyl ether and ethyl lactate. Among these, propylene glycol monomethyl ether and ethyl lactate are preferred.

Examples of the solvent not containing a hydroxyl group include propylene glycol monomethyl ether acetate, ethyl ethoxypropionate, 2-heptanone, γ-butyrolactone, cyclohexanone, butyl acetate, N-methylpyrrolidone, N,N-dimethylacetamide and dimethylsulfoxide. Among these, propylene glycol monomethyl ether acetate, ethyl ethoxypropionate, 2-heptanone, γ-butyrolactone, cyclohexanone and butyl acetate are preferred, and propylene glycol monomethyl ether acetate, ethyl ethoxypropionate and 2-heptanone are most preferred.

The mixing ratio (by mass) between the solvent containing a hydroxyl group and the solvent not containing a hydroxyl group is from 1/99 to 99/1, preferably from 10/90 to 90/10, more preferably from 20/80 to 60/40. A mixed solvent in which the solvent not containing a hydroxyl group is contained in an amount of 50 mass % or more is preferred in view of coating uniformity.

The solvent is preferably a mixed solvent of two or more kinds of solvents including propylene glycol monomethyl ether acetate.

(D) Resin Having at Least Either a Fluorine Atom or a Silicon Atom

The resist composition of the present invention preferably contains (D) a resin having at least either a fluorine atom or a silicon atom.

The resin (D) is a non-acid-decomposable resin, that is, a resin whose acid decomposability is very low compared with the resin (A) and which can be regarded as substantially non-acid-decomposable.

In the resin (D), the fluorine atom or silicon atom may be present in the main chain of the resin or may be substituted to the side chain.

The resin (D) is preferably a resin having a fluorine atom-containing alkyl group, a fluorine atom-containing cycloalkyl group or a fluorine atom-containing aryl group, as a fluorine atom-containing partial structure.

The fluorine atom-containing alkyl group (preferably having a carbon number of 1 to 10, more preferably from 1 to 4) is a linear or branched alkyl group with at least one hydrogen atom being replaced by a fluorine atom and may further have another substituent.

The fluorine atom-containing cycloalkyl group is a monocyclic or polycyclic cycloalkyl group with at least one hydrogen atom being replaced by a fluorine atom and may further have another substituent.

The fluorine atom-containing aryl group is an aryl group (e.g., phenyl, naphthyl) with at least one hydrogen atom being replaced by a fluorine atom and may further have another substituent.

Specific examples of the fluorine atom-containing alkyl group, fluorine atom-containing cycloalkyl group and fluorine atom-containing aryl group are set forth below, but the present invention is not limited thereto.

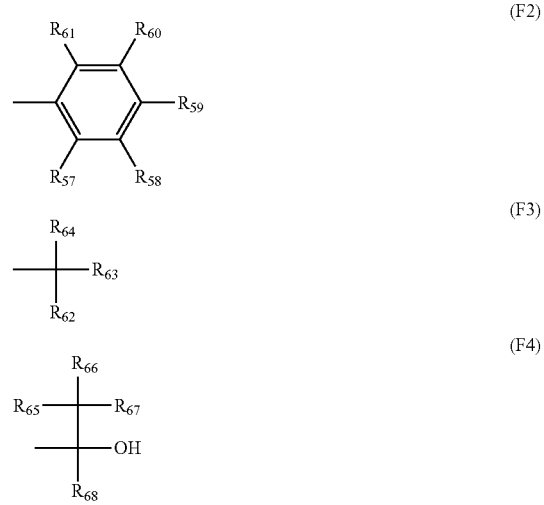

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ are a fluorine atom or an alkyl group (preferably having a carbon number of 1 to 4) with at least one hydrogen atom being replaced by a fluorine atom. It is preferred that $R_{57}$ to $R_{61}$ and $R_{65}$ to $R_{67}$ all are a fluorine atom. Each of $R_{62}$, $R_{63}$ and $R_{68}$ is preferably an alkyl group (preferably having a carbon number of 1 to 4) with at least one hydrogen atom being replaced by a fluorine atom, more preferably a perfluoroalkyl group having a carbon number of 1 to 4. $R_{62}$ and $R_{63}$ may combine with each other to form a ring.

Specific examples of the group represented by formula (F2) include p-fluorophenyl group, pentafluorophenyl group and 3,5-di(trifluoromethyl)phenyl group.

Specific examples of the group represented by formula (F3) include trifluoroethyl group, pentafluoropropyl group, pentafluoroethyl group, heptafluorobutyl group, hexafluoroisopropyl group, heptafluoroisopropyl group, hexafluoro(2-methyl)isopropyl group, nonafluorobutyl group, octafluoroisobutyl group, nonafluorohexyl group, nonafluoro-tert-butyl group, perfluoroisopentyl group, perfluorooctyl group, perfluoro(trimethyl)hexyl group, 2,2,3,3-tetrafluorocyclobutyl group and perfluorocyclohexyl group. Among these, hexafluoroisopropyl group, heptafluoroisopropyl group, hexafluoro(2-methyl)isopropyl group, octafluoroisobutyl group, nonafluoro-tert-butyl group and perfluoroisopentyl group are preferred, and hexafluoroisopropyl group and heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

The resin (D) is preferably a resin having an alkylsilyl structure (preferably a trialkylsilyl group) or a cyclic siloxane structure, as a silicon atom-containing partial structure.

Specific examples of the alkylsilyl structure and cyclic siloxane structure include the groups represented by the following formulae (CS-1) to (CS-3):

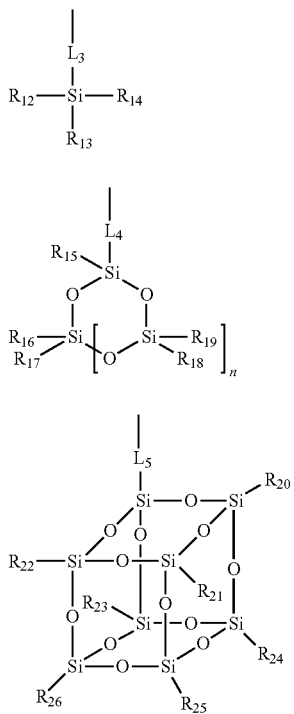

(CS-1)

(CS-2)

(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group is a sole group or a combination of two or more groups selected from the group consisting of an alkylene group, a phenyl group, an ether group, a thioether group, a carbonyl group, an ester group, an amide group, a urethane group and a urea group.

n represents an integer of 1 to 5.

The resin (D) is preferably a resin containing at least one member selected from the group consisting of repeating units represented by the following formulae (C-I) to (C-V):

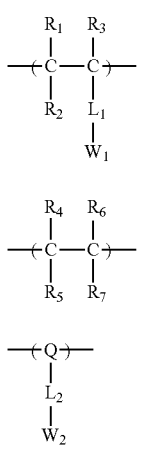

(C-I)

(C-II)

(C-III)

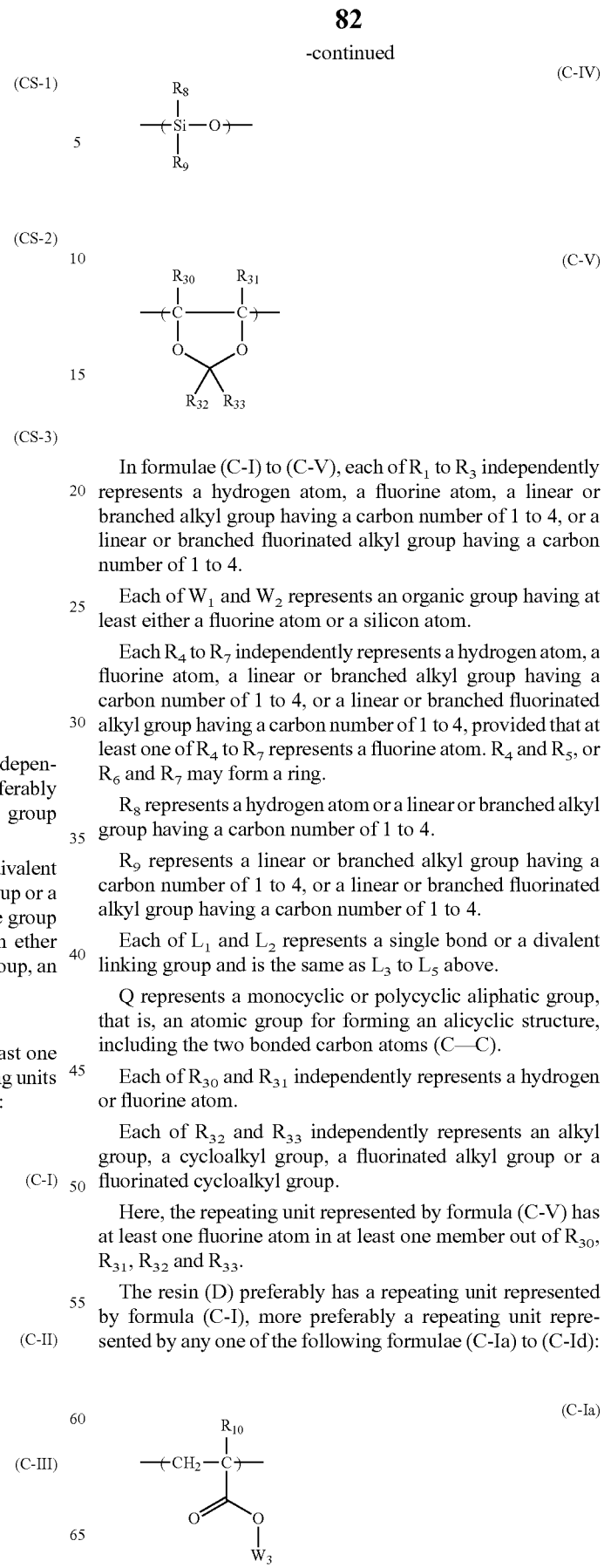

(C-IV)

(C-V)

In formulae (C-I) to (C-V), each of $R_1$ to $R_3$ independently represents a hydrogen atom, a fluorine atom, a linear or branched alkyl group having a carbon number of 1 to 4, or a linear or branched fluorinated alkyl group having a carbon number of 1 to 4.

Each of $W_1$ and $W_2$ represents an organic group having at least either a fluorine atom or a silicon atom.

Each $R_4$ to $R_7$ independently represents a hydrogen atom, a fluorine atom, a linear or branched alkyl group having a carbon number of 1 to 4, or a linear or branched fluorinated alkyl group having a carbon number of 1 to 4, provided that at least one of $R_4$ to $R_7$ represents a fluorine atom. $R_4$ and $R_5$, or $R_6$ and $R_7$ may form a ring.

$R_8$ represents a hydrogen atom or a linear or branched alkyl group having a carbon number of 1 to 4.

$R_9$ represents a linear or branched alkyl group having a carbon number of 1 to 4, or a linear or branched fluorinated alkyl group having a carbon number of 1 to 4.

Each of $L_1$ and $L_2$ represents a single bond or a divalent linking group and is the same as $L_3$ to $L_5$ above.

Q represents a monocyclic or polycyclic aliphatic group, that is, an atomic group for forming an alicyclic structure, including the two bonded carbon atoms (C—C).

Each of $R_{30}$ and $R_{31}$ independently represents a hydrogen or fluorine atom.

Each of $R_{32}$ and $R_{33}$ independently represents an alkyl group, a cycloalkyl group, a fluorinated alkyl group or a fluorinated cycloalkyl group.

Here, the repeating unit represented by formula (C-V) has at least one fluorine atom in at least one member out of $R_{30}$, $R_{31}$, $R_{32}$ and $R_{33}$.

The resin (D) preferably has a repeating unit represented by formula (C-I), more preferably a repeating unit represented by any one of the following formulae (C-Ia) to (C-Id):

(C-Ia)

-continued

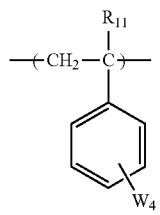
(C-Ib)

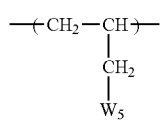
(C-Ic)

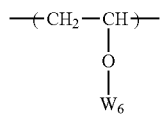
(C-Id)

In formulae (C-Ia) to (C-Id), each of $R_{10}$ and $R_{11}$ represents a hydrogen atom, a fluorine atom, a linear or branched alkyl group having a carbon number of 1 to 4, or a linear or branched fluorinated alkyl group having a carbon number of 1 to 4.

Each of $W_3$ to $W_6$ represents an organic group having one or more atoms of at least either a fluorine atom or a silicon atom.

When $W_1$ to $W_6$ are an organic group having a fluorine atom, the organic group is preferably a fluorinated linear or branched alkyl group or cycloalkyl group having a carbon number of 1 to 20, or a fluorinated linear, branched or cyclic alkyl ether group having a carbon number of 1 to 20.

Examples of the fluorinated alkyl group of $W_1$ to $W_6$ include a trifluoroethyl group, a pentafluoropropyl group, a hexafluoroisopropyl group, a hexafluoro(2-methyl)isopropyl group, a heptafluorobutyl group, a heptafluoroisopropyl group, an octafluoroisobutyl group, a nonafluorohexyl group, a nonafluoro-tert-butyl group, a perfluoroisopentyl group, a perfluorooctyl group and a perfluoro(trimethyl)hexyl group.

When $W_1$ to $W_6$ are an organic group having a silicon atom, the organic group preferably has an alkylsilyl structure or a cyclic siloxane structure. Specific examples thereof include the groups represented by formulae (CS-1) to (CS-3).

Specific examples of the repeating unit represented by formula (C-I) are set forth below. X represents a hydrogen atom, —$CH_3$, —F or —$CF_3$.

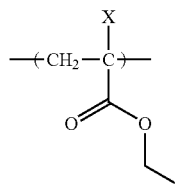 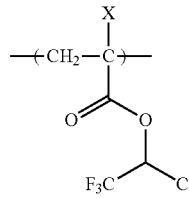

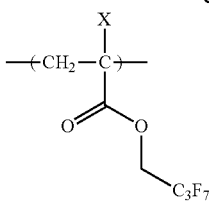

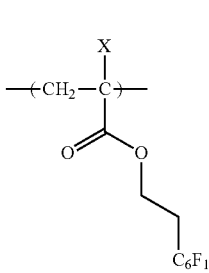

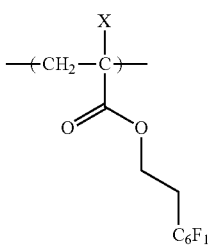

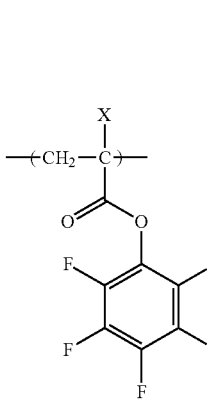

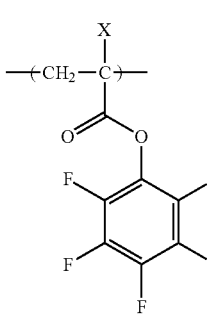

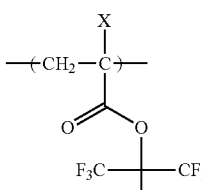

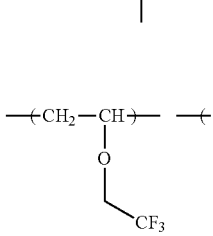

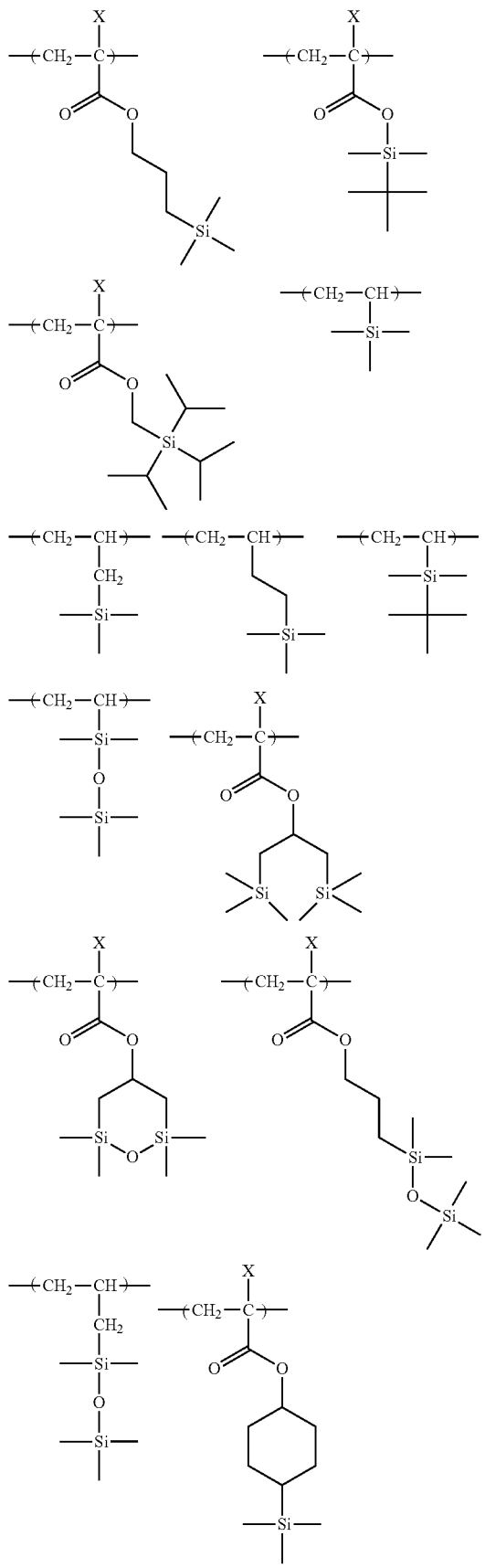

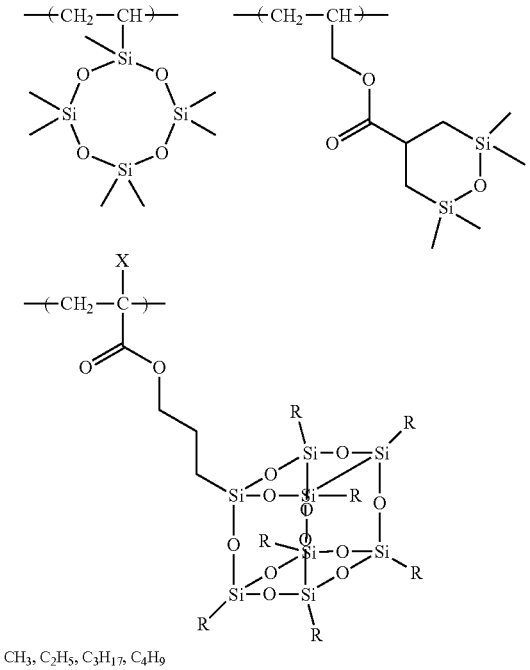

R = CH$_3$, C$_2$H$_5$, C$_3$H$_{17}$, C$_4$H$_9$

The resin (D) is preferably any one resin selected from the following (D-1) to (D-6):

(D-1) a resin containing (a) a repeating unit having a fluoroalkyl group (preferably having a carbon number of 1 to 4), more preferably a resin containing only the repeating unit (a), (D-2) a resin containing (b) a repeating unit having a trialkylsilyl group or a cyclic siloxane structure, more preferably a resin containing only the repeating unit (b), (D-3) a resin containing (a) a repeating unit having a fluoroalkyl group (preferably having a carbon number of 1 to 4) and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymer resin of the repeating unit (a) and the repeating unit (c), (D-4) a resin containing (b) a repeating unit having a trialkylsilyl group or a cyclic siloxane structure and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymer resin of the repeating unit (b) and the repeating unit (c), (D-5) a resin containing (a) a repeating unit having a fluoroalkyl group (preferably having a carbon number of 1 to 4) and (b) a repeating unit having a trialkylsilyl group or a cyclic siloxane structure, more preferably a copolymer resin of the repeating unit (a) and the repeating unit (b), and (D-6) a resin containing (a) a repeating unit having a fluoroalkyl group (preferably having a carbon number of 1 to 4), (b) a repeating unit having a trialkylsilyl group or a cyclic siloxane structure, and (c) a repeating unit having a branched alkyl group (preferably having a carbon number of 4 to 20), a cycloalkyl group (preferably having a carbon number of 4 to 20), a branched alkenyl group (preferably having a carbon number of 4 to 20), a cycloalkenyl group (preferably having a carbon number of 4 to 20) or an aryl group (preferably having a carbon number of 4 to 20), more preferably a copolymer resin of the repeating unit (a), the repeating unit (b) and the repeating unit (c).

As for the repeating unit (c) having a branched alkyl group, a cycloalkyl group, a branched alkenyl group, a cycloalkenyl group or an aryl group in the resins (D-3), (D-4) and (D-6), an appropriate functional group can be introduced considering the hydrophilicity/hydrophobicity, interaction and the like, but in view of followability of immersion liquid or receding contact angle, a functional group having no polar group is preferred.

In the resins (D-3), (D-4) and (D-6), the content of the repeating unit (a) having a fluoroalkyl group and/or the repeating unit (b) having a trialkylsilyl group or a cyclic siloxane structure is preferably from 20 to 99 mol %.

The resin (D) is preferably a resin having a repeating unit represented by the following formula (Ia):

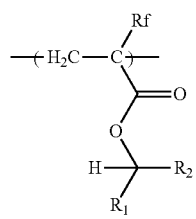

(Ia)

In formula (Ia), Rf represents a fluorine atom or an alkyl group with at least one hydrogen atom being replaced by a fluorine atom.

$R_1$ represents an alkyl group.

$R_2$ represents a hydrogen atom or an alkyl group.

In formula (Ia), the alkyl group with at least one hydrogen atom being replaced by a fluorine atom of Rf is preferably an alkyl group having a carbon number of 1 to 3, more preferably a trifluoromethyl group.

The alkyl group of $R_1$ is preferably a linear or branched alkyl group having a carbon number of 3 to 10, more preferably a branched alkyl group having a carbon number of 3 to 10.

$R_2$ is preferably a linear or branched alkyl group having a carbon number of 1 to 10, more preferably a linear or branched alkyl group having a carbon number of 3 to 10.

Specific examples of the repeating unit represented by formula (Ia) are set forth below, but the present invention is not limited thereto.

X=F or CF$_3$

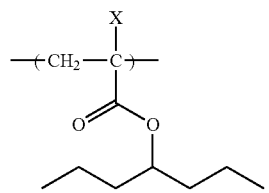

-continued

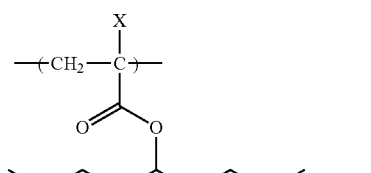

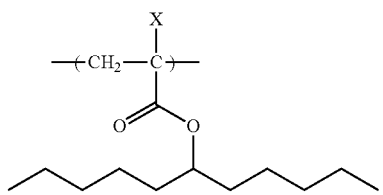

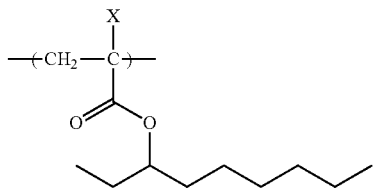

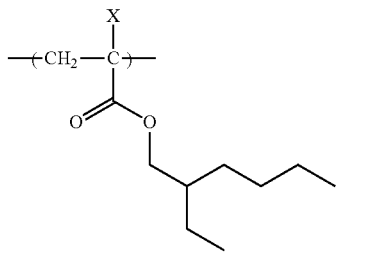

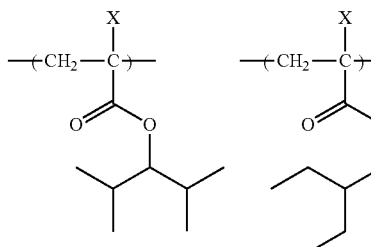

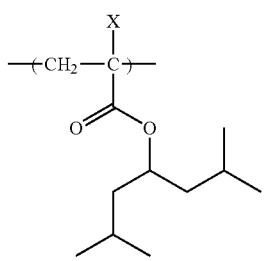

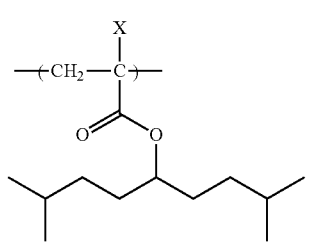

-continued

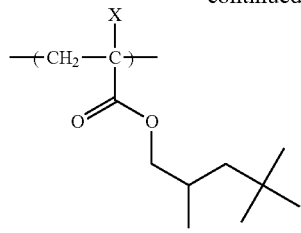

The repeating unit represented by formula (Ia) can be formed by polymerizing a compound represented by the following formula (I):

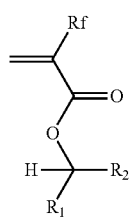

(I)

In formula (I), Rf represents a fluorine atom or an alkyl group with at least one hydrogen atom being replaced by a fluorine atom.

$R_1$ represents an alkyl group.

$R_2$ represents a hydrogen atom or an alkyl group.

Rf, $R_1$ and $R_2$ in formula (I) have the same meanings as Rf, $R_1$ and $R_2$ in formula (Ia).

The compound represented by formula (I) is a novel compound.

As for the compound represented by formula (I), a commercially available product or a compound synthesized may be used. In the case of synthesizing the compound, this can be attained by converting a 2-trifluoromethyl methacrylic acid into an acid chloride and then esterifying the acid chloride.

The resin (D) containing a repeating unit represented by formula (Ia) preferably further contains a repeating unit represented by the following formula (III):

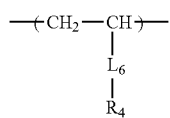

(III)

In formula (III), $R_4$ represents an alkyl group, a cycloalkyl group, an alkenyl group, a cycloalkenyl group, a trialkylsilyl group or a group having a cyclic siloxane structure.

$L_6$ represents a single bond or a divalent linking group.

In formula (III), the alkyl group of $R_4$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The trialkylsilyl group is preferably a trialkylsilyl group having a carbon number of 3 to 20.

The group having a cyclic siloxane structure is preferably a group containing a cyclic siloxane structure having a carbon number of 3 to 20.

The divalent linking group of $L_6$ is preferably an alkylene group (preferably having a carbon number of 1 to 5) or an oxy group.

Specific examples of the resin (D) having a repeating unit represented by formula (Ia) are set forth below, but the present invention is not limited thereto.

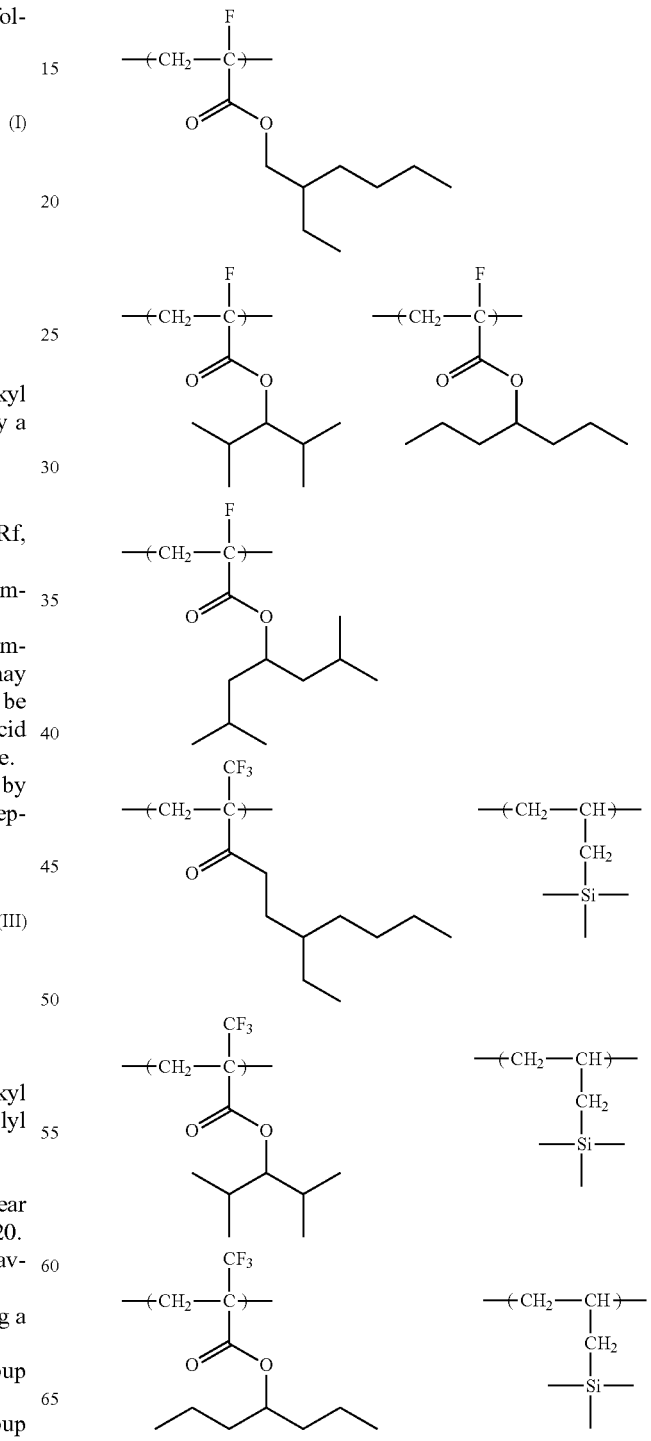

-continued
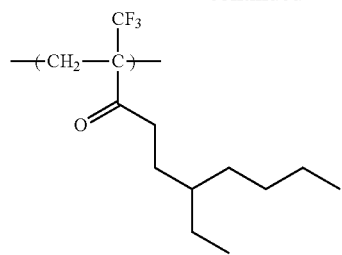 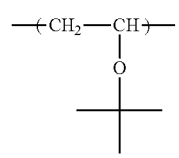
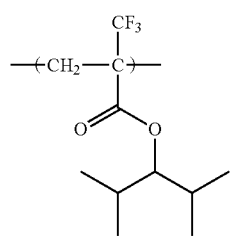 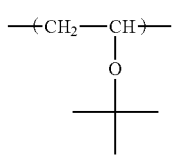
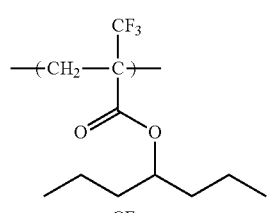 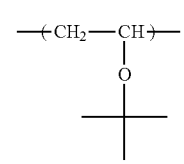
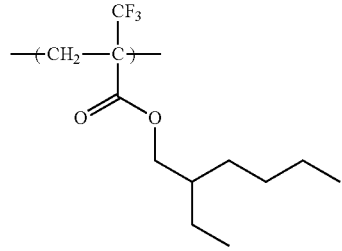 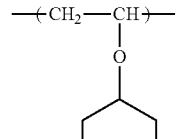
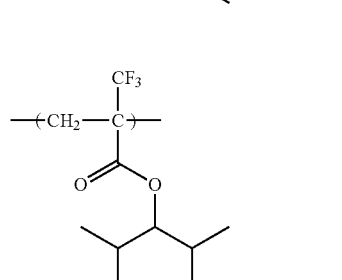 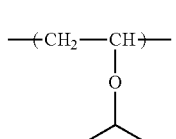
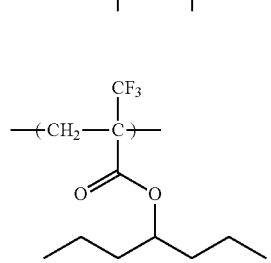 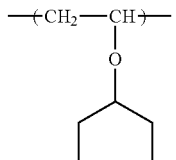
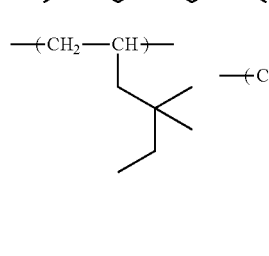 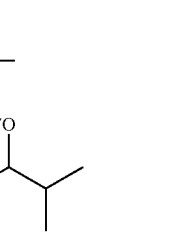
-continued
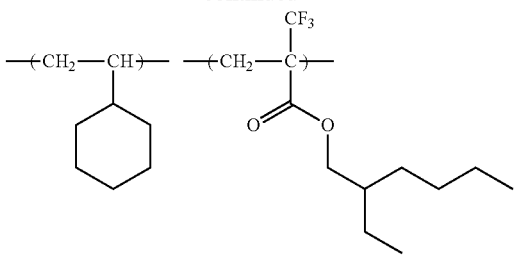
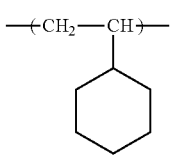 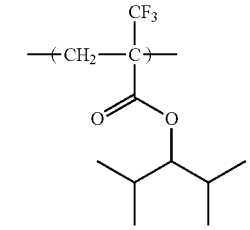
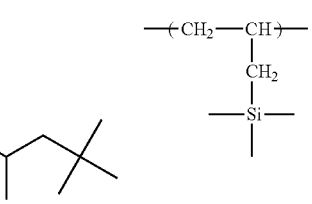
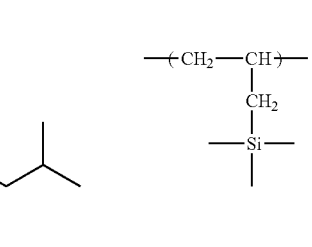
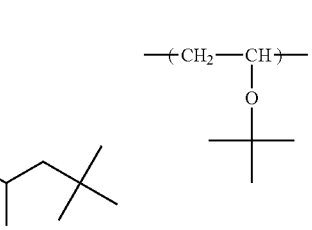
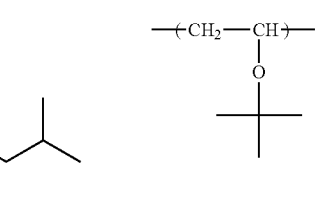
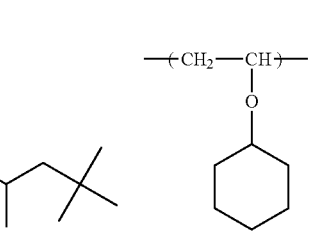

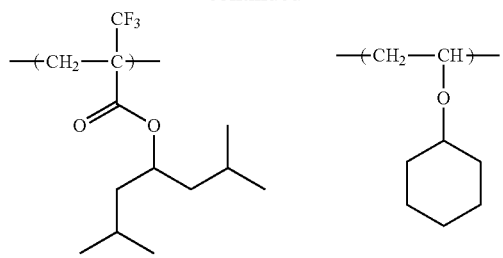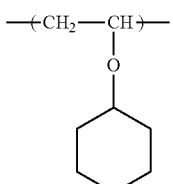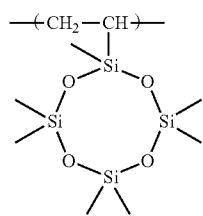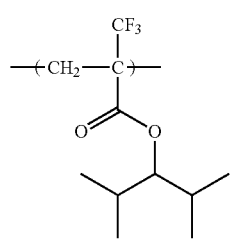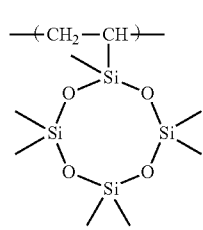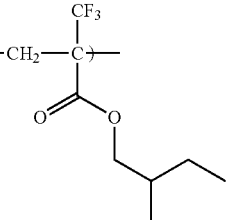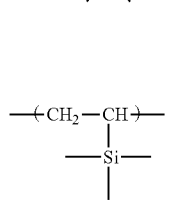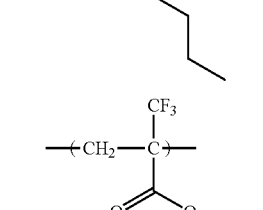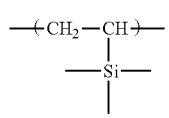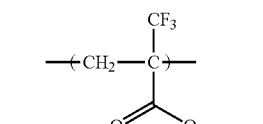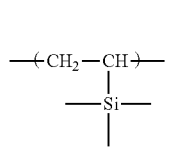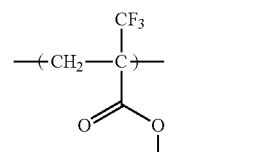

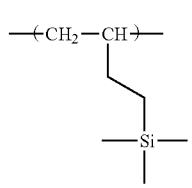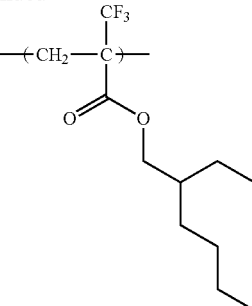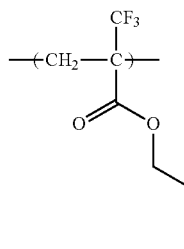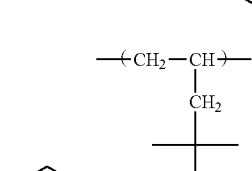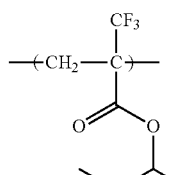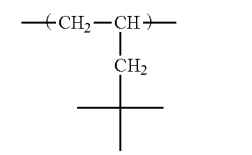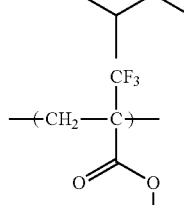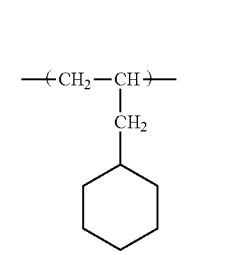

The resin (D) is preferably a resin containing a repeating unit represented by the following formula (II) and a repeating unit represented by the following formula (III):

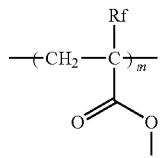

(II)

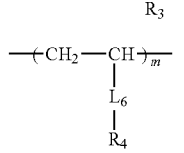

(III)

In formulae (II) and (III), Rf represents a fluorine atom or an alkyl group with at least one hydrogen atom being replaced by a fluorine atom.

$R_3$ represents an alkyl group, a cycloalkyl group, an alkenyl group, a cycloalkenyl group, or a group formed by combining two or more members thereof.

$R_4$ represents an alkyl group, a cycloalkyl group, an alkenyl group, a cycloalkenyl group, a trialkylsilyl group, a group having a cyclic siloxane structure, or a group formed by combining two or more members thereof.

In the alkyl group, cycloalkyl group, alkenyl group, cycloalkenyl group and trialkylsilyl group of $R_3$ and $R_4$, a functional group can be introduced but in view of followability of immersion liquid, a functional group having no polar group is preferred, and an unsubstituted functional group is more preferred.

$L_6$ represents a single bond or a divalent linking group.

$0<m<100$.

$0<n<100$.

In formula (II), Rf has the same meaning as Rf in formula (Ia).

The alkyl group of $R_3$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

$L_6$ is preferably a single bond, a methylene group, an ethylene group or an ether group.

m and n are preferably m=from 30 to 70 and n=from 30 to 70, more preferably m=from 40 to 60 and n=from 40 to 60.

Specific examples of the resin (D) containing a repeating unit represented by formula (II) and a repeating unit represented by formula (III) are set forth below, but the present invention is not limited thereto.

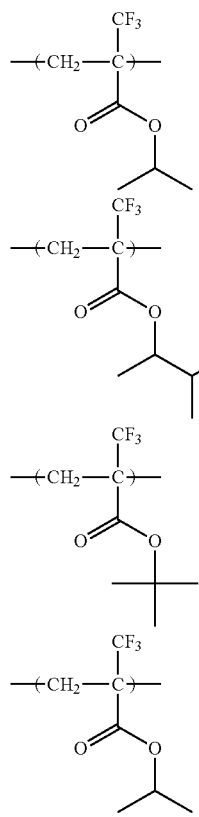

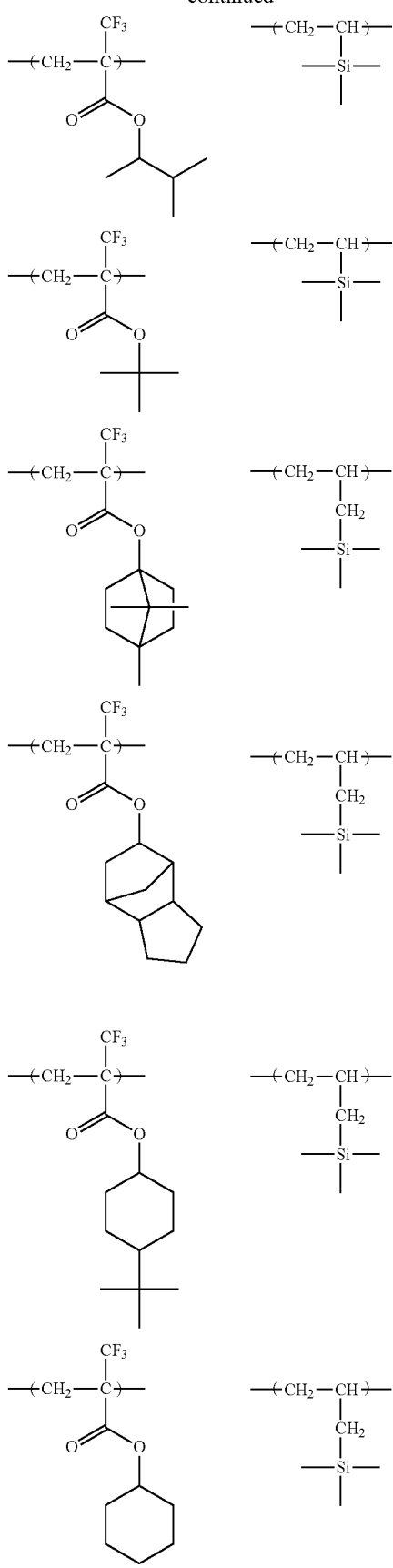

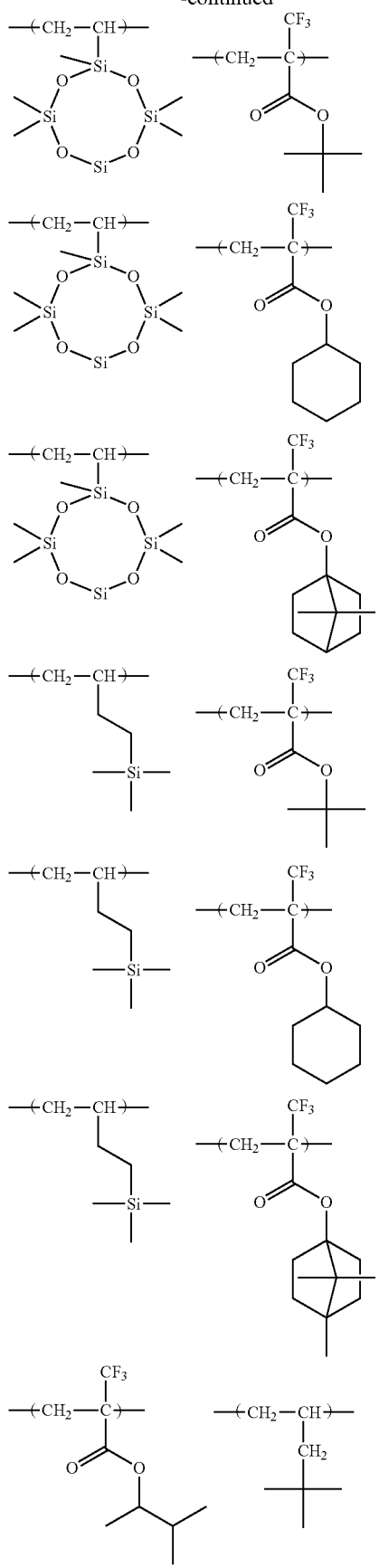

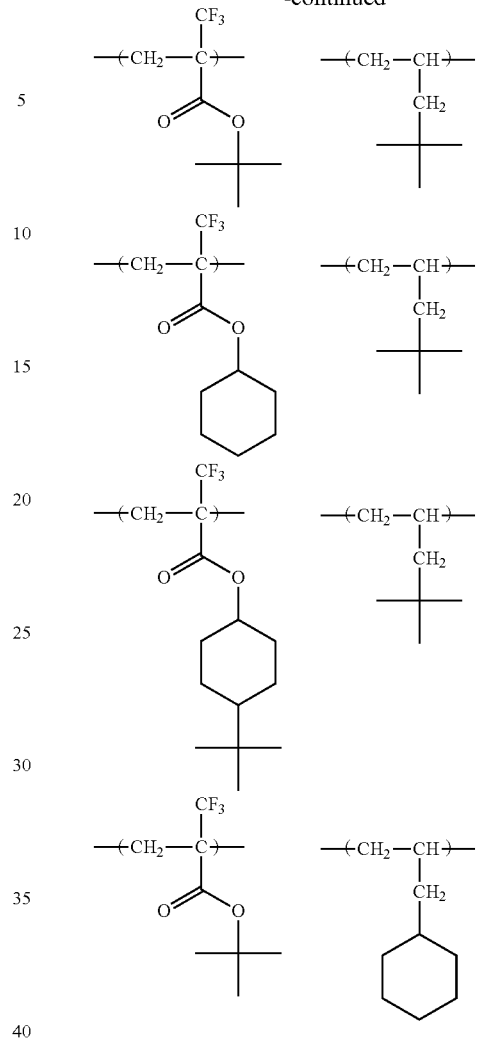

The resin (D) may contain a repeating unit represented by the following formula (VIII):

(VIII)

In formula (VIII), $Z_2$ represents —O— or —N($R_{41}$)—. $R_{41}$ represents a hydrogen atom, an alkyl group or —$OSO_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

The resin (D) is preferably solid at ordinary temperature (25° C.). Furthermore, the glass transition temperature (Tg) is preferably from 50 to 200° C., more preferably from 80 to 160° C.

When the resin is solid at 25° C., this means that the melting point is 25° C. or more.

The glass transition temperature (Tg) can be measured by a scanning calorimeter (Differential Scanning calorimeter). For example, the glass transition temperature can be measured by once heating and then cooling the sample, again raising the temperature at 5° C./min, and analyzing the value when the specific volume is changed.

The resin (D) may contain (x) an alkali-soluble group, (y) a group capable of decomposing by the action of an alkali (alkali developer) to increase the solubility in an alkali developer, and (z) a group capable of decomposing by the action of an acid to increase the solubility in a developer.

In the resin (D), the total amount of repeating units having an alkali-soluble group or a group whose solubility in a developer increases by the action of an acid or alkali is preferably 50 mol % or less, more preferably from 0 to 35 mol %, still more preferably from 0 to 20 mol %, based on all repeating units constituting the resin (D).

Also, unlike a surfactant generally used for resists, the resin (D) does not have an ionic bond or a hydrophilic group such as (poly(oxyalkylene)) group.

Examples of the alkali-soluble group (x) include groups having a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group or a tris(alkylsulfonyl)methylene group.

Examples of the group (y) capable of decomposing by the action of an alkali (alkali developer) to increase the solubility in an alkali developer include a lactone group, an ester group, a sulfonamide group, an acid anhydride and an acid imide group.

Examples of the group (z) capable of decomposing by the action of an acid to increase the solubility in a developer include the same groups as those of the acid-decomposable group in the acid-decomposable resin (A).

In the case where the resin (D) contains a silicon atom, the silicon atom content is preferably from 2 to 50 mass %, more preferably from 2 to 30 mass %, based on the molecular weight of the resin (D). Also, the silicon atom-containing repeating unit preferably occupies from 10 to 100 mass %, more preferably from 20 to 100 mass %, in the resin (D).

In the case where the resin (D) contains a fluorine atom, the fluorine atom content is preferably from 5 to 80 mass %, more preferably from 10 to 80 mass %, based on the molecular weight of the resin (D). Also, the fluorine atom-containing repeating unit preferably occupies from 10 to 100 mass %, more preferably from 30 to 100 mass %, in the resin (D).

The standard polystyrene-reduced weight average molecular of the resin (D) is preferably from 1,000 to 100,000, more preferably from 1,000 to 50,000, still more preferably from 2,000 to 15,000, yet still more preferably from 3,000 to 15,000.

The residual monomer amount in the resin (D) is preferably from 0 to 10 mass %, more preferably from 0 to 5 mass %, still more preferably from 0 to 1 mass %. Also, in view of the resolution, resist profile, and side wall, roughness and the like of the resist pattern, the molecular weight distribution (Mw/Mn, also called polydispersity) is preferably from 1 to 5, more preferably from 1 to 3, still more preferably from 1 to 1.5.

The amount added of the resin (D) in the resist composition is preferably from 0.1 to 20 mass %, more preferably from 0.1 to 10 mass %, still more preferably from 0.1 to 5 mass %, even still more preferably from 0.2 to 3.0 mass %, yet even still more preferably from 0.3 to 2.0 mass %, based on the entire solid content of the resist composition.

In the resin (D), similarly to the acid-decomposable resin (A), it is preferred that impurities such as metal are of course little contained and as well, the content of residual monomers or oligomer components is not more than a specific value, for example, 0.1 mass % by HPLC. By satisfying these conditions, not only the resist can be more improved in the sensitivity, resolution, process stability, pattern profile and the like but also a resist free from extraneous substances in liquid or change with aging in the sensitivity and the like can be obtained.

As for the resin (D), various commercially available products may be used or the resin may be synthesized by an ordinary method (for example, radical polymerization)). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the later-described solvent capable of dissolving the composition of the present invention, such as propylene glycol monomethyl ether acetate, propylene glycol monomethyl ether and cyclohexanone. The polymerization is more preferably performed using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methylpropionate). A chain transfer agent may also be used, if desired. The reaction concentration is usually from 5 to 50 mass %, preferably from 20 to 50 mass %, more preferably from 30 to 50 mass %, and the reaction temperature is usually from 10 to 150° C., preferably from 30 to 120° C., more preferably from 60 to 100° C.

After the completion of reaction, the reaction product is allowed to cool to room temperature and purified. The purification may be performed by a normal method, for example, a liquid-liquid extraction method of combining water washing with an appropriate solvent to remove residual monomers or oligomer components; a purification method in a solution sate, such as ultrafiltration of extracting and removing only polymers having a molecular weight lower than a specific molecular weight; a reprecipitation method of adding dropwise the resin solution in a poor solvent to solidify the resin in the poor solvent and thereby remove residual monomers and the like; or a purification method in a solid state, such as washing of the resin slurry with a poor solvent after separation by filtration. For example, the resin is precipitated as a solid by contacting it with a solvent in which the resin is sparingly soluble or insoluble (poor solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent used may be appropriately selected according to the kind of the polymer from, for example, a hydrocarbon (an aliphatic hydrocarbon such as pentane, hexane, heptane and octane; an alicyclic hydrocarbon such as cyclohexane and methylcyclohexane; and an aromatic hydrocarbon such as benzene, toluene and xylene), a halogenated hydrocarbon (a halogenated aliphatic hydrocarbon such as methylene chloride, chloroform and carbon tetrachloride; and a halogenated aromatic hydrocarbon such as chlorobenzene and dichlorobenzene), a nitro compound (e.g., nitromethane, nitroethane), a nitrile (e.g., acetonitrile, benzonitrile), an ether (a chain ether such as diethyl ether, diisopropyl ether and dimethoxyethane; and a cyclic ether such as tetrahydrofuran and dioxane), a ketone (e.g., acetone, methyl ethyl ketone, diisobutyl ketone), an ester (e.g., ethyl acetate, butyl acetate), a carbonate (e.g., dimethyl carbonate, diethyl carbonate, ethylene carbonate, propylene carbonate), an alcohol (e.g., methanol, ethanol, propanol, isopropyl alcohol, butanol), a carboxylic acid (e.g., acetic acid), water, and a mixed solvent containing such a solvent. Among these, the precipitation or reprecipitation solvent is preferably a solvent containing at least an alcohol (particularly methanol or the like) or water. In such a solvent containing at least a hydrocarbon, the ratio of the alcohol (particularly methanol or the like) to other solvents (for example, an ester such as ethyl acetate, and ethers such as tetrahydrofuran) is approximately, for example, the former/the latter (volume ratio, at 25° C.)=from 10/90 to 99/1, preferably the former/the latter (volume ratio, at 25° C.)=from 30/70 to 98/2, more preferably the former/the latter (volume ratio, at 25° C.)=from 50/50 to 97/3.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The nozzle bore diameter at the time of feeding the polymer solution into the precipitation or reprecipitation solvent (poor solvent) is preferably 4 mmφ or less (for example, from 0.2 to 4 mmφ), and the feeding rate (dropping rate) of the polymer solution into the poor solvent is, for example, in terms of the linear velocity, from 0.1 to 10 m/sec, preferably on the order of 0.3 to 5 m/sec.

The precipitation or reprecipitation operation is preferably performed under stirring. Examples of the stirring blade which can be used for stirring include a disc turbine, a fan turbine (including paddle), a curved vane turbine, a feathering turbine, a Pfaudler type, a bull margin type, an angled vane fan turbine, a propeller, a multistage type, an anchor type (or horseshoe type), a gate type, a double ribbon and a screw. The stirring is preferably continued for 10 minutes or more, more preferably 20 minutes or more, even after the completion of feeding of the polymer solution. If the stirring time is short, the monomer content in the polymer particle may not be sufficiently reduced. The mixing and stirring of the polymer solution and the poor solvent may also be performed using a line mixer instead of the stirring blade.

The temperature at the precipitation or reprecipitation may be appropriately selected by taking into account the efficiency or operability, but the temperature is usually on the order of 0 to 50° C., preferably in the vicinity of room temperature (for example, approximately from 20 to 35° C.). The precipitation or reprecipitation operation may be performed using a commonly employed mixing vessel such as stirring tank according to a known method such as batch system and continuous system.

The precipitated or reprecipitated particulate polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble.

More specifically, there may be used a method comprising, after the completion of radical polymerization reaction, precipitating a resin by bringing the polymer into contact with a solvent in which the polymer is sparingly soluble or insoluble (step a), separating the resin from the solution (step b), anew dissolving the resin in a solvent to prepare a resin solution A (step c), precipitating a resin solid by bringing the resin solution A into contact with a solvent in which the resin is sparingly soluble or insoluble and which is in a volume amount of less than 10 times (preferably a volume amount of 5 times or less) the resin solution A (step d), and separating the precipitated resin (step e).

As for the solvent used at the preparation of the resin solution A, a solvent similar to the solvent used for dissolving the monomer at the polymerization reaction may be used, and the solvent may be the same as or different from the solvent used at the polymerization reaction.

(E) Basic Compound

The resist composition of the present invention preferably contains (E) a basic compound for reducing the change of performance with aging from exposure to heating.

Preferred examples of the basic compound include compounds having a structure represented by any one of the following formulae (A) to (E):

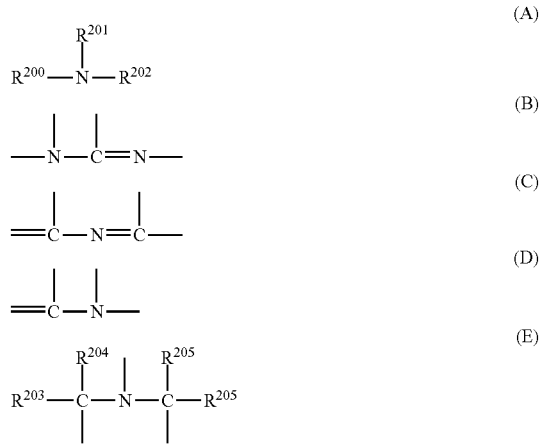

In formulae (A) to (E), each of $R^{200}$, $R^{201}$ and $R^{202}$, which may be the same or different, represents a hydrogen atom, an alkyl group (preferably having a carbon number of 1 to 20), a cycloalkyl group (preferably having a carbon number of 3 to 20) or an aryl group (having a carbon number of 6 to 20), and $R^{201}$ and $R^{202}$ may combine with each other to form a ring.

As for the alkyl group, the alkyl group having a substituent is preferably an aminoalkyl group having a carbon number of 1 to 20, a hydroxyalkyl group having a carbon number of 1 to 20, or a cyanoalkyl group having a carbon number of 1 to 20.

Each of $R^{203}$, $R^{204}$, $R^{205}$ and $R^{206}$, which may be the same or different, represents an alkyl group having a carbon number of 1 to 20.

The alkyl group in these formulae (A) to (E) is more preferably unsubstituted.

Preferred examples of the compound include guanidine, aminopyrrolidine, pyrazole, pyrazoline, piperazine, aminomorpholine, aminoalkylmorpholine and piperidine. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include triarylsulfonium hydroxide, phenacylsulfonium hydroxide and sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. Examples of the compound having an onium carboxylate structure include a compound where the anion moiety of the compound having an onium hydroxide structure is converted into a carboxylate, such as acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline and N,N-dihexylaniline. Examples of the alkylamine derivative having a hydroxyl group and/or an ether bond include ethanolamine, diethanolamine, triethanolamine and tris(methoxyethoxyethyl)amine. Examples of the aniline derivative having a hydroxyl group and/or an ether bond include N,N-bis(hydroxyethyl)aniline.

One of these basic compounds is used alone, or two or more kinds thereof are used in combination.

The amount of the basic compound used is usually from 0.001 to 10 mass %, preferably from 0.01 to 5 mass %, based on the solid content of the resist composition.

The ratio between the acid generator and the basic compound used in the composition is preferably acid generator/basic compound (by mol)=from 2.5 to 300. That is, the molar ratio is preferably 2.5 or more in view of sensitivity and resolution and preferably 300 or less from the standpoint of suppressing the reduction in resolution due to thickening of the resist pattern with aging after exposure until heat treatment. The acid generator/basic compound (by mol) is more preferably from 5.0 to 200, still more preferably from 7.0 to 150.

(F) Surfactant

The resist composition of the present invention preferably further contains (F) a surfactant, more preferably any one fluorine-containing and/or silicon-containing surfactant (a fluorine-containing surfactant, a silicon-containing surfactant or a surfactant containing both a fluorine atom and a silicon atom), or two or more kinds thereof.

When the resist composition of the present invention contains (F) a surfactant, a resist pattern with good sensitivity, resolution and adherence as well as less development defects can be obtained in using an exposure light source of 250 nm or less, particularly 220 nm or less.

Examples of the fluorine-containing and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Kasei K.K.); Florad FC430, 431 and 4430 (produced by Sumitomo 3M Inc.); Megaface F171, F173, F176, F189, F113, F110, F177, F120 and R08 (produced by Dainippon Ink & Chemicals, Inc.); Surflon S-382, SC101, 102, 103, 104, 105 and 106 (produced by Asahi Glass Co., Ltd.); Troysol S-366 (produced by Troy Chemical); GF-300 and GF-150 (produced by Toagosei Chemical Industry Co., Ltd.); Surflon S-393 (produced by Seimi Chemical Co., Ltd.); EFtop EF121, EF122A, EF122B, RF122C, EF125M, EF135M, EF351, 352, EF801, EF802 and EF601 (produced by JEMCO Inc.); PF636, PF656, PF6320 and PF6520 (produced by OMNOVA); and FTX-204D, 208G, 218G, 230G, 204D, 208D, 212D, 218 and 222D (produced by NEOS Co., Ltd.). In addition, polysiloxane polymer KP-341 (produced by Shin-Etsu Chemical Co., Ltd.) may also be used as the silicon-containing surfactant.

Other than those known surfactants, a surfactant using a polymer having a fluoro-aliphatic group derived from a fluoro-aliphatic compound which is produced by a telomerization process (also called a telomer process) or an oligomerization process (also called an oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the copolymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) is not limited only to a binary copolymer but may also be a ternary or greater copolymer obtained by simultaneously copolymerizing two or more different fluoro-aliphatic group-containing monomers or two or more different (poly(oxyalkylene)) acrylates (or methacrylates).

Examples thereof include, as the commercially available surfactant, Megaface F178, F-470, F-473, F-475, F-476 and F-472 (produced by Dainippon Ink & Chemicals, Inc.) and further include a copolymer of a $C_6F_{13}$ group-containing acrylate (or methacrylate) with a (poly(oxyalkylene)) acrylate (or methacrylate), and a copolymer of a $C_3F_7$ group-containing acrylate (or methacrylate) with a (poly(oxyethylene)) acrylate (or methacrylate) and a (poly(oxypropylene)) acrylate (or methacrylate).

In the present invention, a surfactant other than the fluorine-containing and/or silicon-containing surfactant may also be used. Specific examples thereof include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene.polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate), and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate).

One of these surfactants may be used alone, or several kinds thereof may be used in combination.

The amount of the surfactant (F) used is preferably from 0.01 to 10 mass %, more preferably from 0.1 to 5 mass %, based on the entire amount of the resist composition (excluding the solvent).

(G) Onium Carboxylate

The resist composition of the present invention may contain (G) an onium carboxylate. Examples of the onium carboxylate include sulfonium carboxylate, iodonium carboxylate and ammonium carboxylate. In particular, the onium carboxylate (G) is preferably an iodonium salt or a sulfonium salt. Furthermore, the carboxylate residue of the onium carboxylate (H) for use in the present invention preferably contains no aromatic group and no carbon-carbon double bond. The anion moiety is preferably a linear, branched, monocyclic or polycyclic alkylcarboxylate anion having a carbon number of 1 to 30, more preferably an anion of the carboxylic acid with the alkyl group being partially or entirely fluorine-substituted. The alkyl chain may contain an oxygen atom. Thanks to such a construction, the transparency to light of 220 nm or less is ensured, the sensitivity and resolution are enhanced, and the iso/dense bias and exposure margin are improved.

Examples of the anion of the fluorine-substituted carboxylic acid include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid and 2,2-bistrifluoromethylpropionic acid.

These onium carboxylates (G) can be synthesized by reacting a sulfonium, iodonium or ammonium hydroxide and a carboxylic acid with silver oxide in an appropriate solvent.

The content of the onium carboxylate (G) in the composition is generally from 0.1 to 20 mass %, preferably from 0.5 to 10 mass %, more preferably from 1 to 7 mass %, based on the entire solid content of the composition.

(H) Other Additives

The resist composition of the present invention may further contain, for example, a dye, a compound capable of generating an acid under heating, a plasticizer, a photosensitizer, a light absorber, an alkali-soluble resin, a dissolution inhibitor and a compound for accelerating dissolution in a developer (for example, a phenol compound having a molecular weight of 1,000 or less, or a carboxyl group-containing alicyclic or aliphatic compound), if desired.

As for the compound capable of generating an acid under heating, various compounds known in this field can be used. Examples thereof include known compounds such as sulfonium salt-type compound, anilinium salt-type compound, pyridinium salt-type compound, phosphonium salt-type compound and iodonium salt-type compound. Examples of the counter anion of such an onium salt-type compound include $SbF_6^-$, $BF_4^-$, $AsF_6^-$, $PF_6^-$, toluene sulfonate and triflate.

The temperature when generating an acid is preferably 200° C. or less, more preferably 170° C. or less.

The phenol compound having a molecular weight of 1,000 or less can be easily synthesized by one skilled in the art by referring to the method described, for example, in JP-A-4-122938, JP-A-2-28531, U.S. Pat. No. 4,916,210 and European Patent 219294.

Specific examples of the carboxyl group-containing alicyclic or aliphatic compound include, but are not limited to, a carboxylic acid derivative having a steroid structure, such as cholic acid, deoxycholic acid and lithocholic acid, an adamantanecarboxylic acid derivative, an adamantanedicarboxylic acid, a cyclohexanecarboxylic acid and a cyclohexanedicarboxylic acid.

EXAMPLES

The present invention is described below by referring to Examples, but the present invention should not be construed as being limited thereto.

Synthesis Example 1

Synthesis of Resin (A1)

Under a nitrogen stream, 20 g of a 6/4 (by mass) mixed solvent of propylene glycol monomethyl ether acetate and propylene glycol monomethyl ether was charged into a three-neck flask and heated at 80° C. (Solvent 1). Also, γ-butyrolactone methacrylate, hydroxyadamantane methacrylate and 2-methyl-2-adamantyl methacrylate were dissolved in a molar ratio of 40/30/30 in a 6/4 (by mass) mixed solvent of propylene glycol monomethyl ether acetate and propylene glycol monomethyl ether to prepare a 22 mass % monomer solution (200 g). Thereto, an initiator V-601 (produced by Wako Pure Chemical Industries, Ltd.) was added and dissolved in an amount of 8 mol % based on the monomers. The resulting solution was added dropwise to Solvent 1 over 6 hours and after the completion of dropwise addition, the reaction was further allowed to proceed at 80° C. for 2 hours. The reaction solution was left standing to cool and then poured in 1,800 ml of hexane/200 ml of ethyl acetate, and the powder precipitated was collected by filtration and dried, as a result, 37 g of Resin (A1) was obtained. The weight average molecular weight of the obtained Resin (A1) was 9,500 and the polydispersity (Mw/Mn) was 1.80.

Resin (A1):

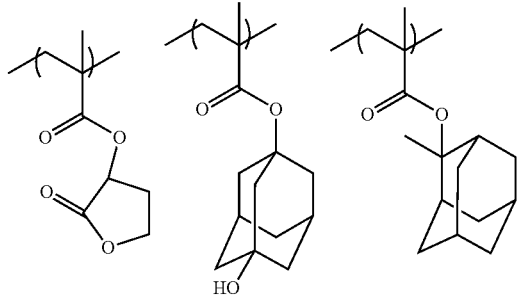

Mw = 9,500, Mw/Mn = 1.80
Molar compositional ratio: 40/30/30

Preparation of Resist Composition (A1):

The components shown below were dissolved in a mixed solvent of propylene glycol monomethyl ether acetate/propylene glycol monomethyl ether (60:40 (by mass)), and the obtained solution having a solid content concentration of 5.8 mass % was filtered through a polyethylene filter having a pore size of 0.05 μm to prepare Resist Composition (A1).

| | |
|---|---|
| (Resin A1) | 1.83 g |
| Triphenylsulfonium nonaflate | 69.6 mg |
| 2,6-Diisopropylaniline (basic compound) | 8.7 mg |
| PF6320 (fluorine-containing surfactant, produced by OMNOVA) | 1.7 mg |

Preparation of Resist Composition (A2):

Resist Composition (A2) was prepared by blending Resin (A2) shown below in place of Resin (A1).

Resin (A2):

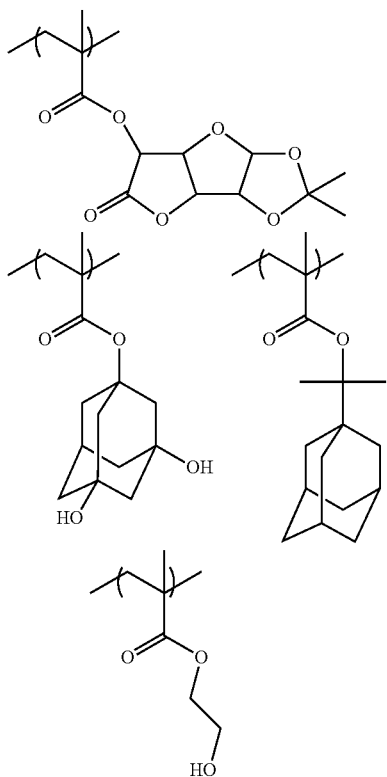

Mw = 8,000, Mw/Mn = 1.65
Molar compositional ratio: 40/20/30/10

Preparation of Resist Composition (A3):

Resist Composition (A3) was prepared by blending Resin (A3) shown below in place of Resin (A1).

Resin (A3):

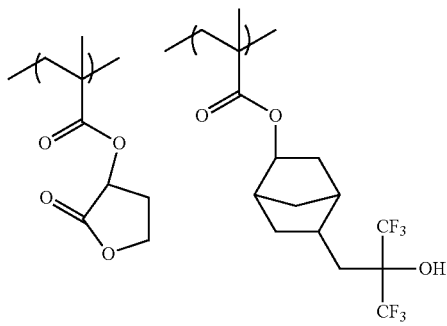

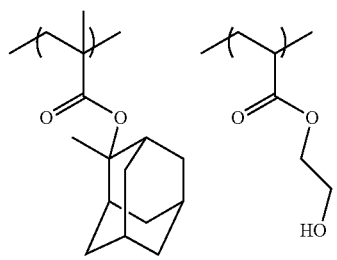

Mw = 7,500, Mw/Mn = 1.80
Molar compositional ratio: 35/20/40/5

Preparation of Resist Composition (A4):

The components shown below were dissolved in a mixed solvent of propylene glycol monomethyl ether acetate/propylene glycol monomethyl ether (60:40 (by mass)), and the obtained solution having a solid content concentration of 4.0 mass % was filtered through a polyethylene filter having a pore size of 0.05 μm to prepare Resist Composition (A4).

Amounts of Components in Resist Composition (A4):

| | |
|---|---|
| (Resin A4) | 1.03 g |
| (Resin D1) | 5.5 mg |
| (Photo-Acid Generator: MP1) | 94.0 mg |
| (Basic Compound: MQ1) | 12.5 mg |
| PF6320 (fluorine-containing surfactant, produced by OMNOVA) | 3.0 mg |

(Resin A4):

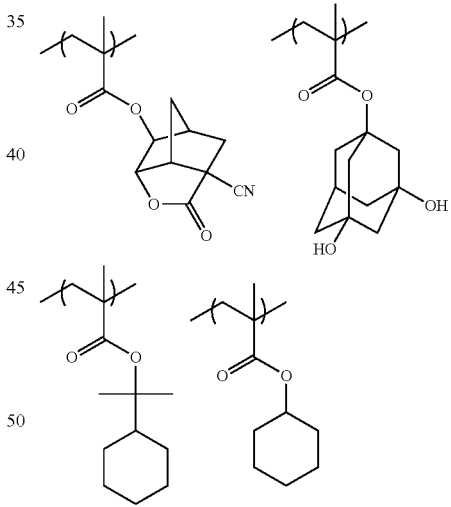

Mw = 10,000, Mw/Mn = 1.55
Molar compositional ratio: 40/10/40/10

(Resin D1):

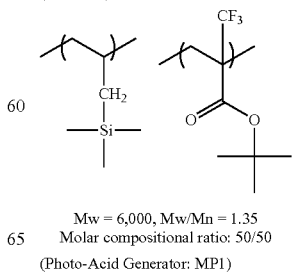

Mw = 6,000, Mw/Mn = 1.35
Molar compositional ratio: 50/50

(Photo-Acid Generator: MP1)

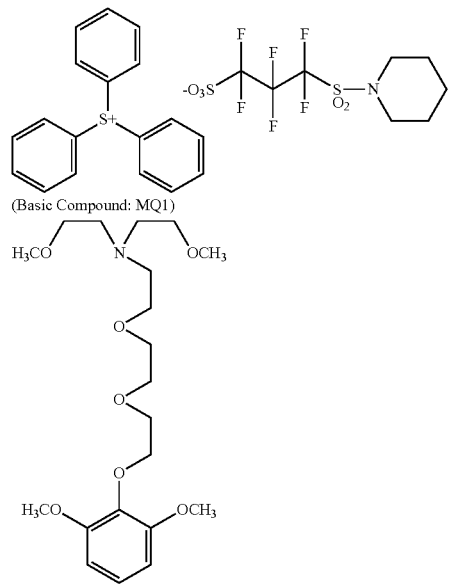

(Basic Compound: MQ1)

Preparation of Resist Composition (A5):

The components shown below were dissolved in a mixed solvent of propylene glycol monomethyl ether acetate/propylene glycol monomethyl ether (80:20 (by mass)), and the obtained solution having a solid content concentration of 4.0 mass % was filtered through a polyethylene filter having a pore size of 0.05 μm to prepare Resist Composition (A5).

Amounts of Components in Resist Composition (A5):

| | |
|---|---|
| (Resin A5) | 1.03 g |
| (Resin D2) | 10.5 mg |
| (Photo-Acid Generator: MP2) | 105.0 mg |
| (Basic Compound: MQ2) | 9.7 mg |
| Megaface F176 (produced by Dainippon Ink & Chemicals, Inc., fluorine-containing surfactant) | 1.5 mg |

(Resin A5)

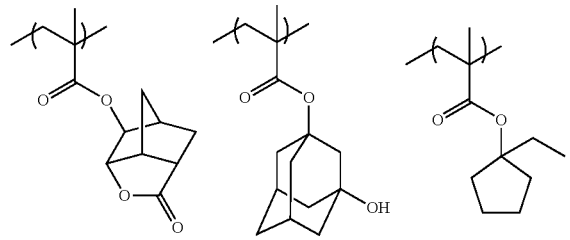

Mw = 8,000, Mw/Mn = 1.45
Molar compositional ratio: 40/10/50

(Resin D2)

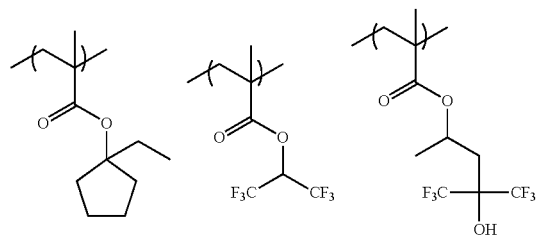

Mw = 6,000, Mw/Mn = 1.35
Molar compositional ratio: 30/60/10

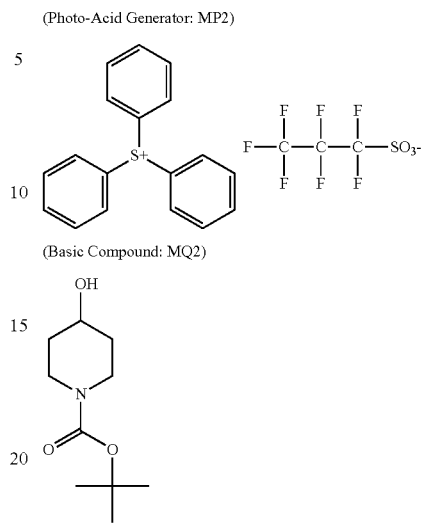

(Photo-Acid Generator: MP2)

(Basic Compound: MQ2)

Preparation of Resist Composition (A6):

The components shown below were dissolved in a mixed solvent of propylene glycol monomethyl ether acetate/propylene glycol monomethyl ether (80:20 (by mass)), and the obtained solution having a solid content concentration of 3.5 mass % was filtered through a polyethylene filter having a pore size of 0.05 μm to prepare Resist Composition (A6).

Amounts of Components in Resist Composition (A6):

| | |
|---|---|
| (Resin A6) | 1.03 g |
| (Resin D3) | 10.5 mg |
| (Photo-Acid Generator: MP3) | 8.0 mg |
| (Basic Compound: MQ3) | 7.7 mg |
| Megaface R08 (produced by Dainippon Ink & Chemicals, Inc., fluorine- and silicone-containing surfactant) | 1.5 mg |

(Resin A6)

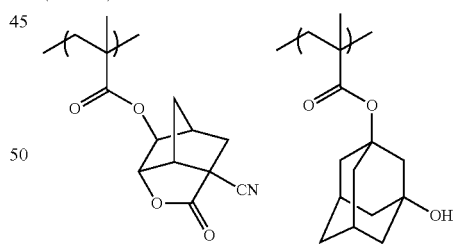

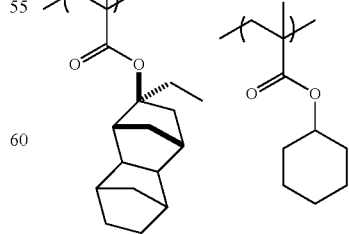

Mw = 12,000, Mw/Mn = 1.72
Molar compositional ratio: 40/7/40/13

(Resin D3)

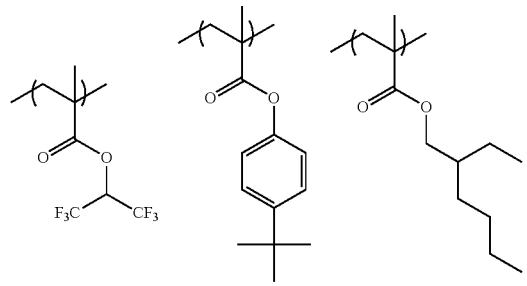

Mw = 4,500, Mw/Mn = 1.45
Molar compositional ratio: 50/40/10

(Photo-Acid Generator: MP3)

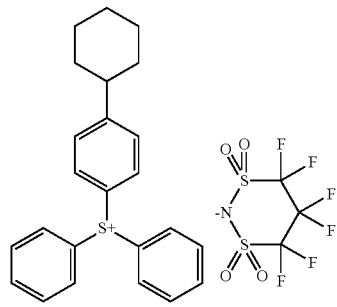

(Basic Compound: MQ3)

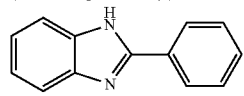

Preparation of Crosslinked Layer-Forming Material (B1):

The components shown below were dissolved in 190 g of pure water, and the obtained solution was filtered through a polyethylene filter having a pore size of 0.05 μm to prepare water-soluble Crosslinked Layer-Forming Material (B1).
(Components)

| Polyvinyl acetal resin, S-LEC KW3 (produced by Sekisui Chemical Co., Ltd.) | 8 g |
| (N-Methoxymethyl)methoxyethylene urea | 2 g |
| Megaface R-08 (produced by Dainippon Ink & Chemicals, Inc., surfactant) | 0.001 g |

Preparation of Crosslinked Layer-Forming Material (B2):

The components shown below were dissolved in 182 g of pure water, and the obtained solution was filtered through a polyethylene filter having a pore size of 0.05 μm to prepare water-soluble Crosslinked Layer-Forming Material (B2).
(Components)

| Polyvinyl acetal resin, S-LEC KW3 (produced by Sekisui Chemical Co., Ltd.) | 16 g |
| Tetramethoxymethyl glycol uril | 2 g |
| Megaface R-08 (produced by Dainippon Ink & Chemicals, Inc., surfactant) | 0.001 g |

Preparation of Crosslinked Layer-Forming Material (B3):

The components shown below were dissolved in 190 g of pure water, and the obtained solution was filtered through a polyethylene filter having a pore size of 0.05 μm to prepare water-soluble Crosslinked Layer-Forming Material (B3).
(Components)

| Polyvinyl alcohol resin | 8 g |
| (N-Methoxymethyl)methoxyethylene urea | 2 g |
| Megaface R-08 (produced by Dainippon Ink & Chemicals, Inc., surfactant) | 0.001 g |

Preparation of Crosslinked Layer-Forming Material (B4):

The components shown below were dissolved in 190 g of a 90/10 (by weight) 3-methyl-1-butanol/isopropanol mixed solvent, and the obtained solution was filtered through a polyethylene filter having a pore size of 0.05 μm to prepare water-insoluble Crosslinked Layer-Forming Material (B4).
(Components)

| Resin (A7) | 8 g |
| (N-Methoxymethyl)methoxyethylene urea | 2 g |
| PF6320 (produced by OMNOVA, fluorine-containing surfactant) | 0.001 g |

Here, Resin (A7) was synthesized using the same method as that for Resin (A1).
(Resin A7)

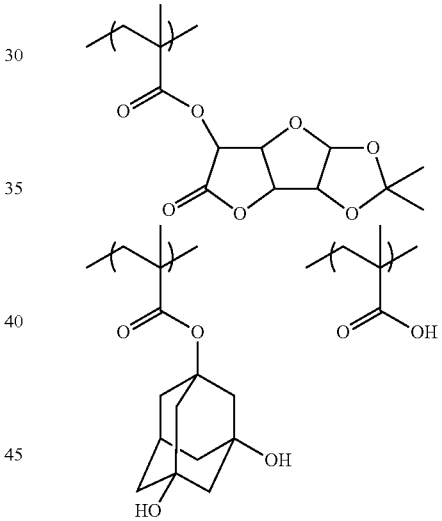

Mw = 7,100, Mw/Mn = 1.80
Molar compositional ratio: 40/20/40

Preparation of Crosslinked Layer-Forming Material (B5):

The components shown below were dissolved in 190 g of 1-butanol, and the obtained solution was filtered through a polyethylene filter having a pore size of 0.05 μm to prepare Crosslinked Layer-Forming Material (B5).
(Components)

| Poly-p-hydroxystyrene resin VP8000 (produced by Nippon Soda Co., Ltd. | 5.5 g |
| CYMEL 300 (produced by Kyoeisha Chemical Co., Ltd., hexamethoxymethylmelamine resin) | 3 g |

Preparation of Crosslinked Layer-Forming Material (B6):

The components shown below were dissolved in 190 g of pure water, and the obtained solution was filtered through a polyethylene filter having a pore size of 0.05 μm to prepare Crosslinked Layer-Forming Material (B6).
(Components)

| | |
|---|---|
| Oxazoline group-containing resin, EPOCROS WS-500 (produced by Nippon Shokubai Co., Ltd.) | 7.5 g |
| Denacol EX-512 (produced by Nagase ChemteX Corporation, polyglycerol polyglycidyl ether) | 2 g |

Example 1

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A2) prepared above was spin-coated thereon and baked at 100° C. for 60 seconds to form a resist film of 200 nm in thickness. The wafer having coated thereon a resist film was subjected to pattern exposure using an ArF excimer laser scanner (PAS5500/1100, manufactured by ASML, NA: 0.75). Thereafter, the wafer was heated at 115° C. for 60 seconds and then developed with butyl acetate (negative tone development) for 30 seconds, and after rinsing with 1-hexanol for 30 seconds, the wafer was spun at a rotation speed of 4,000 rpm to obtain a trench pattern having a space width of 100 nm and a line width of 300 nm.
(Formation of Crosslinked Film)

Crosslinked Layer-Forming Material (B1) was spin-coated at 1,500 rpm on the wafer having formed thereon the resist pattern and baked at 85° C. for 70 seconds (pre-baking) to form a film composed of the crosslinked layer-forming material on the resist pattern. Thereafter, the wafer was baked at 110° C. for 90 seconds (mixing baking) to form a crosslinked layer at the interface between the resist pattern and the film composed of the crosslinked layer-forming material, then developed with pure water for 60 seconds to remove the non-crosslinked layer, and further baked at 90° C. for 90 seconds (post-baking) to obtain a demagnified pattern where a crosslinked layer was formed on a resist pattern.

Examples 2 to 5

Demagnified patters where a crosslinked layer was formed on a resist pattern were obtained by the same method as in Example 1 except that the resist composition and the crosslinked layer-forming material used were combined as shown in Table 1.

Example 6

A demagnified pattern where a crosslinked layer was formed on a resist pattern was obtained by the same method as in Example 1 except that the resist composition and crosslinked layer-forming material used were combined as shown in Table 1 and an aqueous 2.38% tetramethylammonium solution was used for removing the non-crosslinked layer of the film composed of a crosslinked layer-forming material.

In Table 1, the development system and developer employed when developing the resist film to obtain a resist pattern as well as the temperature of mixing baking for forming a crosslinked layer are shown.

Example 7

A demagnified pattern where a crosslinked layer was formed on a resist pattern was obtained by the same method as in Example 1 except that the mixing baking when forming a crosslinked layer was performed at 100° C. for 90 seconds.

Example 8

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A4) prepared above was spin-coated thereon and baked at 100° C. for 60 seconds to form a resist film of 100 nm in thickness. The wafer having coated thereon a resist film was subjected to immersion exposure with pure water as the immersion liquid by using an ArF excimer laser scanner (TWINSCAN XT:1700Fi, manufactured by ASML, NA: 1.2) through an exposure mask having a desired pattern. Thereafter, the wafer was heated at 115° C. for 60 seconds and then developed with butyl acetate for 30 seconds (negative tone development), and after rinsing with 1-hexanol for 30 seconds, the wafer was spun at a rotation speed of 4,000 rpm, thereby throwing off the remaining rinsing solution. Subsequently, the wafer was heated at 90° C. for 90 seconds to completely remove the solvent remaining on the substrate and then cooled to room temperature to obtain a trench pattern having a space width of 100 nm and a line width of 300 nm.
(Formation of Crosslinked Film)

Crosslinked Layer-Forming Material (B5) was spin-coated at 1,500 rpm on the wafer having formed thereon the resist pattern and baked at 155° C. for 90 seconds (mixing baking) to form a crosslinked layer at the interface between the resist pattern and a film composed of the crosslinked layer-forming material, and the wafer was then developed with an aqueous 2.38% tetramethylammonium solution for 60 seconds to remove the non-crosslinked layer and further baked at 90° C. for 90 seconds (post-baking) to obtain a demagnified pattern where a crosslinked layer was formed on a resist pattern.

Example 9

A demagnified pattern where a crosslinked layer was formed on a resist pattern was obtained by the same method as in Example 8 except that the resist composition and crosslinked layer-forming material used and the temperature of mixing baking for forming the crosslinked layer were combined as shown in Table 1.

Example 10

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A5) prepared above was spin-coated thereon and baked at 120° C. for 60 seconds to form a resist film of 100 nm in thickness. The wafer having coated thereon a resist film was subjected to immersion exposure with pure water as the immersion liquid by using an ArF excimer laser scanner (TWINSCAN XT:1700Fi, manufactured by ASML, NA: 1.2) through an exposure mask having a desired pattern. Thereafter, the wafer was heated at 120° C.

for 60 seconds and then developed with butyl acetate for 60 seconds (negative tone development), and after rinsing with 1-hexanol for 30 seconds, the wafer was spun at a rotation speed of 4,000 rpm, thereby throwing off the remaining rinsing solution. Subsequently, the wafer was heated at 90° C. for 90 seconds to completely remove the solvent remaining on the substrate and then cooled to room temperature to obtain a trench pattern having a space width of 100 nm and a line width of 300 nm.
(Formation of Crosslinked Film)

Crosslinked Layer-Forming Material (B5) was spin-coated at 1,500 rpm on the wafer having formed thereon the resist pattern and baked at 155° C. for 90 seconds (mixing baking) to form a crosslinked layer at the interface between the resist pattern and a film composed of the crosslinked layer-forming material, and the wafer was then developed with an aqueous 2.38% tetramethylammonium solution for 60 seconds to remove the non-crosslinked layer and further baked at 90° C. for 90 seconds (post-baking) to obtain a demagnified pattern where a crosslinked layer was formed on a resist pattern.

Example 11

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A6) prepared above was spin-coated thereon and baked at 95° C. for 60 seconds to form a resist film of 90 nm in thickness. The wafer having coated thereon a resist film was subjected to exposure by using an ArF excimer laser scanner (PAS5500/1100, manufactured by ASML, NA: 0.75) through an exposure mask having a desired pattern. Thereafter, the wafer was heated at 110° C. for 60 seconds and then developed with butyl acetate for 30 seconds (negative tone development), and after rinsing with 1-hexanol for 30 seconds, the wafer was spun at a rotation speed of 4,000 rpm, thereby throwing off the remaining rinsing solution. Subsequently, the wafer was heated at 90° C. for 90 seconds to completely remove the solvent remaining on the substrate and then cooled to room temperature to obtain a trench pattern having a space width of 100 nm and a line width of 300 nm.
(Formation of Crosslinked Film)

Crosslinked Layer-Forming Material (B1) was spin-coated at 1,500 rpm on the wafer having formed thereon the resist pattern and baked at 110° C. for 90 seconds (mixing baking) to form a crosslinked layer at the interface between the resist pattern and a film composed of the crosslinked layer-forming material, and the wafer was then developed with an aqueous 2.38% tetramethylammonium solution for 60 seconds to remove the non-crosslinked layer and further baked at 90° C. for 90 seconds (post-baking) to obtain a demagnified pattern where a crosslinked layer was formed on a resist pattern.

Example 12

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A5) prepared above was spin-coated thereon and baked at 95° C. for 60 seconds to form a resist film of 90 nm in thickness. The wafer having coated thereon a resist film was subjected to exposure by using an ArF excimer laser scanner (PAS5500/1100, manufactured by ASML, NA: 0.75) through an exposure mask having a desired pattern. Thereafter, the wafer was heated at 110° C. for 60 seconds and then developed with butyl acetate for 30 seconds (negative tone development), and after rinsing with 4-methyl-2-pentanone for 30 seconds, the wafer was spun at a rotation speed of 4,000 rpm, thereby throwing off the remaining rinsing solution. Subsequently, the wafer was heated at 90° C. for 90 seconds to completely remove the solvent remaining on the substrate and then cooled to room temperature to obtain a trench pattern having a space width of 100 nm and a line width of 300 nm.
(Formation of Crosslinked Film)

Crosslinked Layer-Forming Material (B4) was spin-coated at 1,500 rpm on the wafer having formed thereon the resist pattern and baked at 140° C. for 90 seconds (mixing baking) to form a crosslinked layer at the interface between the resist pattern and a film composed of the crosslinked layer-forming material, and the wafer was then developed with butyl acetate for 30 seconds to remove the non-crosslinked layer to obtain a demagnified pattern where a crosslinked layer was formed on a resist pattern.

Example 13

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A5) prepared above was spin-coated thereon and baked at 95° C. for 60 seconds to form a resist film of 90 nm in thickness. The wafer having coated thereon a resist film was subjected to exposure by using an ArF excimer laser scanner (PAS5500/1100, manufactured by ASML, NA: 0.75) through an exposure mask having a desired pattern. Thereafter, the wafer was heated at 110° C. for 60 seconds and then developed with butyl acetate for 30 seconds (negative tone development), and after rinsing with 4-methyl-2-pentanone for 30 seconds, the wafer was spun at a rotation speed of 4,000 rpm, thereby throwing off the remaining rinsing solution. Subsequently, the wafer was heated at 90° C. for 90 seconds to completely remove the solvent remaining on the substrate and then cooled to room temperature to obtain a trench pattern having a space width of 100 nm and a line width of 300 nm.
(Formation of Crosslinked Film)

Crosslinked Layer-Forming Material (B5) was spin-coated at 1,500 rpm on the wafer having formed thereon the resist pattern and baked at 120° C. for 90 seconds (mixing baking) to form a crosslinked layer at the interface between the resist pattern and a film composed of the crosslinked layer-forming material, and the wafer was then developed with butyl acetate for 30 seconds to remove the non-crosslinked layer to obtain a demagnified pattern where a crosslinked layer was formed on a resist pattern.

Comparative Example 1

Formation of Resist Pattern

An organic antireflection film, ARC29A (produced by Nissan Chemical Industries, Ltd.), was applied on a silicon wafer and baked at 205° C. for 60 seconds to form a 78-nm antireflection film, and Resist Composition (A2) prepared above was spin-coated thereon and baked at 120° C. for 60 seconds to form a resist film of 200 nm in thickness. The wafer having coated thereon a resist film was subjected to pattern exposure by using an ArF excimer laser scanner (PAS5500/1100, manufactured by ASML, NA: 0.75) through an exposure mask differing in the coverage from those used in Examples 1 to 7. Thereafter, the wafer was heated at 120° C. for 60 seconds and then developed with an aqueous 2.38 mass % tetramethylammonium hydroxide solution for 30 seconds (positive tone development), and after rinsing with pure water for 30 seconds, the wafer was spun at a rotation speed of 4,000 rpm to obtain a trench pattern having a space width of 100 nm and a line width of 300 nm.
(Formation of Crosslinked Film)

ducing a line width with a space width of 100 nm±10% by the optimal exposure dose was expressed in percentage (%). A larger value indicates that the line width fluctuation for the change of exposure dose is smaller and the performance is better.
Evaluation of Scum:

The wafer after forming a crosslinked layer on a trench pattern to demagnify the trench dimension was observed using a Critical Dimension scanning electron microscope (S-9260, manufactured by Hitachi, Ltd.) and rated A when a resist residue was not observed at all, B when slightly observed, and C when fairly many were observed.

TABLE 1

|  | Resist Composition | Crosslinked Layer-Forming Material | Developing Method of Resist | Developing Solution For Resist | Mixing Baking Temperature | Demagnification Range of Dimension (nm) | Exposure Latitude (%) | Scum |
|---|---|---|---|---|---|---|---|---|
| Example 1 | A2 | B1 | negative tone | butyl acetate | 110° C. | 30 | 8.0 | B |
| Example 2 | A1 | B1 | negative tone | butyl acetate | 110° C. | 25 | 10.5 | B |
| Example 3 | A3 | B1 | negative tone | butyl acetate | 110° C. | 40 | 9.0 | B |
| Example 4 | A2 | B2 | negative tone | butyl acetate | 110° C. | 35 | 8.0 | B |
| Example 5 | A2 | B3 | negative tone | butyl acetate | 110° C. | 40 | 8.0 | B |
| Example 6 | A2 | B4 | negative tone | butyl acetate | 110° C. | 30 | 8.0 | A |
| Example 7 | A2 | B1 | negative tone | butyl acetate | 100° C. | 25 | 11.0 | B |
| Example 8 | A4 | B5 | negative tone | butyl acetate | 155° C. | 40 | 11.5 | A |
| Example 9 | A4 | B6 | negative tone | butyl acetate | 110° C. | 25 | 11.5 | B |
| Example 10 | A5 | B5 | negative tone | butyl acetate | 155° C. | 40 | 10.0 | A |
| Example 11 | A6 | B1 | negative tone | butyl acetate | 110° C. | 30 | 9.5 | B |
| Example 12 | A5 | B4 | negative tone | butyl acetate | 140° C. | 30 | 9.0 | B |
| Example 13 | A5 | B5 | negative tone | butyl acetate | 120° C. | 30 | 9.0 | B |
| Comparative Example 1 | A2 | B1 | positive tone | aqueous tetramethyl-ammonium solution (2.38 mass %) | 110° C. | 13 | 5.0 | C |

Crosslinked Layer-Forming Material (B1) was spin-coated at 1,500 rpm on the wafer having formed thereon the resist pattern and baked at 85° C. for 70 seconds (pre-baking) to form a film composed of the crosslinked layer-forming material on the resist pattern. Subsequently, the wafer was further baked at 110° C. for 90 seconds (mixing baking) to form a crosslinked layer at the interface between the first resist pattern and the film composed of the crosslinked layer-forming material, then developed with pure water for 60 seconds to remove the non-crosslinked layer, and again baked at 90° C. for 90 seconds (post-baking) to obtain a demagnified pattern where a crosslinked layer was formed on a resist pattern.
Evaluation of Demagnification Range of Pattern Dimension The trench dimension (width of the space) of the resist pattern before and after formation of the crosslinked layer was measured using a Critical Dimension scanning electron microscope (S9260, manufactured by Hitachi, Ltd.), and the difference between the measured value before formation of the crosslinked layer and the measured value after formation of the crosslinked layer was calculated to determine the demagnification range (nm) of the pattern dimension. As this value is larger, higher performance is indicated.
Evaluation of Exposure Latitude:

The wafer having formed thereon only the resist pattern before applying the crosslinked layer-forming material was observed using a Critical Dimension scanning electron microscope (S9260, manufactured by Hitachi, Ltd.), and assuming that the exposure dose for reproducing a mask pattern having a trench pattern with a space width of 100 nm and a line width of 300 nm is the optimal exposure dose, the value obtained by dividing the exposure dose range for repro- As apparent form Examples above, in the pattern forming method of the present invention, the exposure latitude of a resist pattern is enhanced to allow high-efficiency demagnification of the trench dimension of a trench pattern, and a high-precision fine pattern can be stably formed without generation of a scum.

INDUSTRIAL APPLICABILITY

According to the pattern forming method and the resist composition of the present invention, a pattern having an effectively micro-dimensioned trench or hole pattern can be obtained without generating a scum. In particular, a negative tone development technique with high practicality and a double development technique using the same are provided. Thanks to these techniques, finer patterning under the same light source as in conventional techniques becomes possible. The pattern forming method of the present invention is suitably used in the process of producing a semiconductor such as IC, in the production of a circuit board for liquid crystal, thermal head and the like, and in the lithography process of other photo-applications.

While the invention has been described in detail and with reference to specific embodiments thereof, it will be apparent to one skilled in the art that various changes and modifications can be made therein without departing from the spirit and scope thereof.

This application is based on Japanese Patent Application (Patent Application No. 2007-129521) filed on May 15, 2007 and U.S. application Ser. No. 12/600,038 filed in the United States on Nov. 13, 2009, the contents of which are incorporated herein by way of reference.

The invention claimed is:

1. A pattern forming method, comprising:
   forming a resist film by applying a resist composition containing (A) a resin capable of increasing a polarity of the resin (A) by an action of an acid, whose solubility in a positive tone developer which is an alkali developer increases and solubility in a negative tone developer containing an organic solvent decreases upon irradiation with an actinic ray or radiation, (B) a compound capable of generating an acid upon irradiation with an actinic ray or radiation and (C) a solvent, wherein solubility of the resist composition in the positive tone developer increases and solubility of the resist composition in the negative tone developer decreases upon irradiation with an actinic ray or radiation;
   exposing the resist film;
   forming a resist pattern by developing the resist film after the exposing by using the negative tone developer;
   causing a crosslinked layer-forming material that forms a crosslinked layer at an interface with the resist pattern in the presence of an acid to act on the resist pattern to crosslink the resin constituting the resist pattern and the crosslinked layer-forming material, thereby forming a crosslinked layer; and
   removing an unreacted crosslinked layer-forming material by using a removing solvent containing water or an organic solvent.

2. The pattern forming method according to claim 1, wherein the removing solvent is an aqueous alkali solution.

3. The pattern forming method according to claim 1, wherein the removing solvent is pure water.

4. The pattern forming method according to claim 1, wherein the removing solvent contains an organic solvent.

5. The pattern forming method according to claim 1, comprising:
   in the forming of the crosslinked layer, applying the crosslinked layer-forming material containing (a) a crosslinking agent and (b) a solvent on the resist pattern.

6. The pattern forming method according to claim 1, further comprising:
   in the forming of the crosslinked layer, heating the crosslinked layer.

7. The pattern forming method according to claim 1, further comprising:
   washing the resist pattern by using a rinsing solution containing an organic solvent after the developing by using the negative tone developer.

8. The pattern forming method according to claim 7, wherein the organic solvent contained in the rinsing solution contains an alcohol-based solvent.

9. The pattern forming method according to claim 1, wherein the exposing is performed using light at a wavelength of 193 nm.

10. The pattern forming method according to claim 1, wherein the exposing is immersion exposure using light at a wavelength of 193 nm.

11. The pattern forming method according to claim 1, wherein the component (A) of the resist composition is a resin having an alicyclic hydrocarbon structure.

12. The pattern forming method according to claim 1, wherein the resist composition further contains (D) a resin having at least either one of a fluorine atom and a silicon atom.

13. The pattern forming method according to claim 1, wherein the organic solvent contained in the negative tone developer is at least one solvent selected from the group consisting of ketone-based solvent, ester-based solvent, alcohol-based solvent, amide-based solvent, ether-based solvent and hydrocarbon-based solvent.

14. The pattern forming method according to claim 1, wherein the crosslinked layer-foaming material contains (a) a crosslinking agent containing at least one member selected from the group consisting of an amino-based crosslinking agent, a vinyl ether-based crosslinking agent, an alcohol-based crosslinking agent and an epoxy-based crosslinking agent.

15. The pattern forming method according to claim 11, wherein the component (A) of the resist composition is the resin further having a lactone structure.

16. The pattern forming method according to claim 12, wherein an amount of the resin (D) added is from 8.1 to 10 mass % based on the entire solid content of the resist composition.

17. A method for manufacturing an electronic device comprising the pattern forming method of claim 1.

* * * * *